(12) United States Patent
Hatakeyama et al.

(10) Patent No.: US 8,105,760 B2
(45) Date of Patent: Jan. 31, 2012

(54) PATTERNING PROCESS AND PATTERN SURFACE COATING COMPOSITION

(75) Inventors: Jun Hatakeyama, Joetsu (JP); Takeru Watanabe, Joetsu (JP); Katsuhiro Kobayashi, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 694 days.

(21) Appl. No.: 12/195,787

(22) Filed: Aug. 21, 2008

(65) Prior Publication Data

US 2009/0053657 A1 Feb. 26, 2009

(30) Foreign Application Priority Data

Aug. 22, 2007 (JP) .................. 2007-215810

(51) Int. Cl.
G03F 7/26 (2006.01)
(52) U.S. Cl. .......... 430/315; 430/330; 430/394
(58) Field of Classification Search .......... 430/315, 430/324, 312, 394, 322, 330
See application file for complete search history.

(56) References Cited

U.S. PATENT DOCUMENTS

| | | |
|---|---|---|
| 6,448,420 B1 | 9/2002 | Kinsho et al. |
| 6,593,063 B1 | 7/2003 | Tanaka et al. |
| 6,727,035 B2 | 4/2004 | Yamamura et al. |
| 7,285,375 B2 | 10/2007 | Matsumura et al. |
| 2006/0246377 A1 | 11/2006 | Yamato et al. |
| 2007/0037896 A1 | 2/2007 | Ito et al. |

FOREIGN PATENT DOCUMENTS

| | | |
|---|---|---|
| EP | 1840149 A1 | 10/2007 |
| JP | 2-60941 A | 3/1990 |
| JP | 2-99537 A | 4/1990 |
| JP | 2-115238 A | 4/1990 |
| JP | 11-100378 A | 4/1999 |
| JP | 2000-327633 A | 11/2000 |
| JP | 2001-66782 A | 3/2001 |
| JP | 2001-310937 A | 11/2001 |
| JP | 2003-55362 A | 2/2003 |
| JP | 2003-231860 A | 8/2003 |

(Continued)

OTHER PUBLICATIONS

B. J. Lin "Micropatterning Division," Semiconductor Foundry, Lithography, and Partners; TSMC, Inc.

(Continued)

*Primary Examiner* — Kathleen Duda
*Assistant Examiner* — Caleen Sullivan
(74) *Attorney, Agent, or Firm* — Westerman, Hattori, Daniels & Adrian, LLP

(57) ABSTRACT

A pattern is formed by applying a first positive resist composition comprising a polymer comprising recurring units which become alkali soluble under the action of acid onto a substrate to form a first resist coating, heat treating, exposing, heat treating, developing to form a first resist pattern, applying a pattern surface coating composition comprising a hydroxyl-containing crosslinkable polymer onto the first resist pattern and crosslinking, thereby covering the first resist pattern with a crosslinked polymer film, applying a second positive resist composition thereon, heat treating, exposing, heat treating, and developing to form a second resist pattern.

7 Claims, 7 Drawing Sheets

FOREIGN PATENT DOCUMENTS

| | | | |
|---|---|---|---|
| JP | 2004-352980 | A | 12/2004 |
| JP | 2005-8847 | A | 1/2005 |
| JP | 2005-18012 | A | 1/2005 |
| JP | 2005-146038 | A | 6/2005 |
| JP | 2006-199790 | A | 8/2006 |
| JP | 3824286 | B2 | 9/2006 |
| JP | 2006-273748 | A | 10/2006 |
| JP | 2006-290052 | A | 10/2006 |
| JP | 2006-348252 | A | 12/2006 |
| JP | 2008-24920 | A | 2/2008 |
| JP | 2008-083537 | * | 4/2008 |
| WO | 2004074242 | A2 | 9/2004 |
| WO | 2007148822 | A1 | 12/2007 |

OTHER PUBLICATIONS

Soichi Owa et al. "Immersion lithography; its potential performance and issues," Optical Microlithography XVI; 2003 SPIE; vol. 5040 (2003); p. 724.

Stephen Hsu et al. "Double Exposure Technique for 45nm node and Beyond," 25th Annual BACUS Symposium on Photomask Technology; Proc. of SPIE vol. 5992, 59921Q, (2005).

Masato Shibuya et al. "Performance of Resolution Enhancement Technique Using Both Multiple Exposure and Nonlinear Resist," Jpn. J. Appl. Phys; vol. 33 (1994); Part 1; No. 12B; Dec. 1994; pp. 6874-6877.

* cited by examiner

APPLY PHOTORESIST

EXPOSE AND DEVELOP PHOTORESIST

ETCH HARD MASK

APPLY, EXPOSE AND DEVELOP 2ND PHOTORESIST

ETCH PROCESSABLE SUBSTRATE

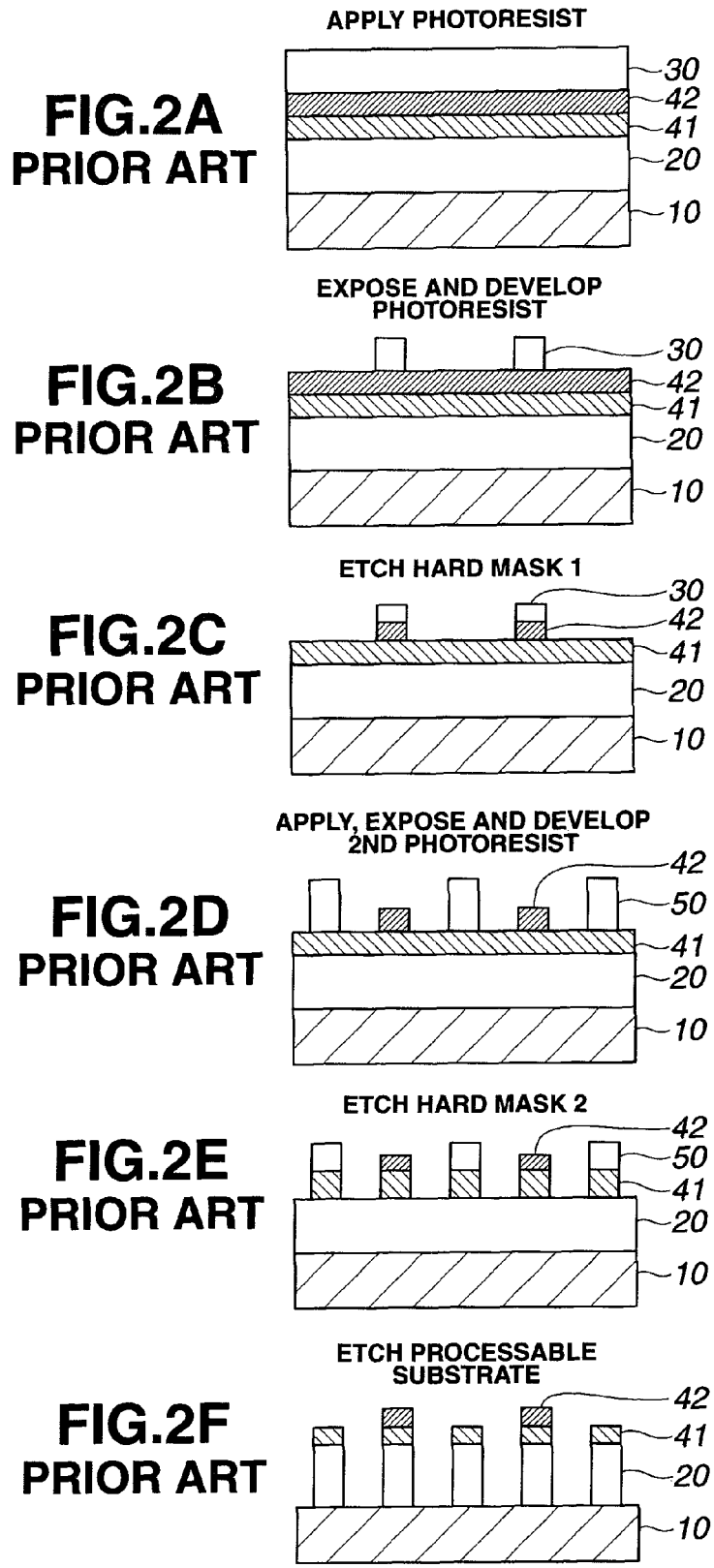

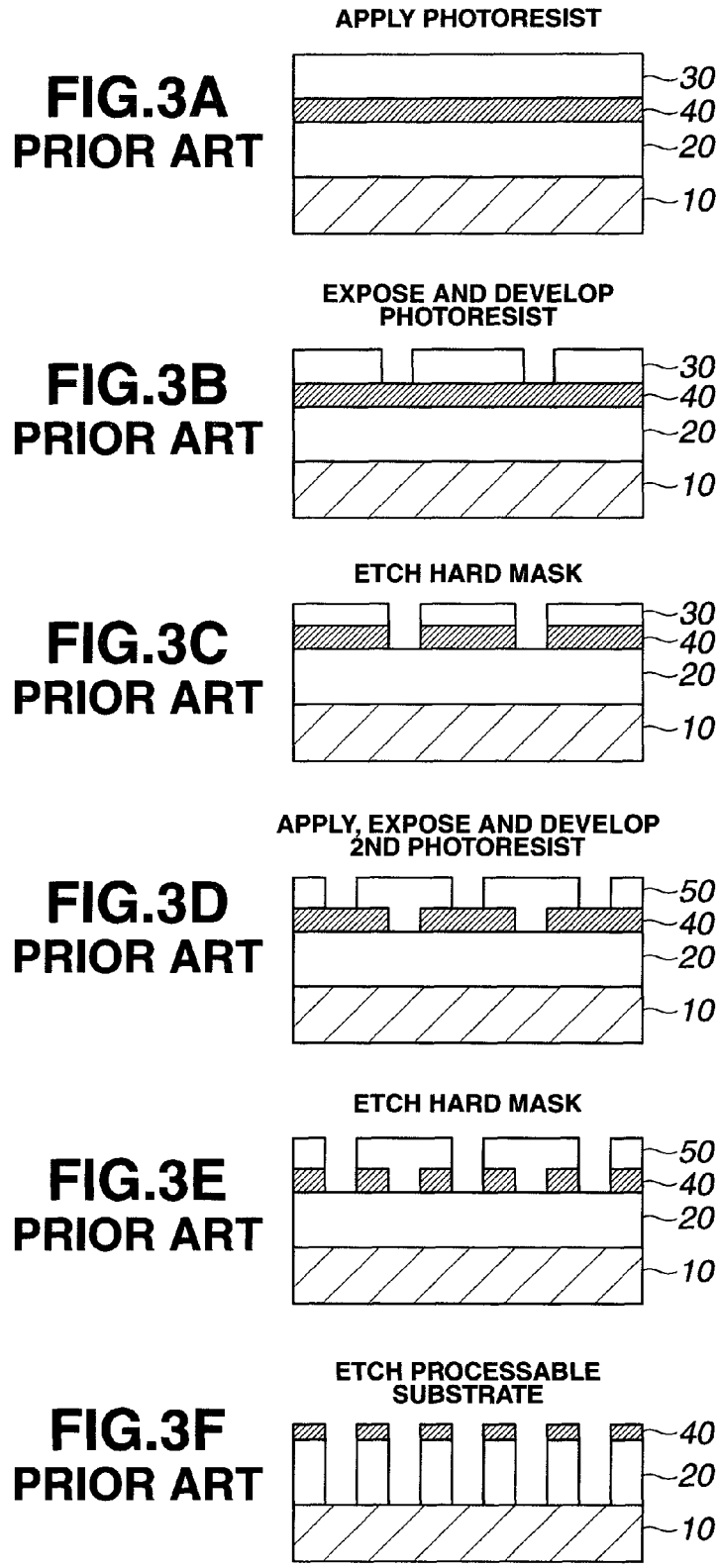

APPLY PHOTORESIST

EXPOSE AND DEVELOP PHOTORESIST

APPLY AND CROSSLINK PATTERN PROTECTIVE FILM

APPLY 2ND PHOTORESIST

EXPOSE AND DEVELOP 2ND PHOTORESIST

ETCH HARD MASK

ETCH PROCESSABLE SUBSTRATE

APPLY PHOTORESIST

EXPOSE AND DEVELOP PHOTORESIST

APPLY AND CROSSLINK PATTERN PROTECTIVE FILM

STRIP PATTERN PROTECTIVE FILM

APPLY 2ND PHOTORESIST

EXPOSE AND DEVELOP 2ND PHOTORESIST

ETCH HARD MASK

ETCH PROCESSABLE SUBSTRATE

FIRST PATTERN

SECOND PATTERN

FIRST PATTERN

SECOND PATTERN

PATTERNING PROCESS AND PATTERN SURFACE COATING COMPOSITION

CROSS-REFERENCE TO RELATED APPLICATION

This non-provisional application claims priority under 35 U.S.C. §119(a) on Patent Application No. 2007-215810 filed in Japan on Aug. 22, 2007, the entire contents of which are hereby incorporated by reference.

TECHNICAL FIELD

This invention relates to a double patterning process involving the steps of applying a photoresist coating and exposure and development to form a first positive resist pattern, applying a crosslinkable composition onto the pattern surface and converting to a film insoluble in resist solvent and developer, and applying another photoresist coating thereon and exposure and development to form a second positive resist pattern in spaces of the first resist pattern, and a pattern surface coating composition used in the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $\frac{1}{100}°$ C. while it was recognized that the impact of heat from the resist film upon light exposure drew little concern. There was a likelihood that micro-bubbles in water could be transferred to the pattern. The risk of bubble generation could be obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater is necessary, and a resist film and a protective film with a refractive index of 1.8 or greater are necessary as well. Among materials with a refractive index of 1.8 or greater, a high refractive index liquid is least available. Such a material has not been discovered because absorption and refractive index trade off. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern inbetween the first pattern. See Proc. SPIE, Vol. 5992, p 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. Since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to a reduced throughput.

Both the former and latter processes require two etchings for substrate processing, leaving the issues of a reduced throughput and deformation and misregistration of the pattern by two etchings.

To proceed with a single etching, one method is by using a negative resist material in a first exposure and a positive resist material in a second exposure. Another method is by using a positive resist material in a first exposure and a negative resist material in a higher alcohol of 3 or more carbon atoms, in which the positive resist material is not dissolvable, in a second exposure. In these methods using negative resist materials with low resolution, degradation of resolution occurs.

A method which does not involve post-exposure bake (PEB) and development between first and second exposures is the simplest method with high throughput. This method involves first exposure, replacement by a mask having a shifted pattern drawn, second exposure, PEB, development and dry etching. However, the optical energy of second exposure offsets the optical energy of first exposure so that the contrast becomes zero, leading to a failure of pattern formation. If an acid generator capable of two photon absorption or a contrast enhancement layer (CEL) is used to provide non-linear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994. In this regard, if the mask is replaced on every exposure, the throughput is substantially reduced. Then first exposure is performed on a certain number of wafers before second exposure is performed. Due to acid diffusion during the standing time between the first and second exposures, there can occur dimensional variations and configuration changes like T-top profile. For controlling the T-top occasion, it is effective to apply a resist protective film. The protective film used to this end must have a CEL function.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

One attempt for reducing the size of a hole pattern is a RELACS method of coating a film on the surface of resist pattern as developed, as is seen in JP-A 2001-66782. In the RELACS method, a water-soluble material is coated on the resist pattern as developed and bonded to the resist film by heat. The RELACS method, which intends to reduce the size of holes, when applied to lines, tends to increase the size of lines. For example, when a RELACS material is applied for the purpose of insolubilizing the first resist pattern, the size of a first line pattern is thickened. It is undesired for the double patterning that the size of a first pattern is different from the size of a second pattern, because a size difference arises in the pattern after etching. There is a need to have a pattern surface coating composition which gives rise to no size difference through insolubilizing process.

Recent studies have been made on the formation of a cured film by the ink jet printing technique. Many curable materials using cationic polymerization are proposed for use to this end. For instance, JP-A 11-100378, JP-A 2003-231860, JP-A 2005-146038, JP-A 2006-290052, JP-A 2006-199790, and JP-A 2006-273748 describe cyclic epoxy compounds; JP-A 2006-348252 describes a crosslinker having an oxirane ring attached to a ring; JP-A 2008-24920 describes an epoxy crosslinker based on a dendrimer or hyperbranched polymer; JP-A 2001-310937 describes a crosslinker having both hydroxy and oxetanyl groups; and JP 3824286 describes a crosslinker having both hydroxy and epoxy groups. In addition, JP-A 2003-55362, JP-A 2005-8847, and JP-A 2005-18012 disclose novel monomers having improved reactivity from which recurring units having oxirane are derived.

JP-A 2004-352980 describes the reactivity of oxirane ring and oxetane ring. It reports that, in an oxirane having the lowest activation energy for ring-opening reaction, one carbon atom in two carbon atoms forming the ring is substituted by at least one hydrogen atom and another carbon atom is substituted by two carbon atoms, the substituting carbon atoms forming a saturated bond or an unsaturated bond.

DISCLOSURE OF THE INVENTION

The invention is directed to a double patterning process involving the steps of applying a first positive resist composition and exposure and development to form a first positive resist pattern, covering the pattern surface with a protective film which is insoluble in solvent and developer, and applying another positive resist composition thereon and exposure and development to form a second positive pattern in spaces of the first resist pattern. There exists a demand to have a pattern surface coating composition which forms a protective film for preventing the first resist pattern from being dissolved in solvent and developer and hence, permits variations of the first pattern size to be minimized.

An object of the invention is to provide a patterning process which prevents a first positive resist pattern from being dissolved in solvent and developer and ensures effective double patterning, and a pattern surface coating composition for use in the practice of the process.

The above and other objects can be achieved by a pattern forming process as defined below.

In one aspect, the invention provides a process for forming a pattern, comprising the steps of applying a first positive resist composition comprising a polymer onto a substrate to form a first resist coating, the polymer comprising recurring units which become alkali soluble under the action of acid, heat treating the first resist coating, exposing to high-energy radiation, heat treating the exposed coating, developing the coating with an alkaline developer to form a first resist pattern; applying a pattern surface coating composition comprising a crosslinkable polymer onto the first resist pattern and covering the first resist pattern with a film of the crosslinked polymer; applying a second positive resist composition thereto to form a second resist coating, heat treating the second resist coating, exposing to high-energy radiation, heat treating the exposed coating, and developing the second coating with an alkaline developer to form a second resist pattern.

The steps of applying a pattern surface coating composition and covering the first resist pattern with a film of the crosslinked polymer include, in one embodiment, applying a pattern surface coating composition comprising a hydroxyl-containing crosslinkable polymer onto the first resist pattern and causing the hydroxyl-containing polymer to crosslink with the aid of acid and heat, thereby covering the first resist pattern with a film of the crosslinked polymer; and in another embodiment, applying a pattern surface coating composition comprising a hydroxyl-containing crosslinkable polymer onto the first resist pattern, causing the hydroxyl-containing polymer to crosslink with the aid of acid and heat, thereby covering the first resist pattern with a film of the crosslinked polymer, stripping off the superfluous coating composition with an alkaline developer.

In preferred embodiments, the first resist pattern includes spaces, the second resist pattern is formed in the spaces of the first resist pattern, whereby the pitch between the first and second patterns is reduced to one half; the second resist pattern crosses the first resist pattern; and the second resist pattern is formed in a space area where the first resist pattern is not formed and in a direction different from the first resist pattern.

In a preferred embodiment, the step of causing the hydroxyl-containing polymer to crosslink with the aid of acid and heat includes heating at 100 to 250° C. for crosslinking the hydroxyl-containing polymer to form a crosslinked polymer film for preventing the first resist pattern from being dissolved in solvent and alkaline developer.

In another aspect, the invention provides a pattern surface coating composition for use in the pattern forming process defined herein, comprising a hydroxyl-containing crosslinkable polymer having the general formula (1):

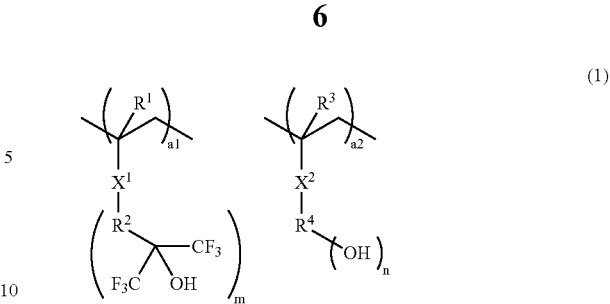

wherein $R^1$ and $R^3$ are each independently hydrogen, methyl or hydroxymethyl, $R^2$ is a single bond or a straight, branched or cyclic alkylene or alkylidyne group of 1 to 10 carbon atoms, $R^4$ is a (n+1)-valent straight, branched or cyclic aliphatic saturated hydrocarbon group of 1 to 12 carbon atoms, an aromatic hydrocarbon group of 6 to 12 carbon atoms, benzyl group or naphthalenemethyl group, which may have an ether bond, m is 1 or 2, n is an integer of 1 to 5, $X^1$ and $X^2$ are each independently —C(=O)—O—$R^5$—, —C(=O)—NH—$R^6$—, —C(=O)—N—$(R^6)_2$—, phenylene or naphthylene group, $R^5$ and $R^6$ each are a single bond, or a $C_1$-$C_6$ alkylene group or $C_6$-$C_{10}$ arylene group, which may have an ether or ester group, a1 and a2 are numbers in the range: $0 \leq a1 < 1.0$, $0 < a2 \leq 1.0$, $0 < a1+a2 \leq 1.0$. In this case, a1 and a2 are preferably $0 \leq a1 \leq 0.9$, $0.1 \leq a2 \leq 1.0$, $0.1 \leq a1+a2 \leq 1.0$, more preferably $0 \leq a1 \leq 0.8$, $0.2 \leq a2 \leq 1.0$, $0.2 \leq a1+a2 \leq 1.0$.

The invention also provides a pattern surface coating composition for use in the pattern forming process, comprising a hydroxyl-containing crosslinkable polymer having the general formula (1a):

$$ \text{(1a)} $$

wherein $R^1$ and $R^3$ are each independently hydrogen, methyl or hydroxymethyl, $R^2$ is a single bond or a straight, branched or cyclic alkylene or alkylidyne group of 1 to 10 carbon atoms, $R^4$ is a (n+1)-valent straight, branched or cyclic aliphatic saturated hydrocarbon group of 1 to 12 carbon atoms, an aromatic hydrocarbon group of 6 to 12 carbon atoms, benzyl group or naphthalenemethyl group which may have an ether bond, m is 1 or 2, n is an integer of 1 to 5, $X^1$ and $X^2$ are each independently —C(=O)—O—$R^5$—, —C(=O)—NH—$R^6$—, —C(=O)—N—$(R^6)_2$—, phenylene or naphthylene group, $R^5$ and $R^6$ each are a single bond, or a $C_1$-$C_6$ alkylene group or $C_6$-$C_{10}$ arylene group, which may have an ether or ester group; $R^8$ is hydrogen or methyl, $X^3$ is each independently —C(=O)—O—$R^{12}$—, phenylene or naphthylene group, $R^{12}$ is a single bond, or a $C_1$-$C_6$ alkylene group or $C_6$-$C_{10}$ arylene group, which may have an ether, ester, hydroxyl or carboxyl group, $R^9$ is a straight, branched or cyclic $C_1$-$C_{12}$ alkylene group, $R^{10}$ is hydrogen or a straight, branched or cyclic $C_1$-$C_6$ alkyl group, or may bond with $R^9$ to form a ring with the carbon atoms to which they are attached, $R^{11}$ is hydrogen or a straight, branched or cyclic $C_1$-$C_6$ alkyl group, p is 0 or 1; a1, a2 and b are numbers in the range: $0 \leq a1 < 1.0$, $0 < a2 < 1.0$, $0 < b < 1.0$, and $0 < a1+a2+b \leq 1.0$. In this case, preferably $0 \leq a1 \leq 0.9$, $0.1 \leq a2 \leq 1.0$, $0 \leq b \leq 0.9$, $0.1 \leq a1+a2+b \leq 1.0$, more preferably $0 \leq a1 \leq 0.8$, $0.2 \leq a2 \leq 1.0$, $0 \leq b \leq 0.8$, $0.3 \leq a1+a2+b \leq 1.0$.

In a preferred embodiment, the coating composition is obtained by mixing the hydroxyl-containing crosslinkable polymer of formula (1) or (1a) with an organic solvent comprising an alcohol of 3 to 8 carbon atoms, and more preferably by mixing the hydroxyl-containing crosslinkable polymer of formula (1) or (1a) with a thermal acid generator and an organic solvent comprising an alcohol of 3 to 8 carbon atoms. The thermal acid generator is typically an ammonium salt having the general formula (2):

(2)

wherein $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 20 carbon atoms, which may have an ether or ester group, an aryl group of 6 to 20 carbon atoms, or an aralkyl or aryloxoalkyl group of 7 to 12 carbon atoms, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is an alkylene group of 3 to 10 carbon atoms or a group forming a hetero-aromatic ring having the nitrogen atom therein when they form a ring, and $K^-$ is a non-nucleophilic counter ion. The coating composition may further comprise a crosslinker which assists the polymer in crosslinking under the action of acid.

BENEFITS OF THE INVENTION

The double patterning process of the invention involves the steps of forming a first positive resist pattern through exposure and development, covering the surface of the first resist pattern with a crosslinked film of a pattern surface coating composition which is insoluble in solvents and developers, and coating a second positive resist composition thereon to form a pattern in spaces of the first positive resist pattern. The pattern surface coating composition comprising a hydroxyl-containing crosslinkable polymer in a solution containing at least 10 wt % of an alcohol of 3 to 8 carbon atoms which does not dissolve the positive resist pattern is applied and heated for crosslinking, so that the crosslinked film prevents the first resist pattern from being dissolved in resist solvent and developer. A second positive resist composition is applied thereon to form a second resist pattern in spaces of the first resist pattern. The crosslinked film of the pattern surface coating composition having an extremely thin gage is effective for preventing the first resist pattern from dissolution, providing the advantage of minimized variation of first pattern size.

BRIEF DESCRIPTION OF THE DRAWINGS

FIG. 1-A shows a laminate of substrate, processable substrate, hard mask and resist film, FIG. 1-B shows the resist film being exposed and developed, FIG. 1-C shows the hard mask being etched, FIG. 1-D shows a second resist film being formed, exposed and developed, and FIG. 1-E shows the processable substrate being etched.

FIG. 2 is a cross-sectional view of another exemplary prior art double patterning process. FIG. 2-A shows a laminate of substrate, processable substrate, 1st and 2nd hard masks and resist film, FIG. 2-B shows the resist film being exposed and developed, FIG. 2-C shows the 2nd hard mask being etched, FIG. 2-D shows, after removal of the first resist film, a second resist film being formed, exposed and developed, FIG. 2-E shows the 1st hard mask being etched, and FIG. 2-F shows the processable substrate being etched.

FIG. 3 is a cross-sectional view of a further exemplary prior art double patterning process. FIG. 3-A shows a laminate of substrate, processable substrate, hard mask and resist film, FIG. 3-B shows the resist film being exposed and developed, FIG. 3-C shows the hard mask being etched, FIG. 3-D shows, after removal of the first resist film, a second resist film being formed, exposed and developed, FIG. 3-E shows the hard mask being etched, and FIG. 3-F shows the processable substrate being etched.

FIG. 4-A shows a laminate of substrate, processable substrate, hard mask, and first resist film, FIG. 4-B shows the first resist film being exposed and developed, FIG. 4-C shows a pattern surface coating composition being coated on the first resist pattern and crosslinked, FIG. 4-D shows a second resist composition being coated, FIG. 4-E shows a second resist pattern being formed, FIG. 4-F shows the hard mask being etched, and FIG. 4-G shows the processable substrate being etched.

FIG. 5-A shows a laminate of substrate, processable substrate, hard mask, and first resist film, FIG. 5-B shows the first resist film being exposed and developed, FIG. 5-C shows a pattern surface coating composition being coated on the first resist pattern and crosslinked, FIG. 5-D shows the coating composition being stripped, FIG. 5-E shows a second resist composition being coated, FIG. 5-F shows a second resist pattern being formed, FIG. 5-G shows the hard mask being etched, and FIG. 5-H shows the processable substrate being etched.

DESCRIPTION OF THE PREFERRED EMBODIMENT

Figure 1A:
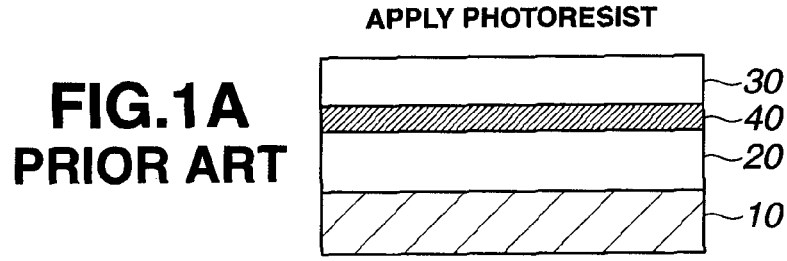
FIG. 1 is a cross-sectional view of an exemplary prior art double patterning process.
Figure 1B:
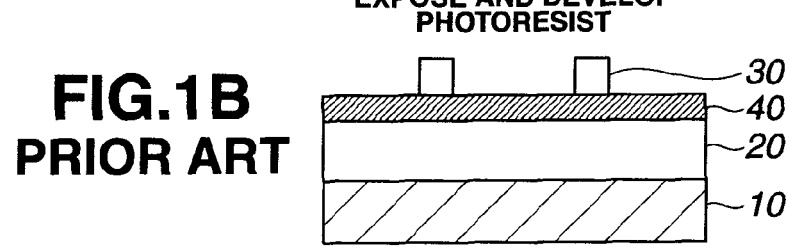
Figure 1C:
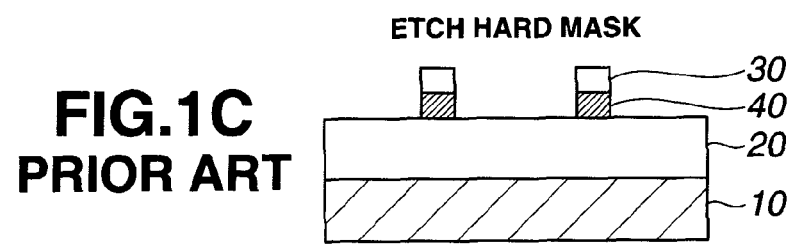
Figure 1D:
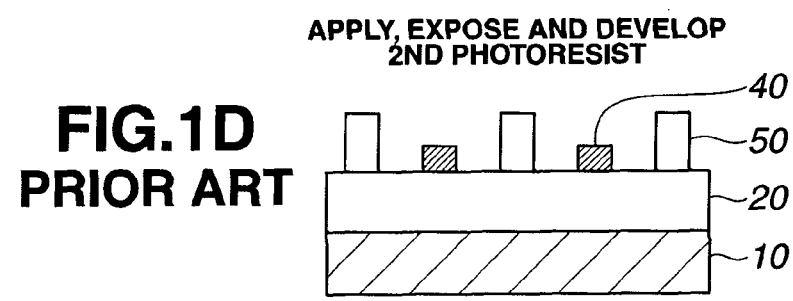
Figure 1E:
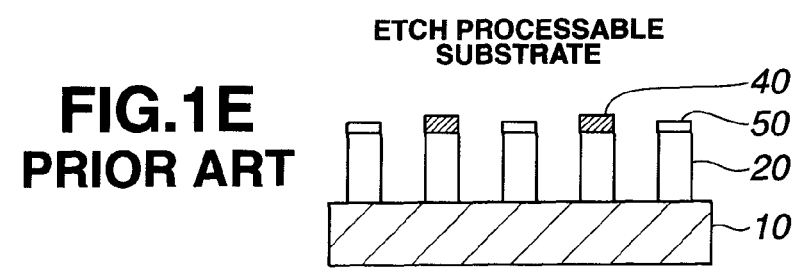
Figure 4A:
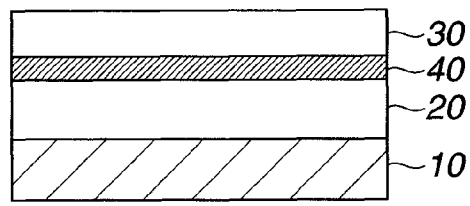
FIG. 4 is a cross-sectional view of a double patterning process according one embodiment of the invention.
Figure 4B:
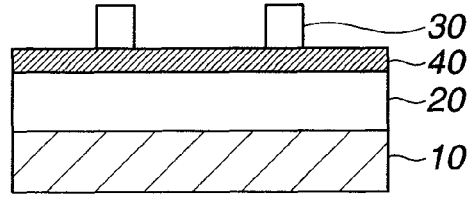
Figure 4C:
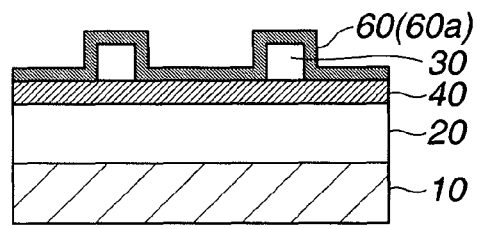
Figure 4D:
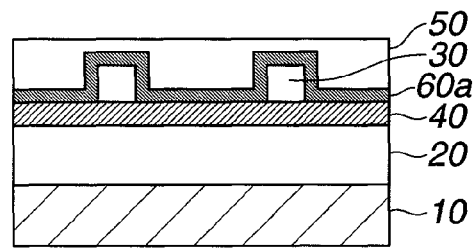
Figure 4E:
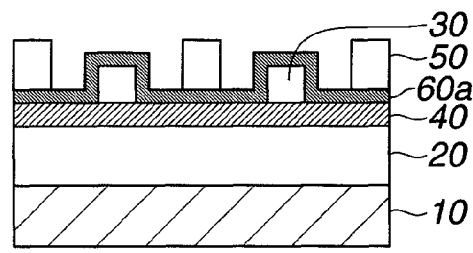
Figure 4F:
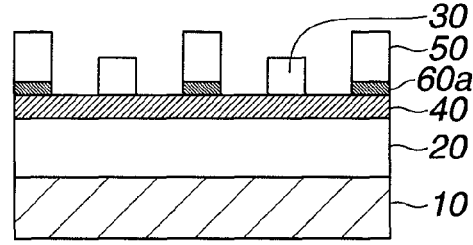
Figure 4G:
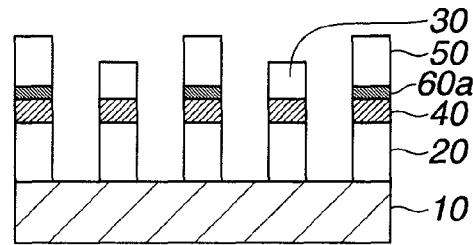
Figure 5A:
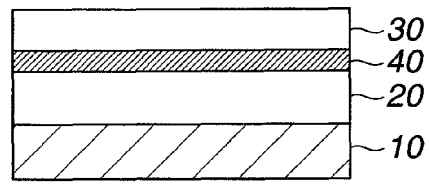
FIG. 5 is a cross-sectional view of a double patterning process according another embodiment of the invention.
Figure 5B:
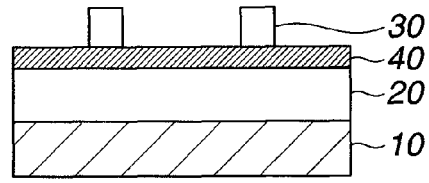
Figure 5C:
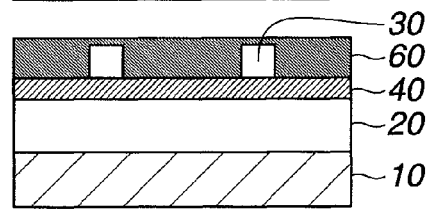
Figure 5D:
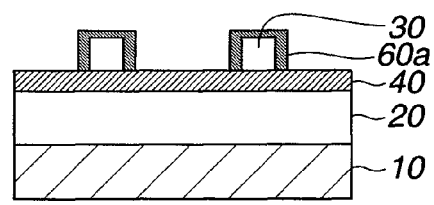
Figure 5E:
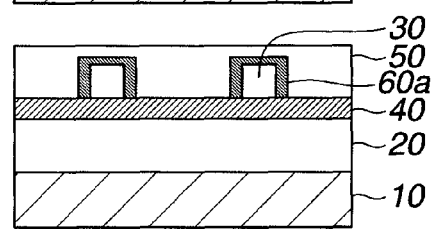
Figure 5F:
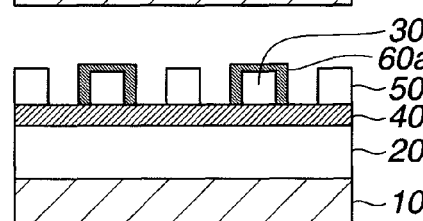
Figure 5G:
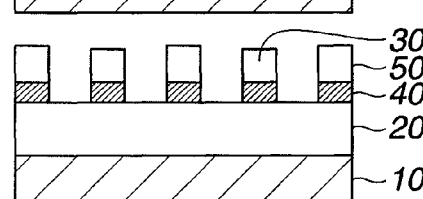
Figure 5H:
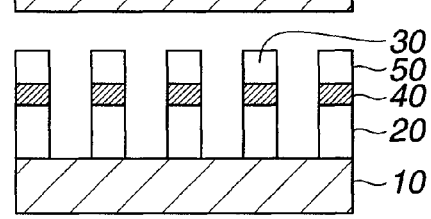

The singular forms "a," "an" and "the" include plural references unless the context clearly dictates otherwise.

As used herein, the terminology "$(C_x\text{-}C_y)$", as applied to a particular unit, such as, for example, a chemical compound or a chemical substituent group, means having a carbon atom content of from "x" carbon atoms to "y" carbon atoms per such unit.

In connection with the double patterning lithography involving double exposures and developments to form a half-pitch pattern, the inventors made efforts to develop a positive resist material which enables to process a substrate by a single dry etching.

The inventors have completed a double patterning process comprising the steps of applying a first positive resist composition comprising a polymer onto a substrate to form a first resist coating, the polymer comprising recurring units which become alkali soluble under the action of acid, specifically recurring units of alicyclic structure, heat treating the first resist coating, exposing to high-energy radiation, heat treating the exposed coating, developing the coating with an alkaline developer to form a first resist pattern, applying a pattern surface coating composition comprising a hydroxyl-containing crosslinkable polymer onto the first resist pattern and causing the hydroxyl-containing polymer to crosslink with the aid of acid and heat, thereby covering the first resist pattern with a film of the crosslinked polymer, applying a second positive resist composition thereto to form a second resist coating, heat treating the second resist coating, exposing to high-energy radiation, heat treating the exposed coating, and developing the second coating with an alkaline developer to form a second resist pattern.

Pattern Surface Coating Composition

The pattern surface coating composition used in the pattern forming process of the invention is a solution comprising a hydroxyl-containing crosslinkable polymer and specifically a solution of a hydroxyl-containing crosslinkable polymer in an organic solvent containing an alcohol of 3 to 8 carbon atoms, preferably in a proportion of at least 10% by weight of the solution. Typically the polymer used herein has the general formula (1).

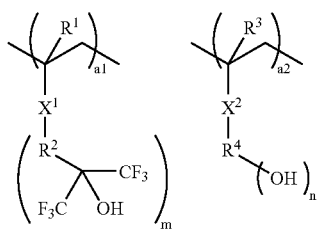

(1)

Herein $R^1$ and $R^3$ are each independently hydrogen, methyl or hydroxymethyl. $R^2$ is a single bond or a straight, branched or cyclic alkylene group of 1 to 10 carbon atoms or alkylidyne group (corresponding to the alkylene group with one hydrogen atom eliminated). $R^4$ is a (n+1)-valent straight, branched or cyclic aliphatic saturated hydrocarbon group of 1 to 12 carbon atoms and aromatic hydrocarbon group of 6 to 12 carbon atoms (including straight, branched or cyclic $C_1$-$C_{12}$ alkylene groups and $C_6$-$C_{12}$ arylene groups from which one to four hydrogen atoms, and preferably one to three hydrogen atoms may be eliminated), benzyl group or naphthalenemethyl group, which may have an ether bond. The subscript m is 1 or 2, n is an integer of 1 to 5, preferably 1 to 3. $X^1$ and $X^2$ are each independently —C(=O)—O—$R^5$—, —C(=O)—NH—$R^6$—, —C(=O)—N—$(R^6)_2$—, phenylene or naphthylene group, wherein $R^5$ and $R^6$ each are a single bond, or a $C_1$-$C_6$ alkylene group or $C_6$-$C_{10}$ arylene group, which may have an ether or ester group. The subscripts a1 and a2 are numbers in the range: $0 \leq a1 < 1.0$, $0 < a2 \leq 1.0$, $0 < a1+a2 \leq 1.0$.

Monomers from which recurring units of formula (1) are derived include those having the following general formulae Ma1 and Ma2 wherein $R^1$ to $R^4$, $X^1$, $X^2$, m and n are as defined above. Polymers obtained through polymerization of hydroxyl-containing monomers Ma1 and Ma2 are soluble in $C_3$-$C_8$ alcohols, and can form robust films through crosslinking of their hydroxyl moiety.

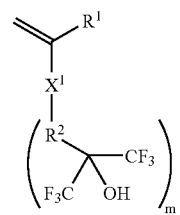

Ma1

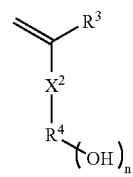

Ma2

Illustrative non-limiting examples of monomers Ma1 are given below.

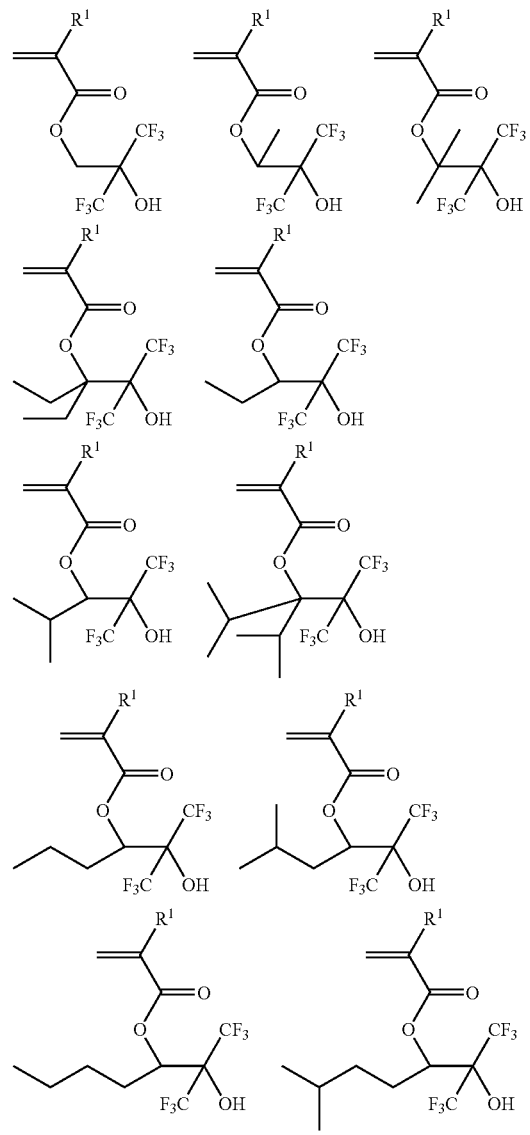

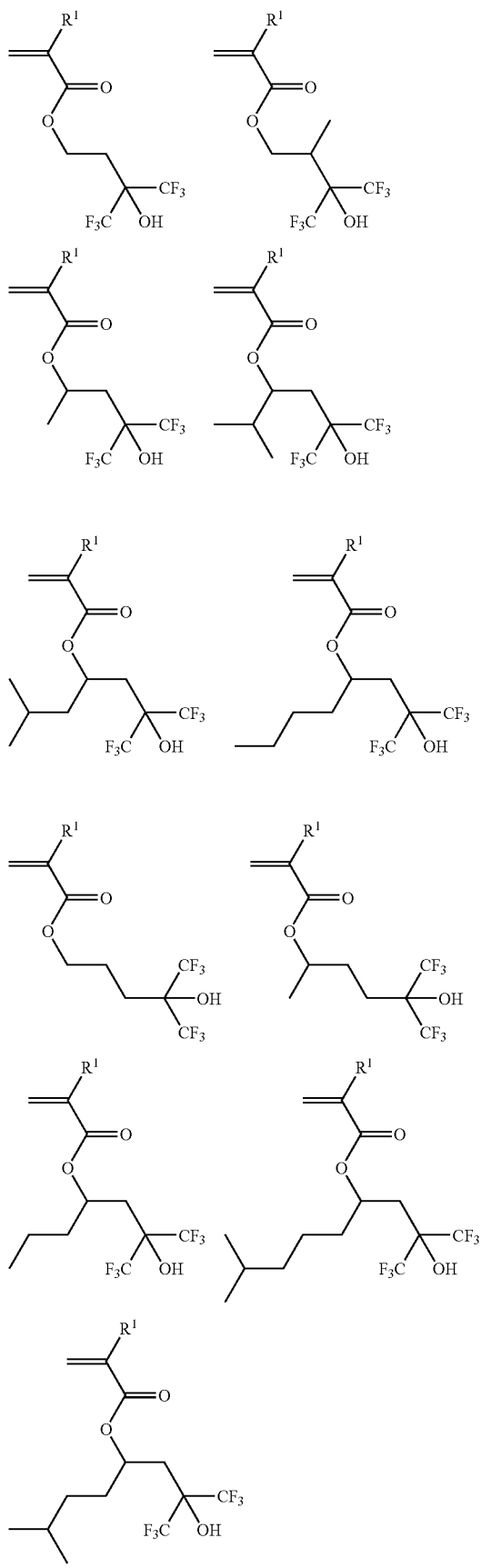
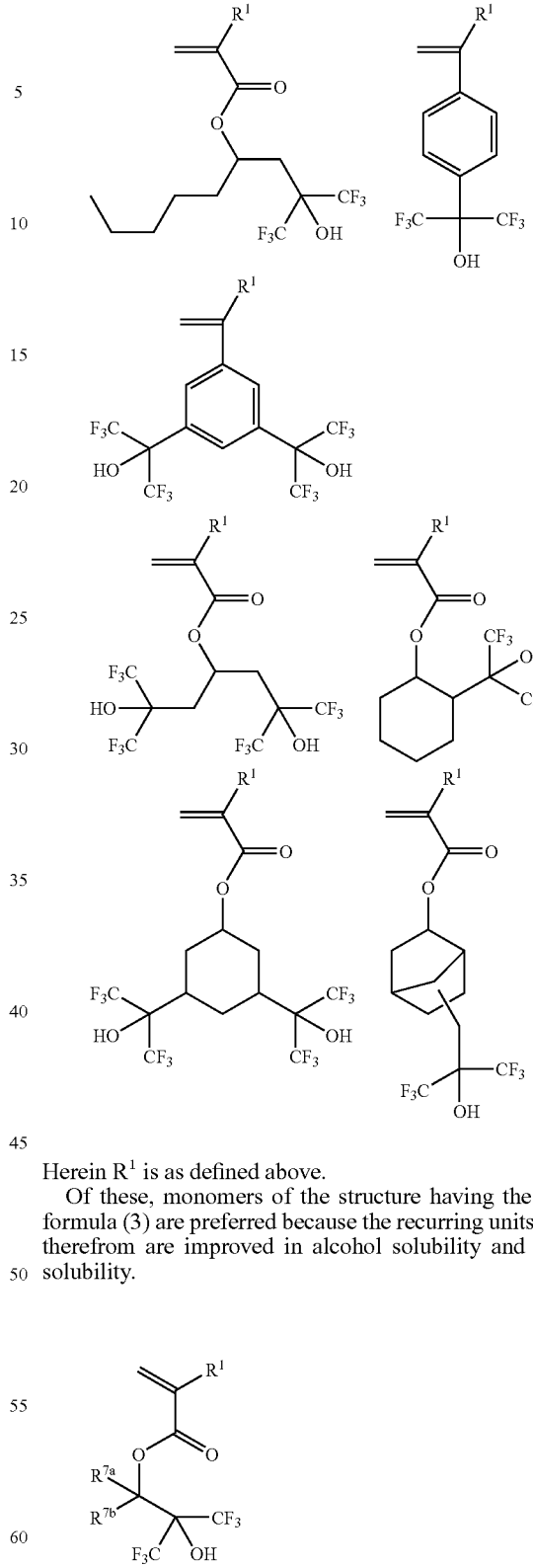

Herein R¹ is as defined above.

Of these, monomers of the structure having the general formula (3) are preferred because the recurring units derived therefrom are improved in alcohol solubility and alkaline solubility.

$$\text{(3)}$$

Herein $R^1$ is as defined above, $R^{7a}$ and $R^{7b}$ are each independently hydrogen or a straight, branched or cyclic $C_1$-$C_6$ alkyl group, or $R^{7a}$ and $R^{7b}$ may bond together to form a ring, preferably a $C_3$-$C_6$ aliphatic ring, with the carbon atom to which they are attached.

Units derived from monomers Ma2 are effective for promoting crosslinking in addition to providing alcohol solubility. Monomer Ma2, when combined with monomer Ma1, can improve alcohol solubility and cure by way of crosslinking.
Illustrative non-limiting examples of monomers Ma2 are given below.
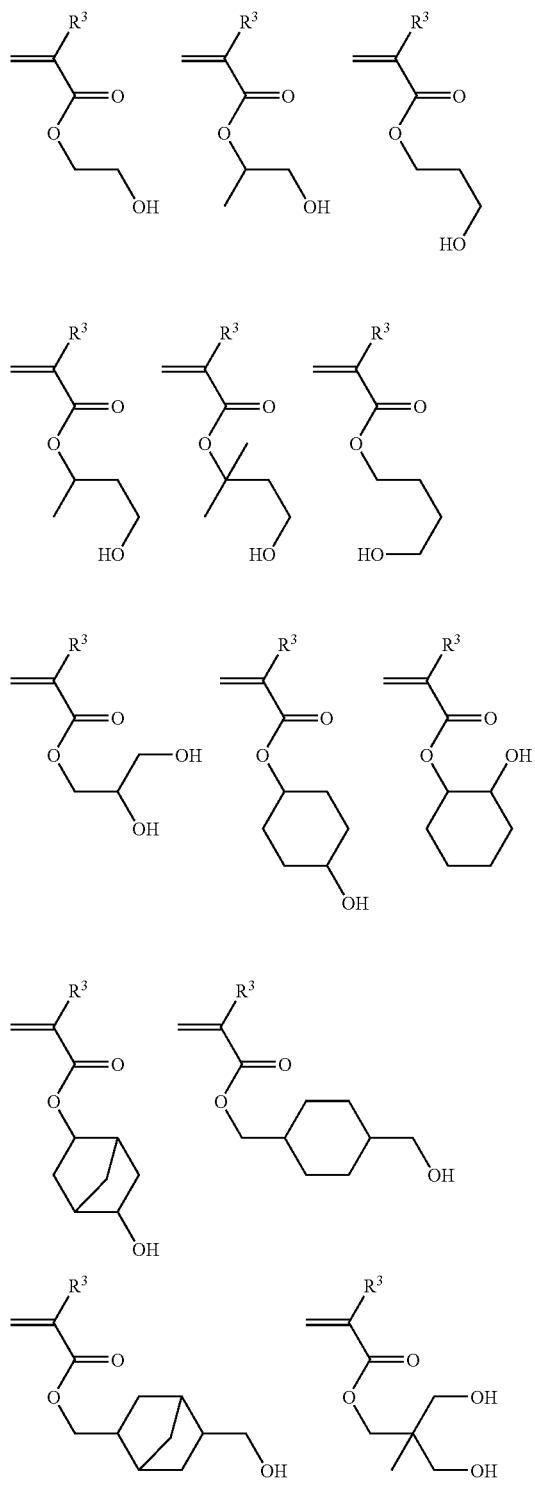
-continued
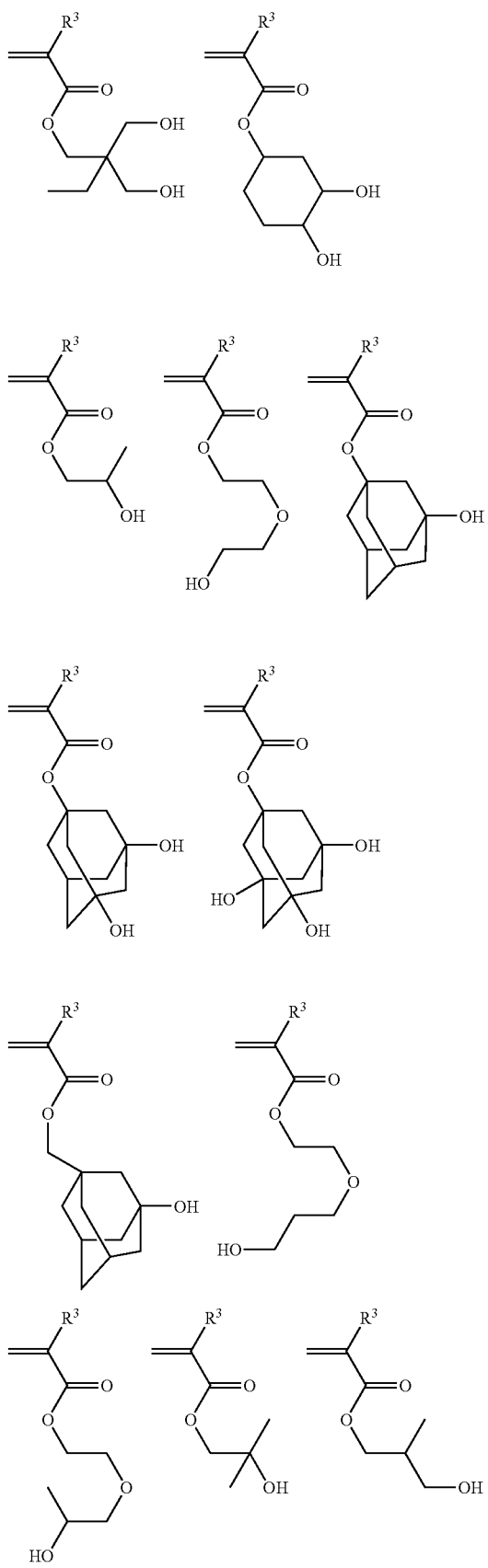

-continued
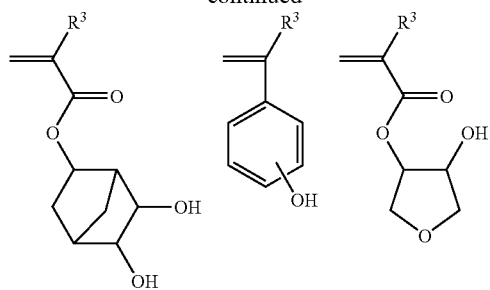
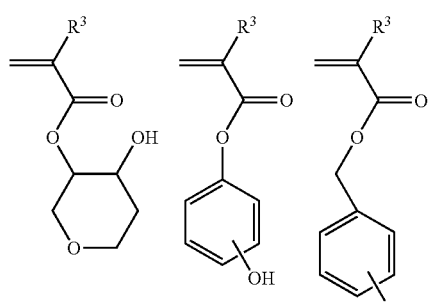
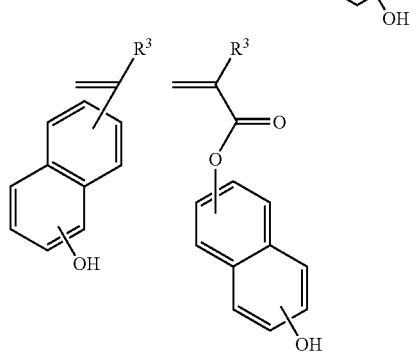
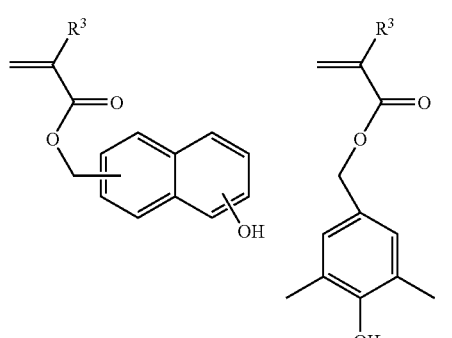
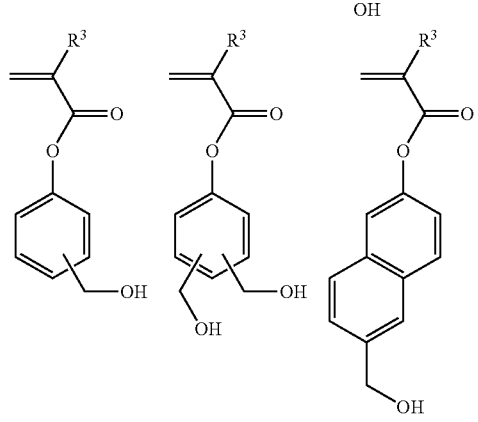
-continued
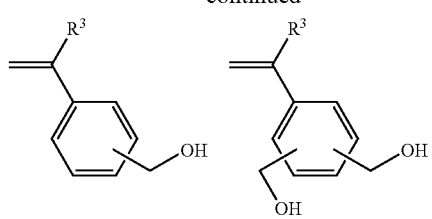
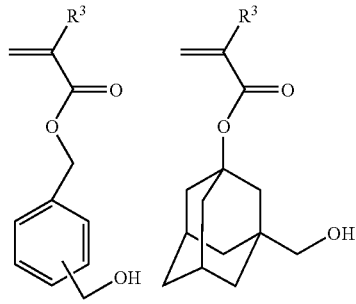
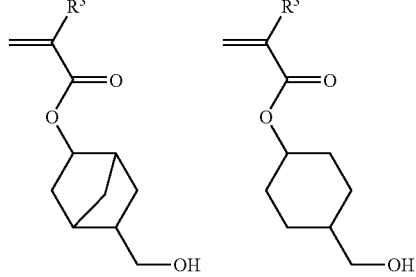
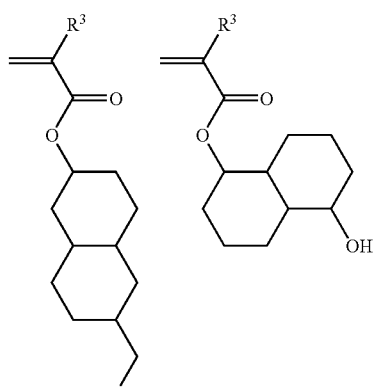
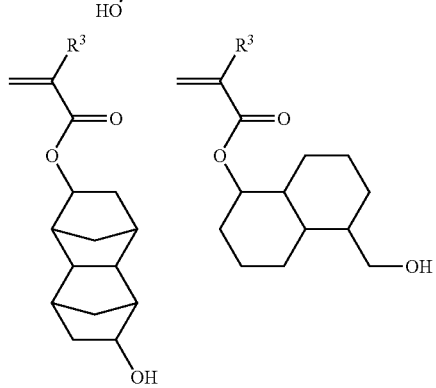

-continued
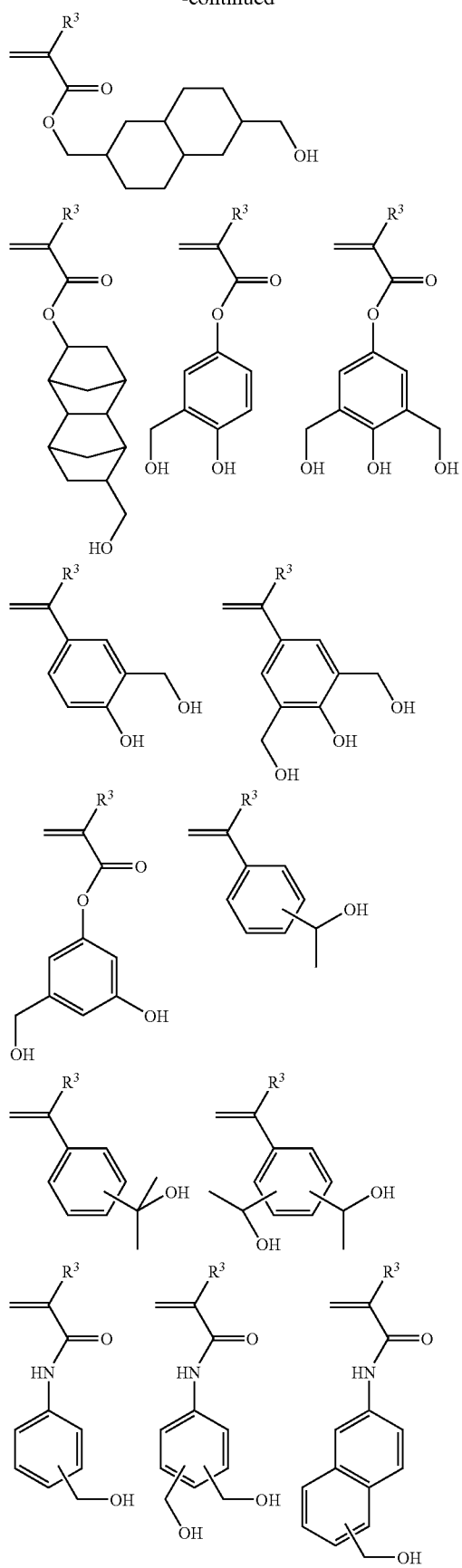
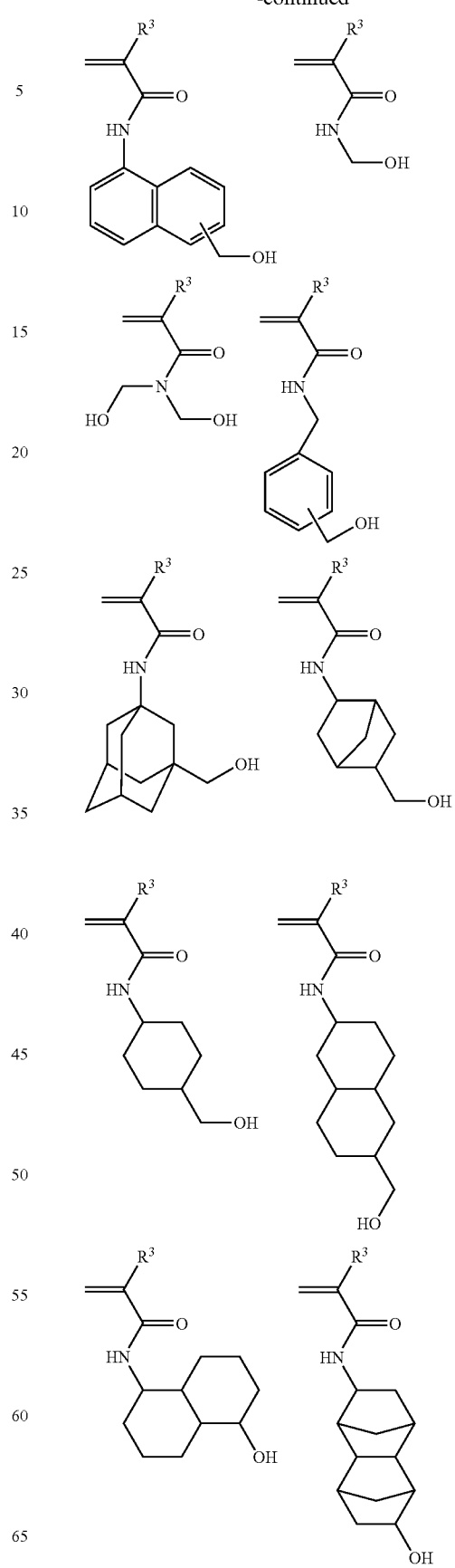

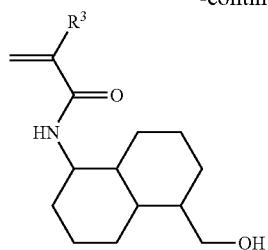

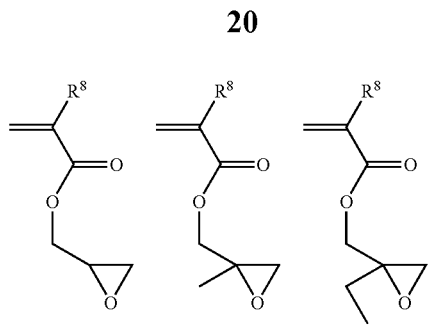

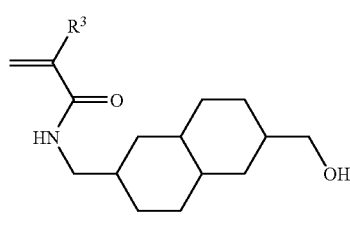 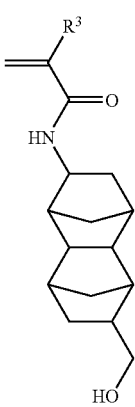

Herein R³ is as defined above.

While the coating composition of the invention is based on a polymer comprising alcohol-containing recurring units derived from monomers Ma1 and Ma2, another monomer (b) having an epoxy or oxetanyl group represented by the general formula (4) may be copolymerized in the polymer in order to improve its crosslinked density.

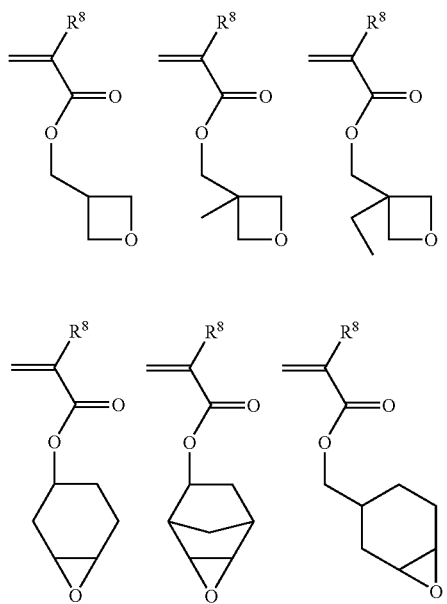

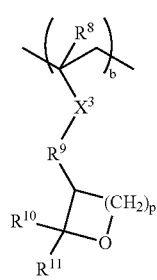 (4)

Herein $R^8$ is hydrogen or methyl. $X^3$ is each independently —C(=O)—O—$R^{12}$—, phenylene or naphthylene group, wherein $R^{12}$ is a single bond, or a $C_1$-$C_6$ alkylene group or $C_6$-$C_{10}$ arylene group, which may have an ether, ester, hydroxyl or carboxyl group. $R^9$ is a straight, branched or cyclic $C_1$-$C_{12}$ alkylene group. $R^{10}$ is hydrogen or a straight, branched or cyclic $C_1$-$C_6$ alkyl group, or may bond with $R^9$ to form a ring with the carbon atoms to which they are attached. $R^{11}$ is hydrogen or a straight, branched or cyclic $C_1$-$C_6$ alkyl group, and p is 0 or 1.

Illustrative non-limiting examples of monomers corresponding to formula (4) are given below.

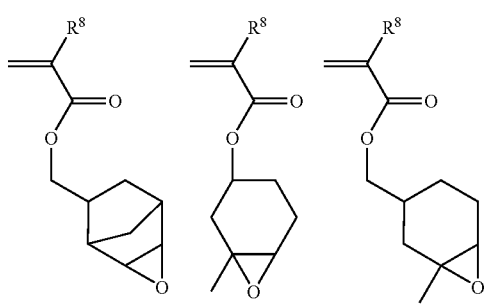

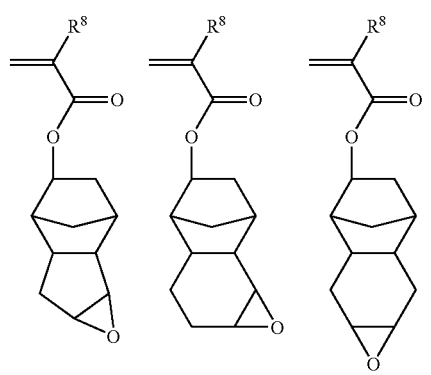

-continued
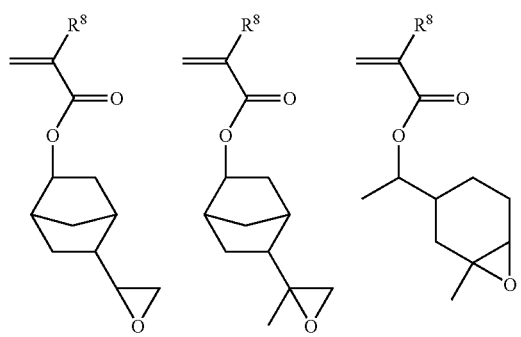
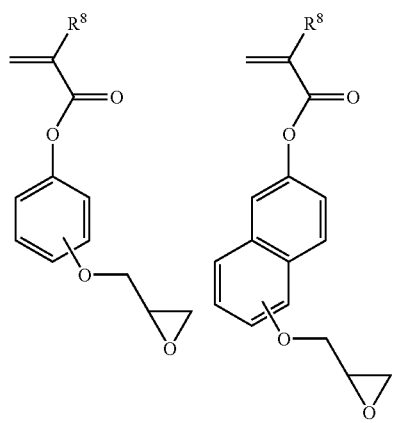
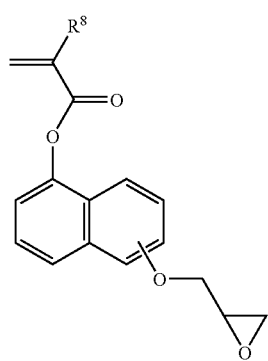
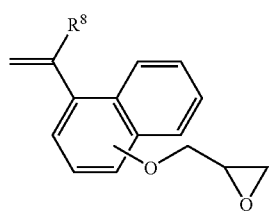
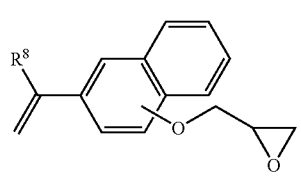
-continued
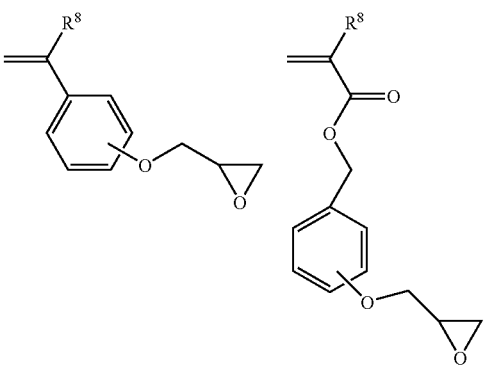
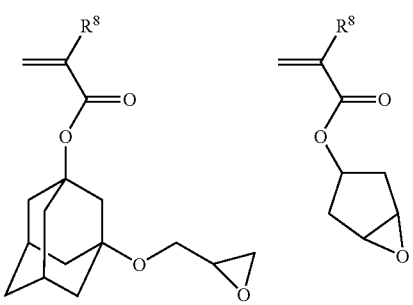
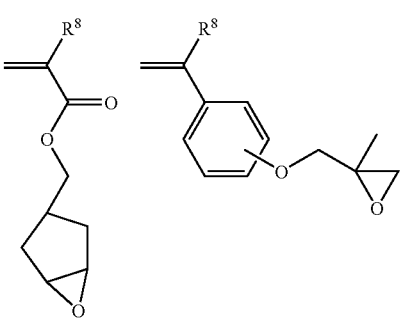
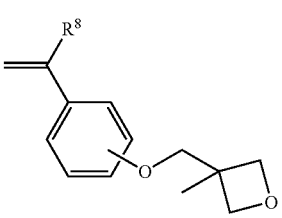
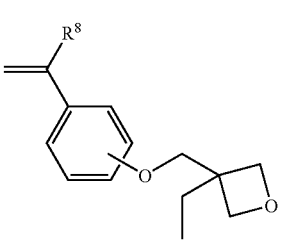

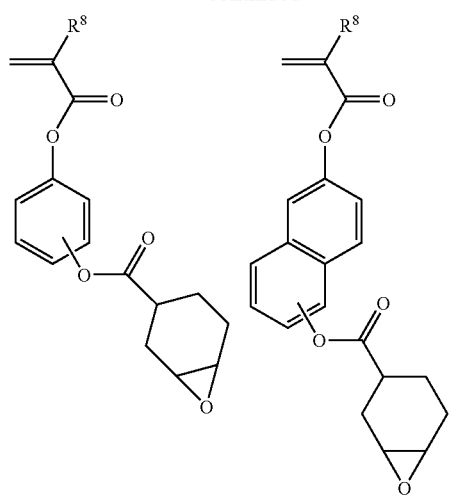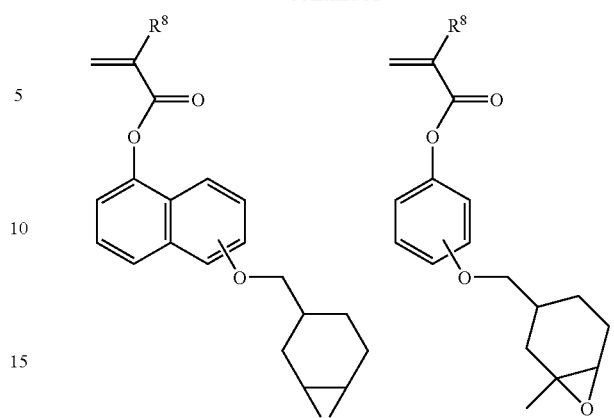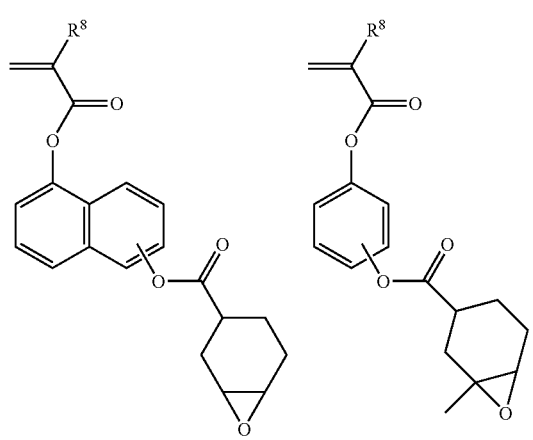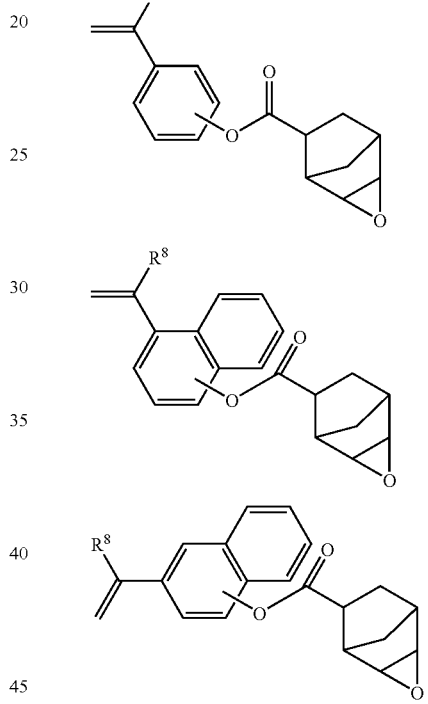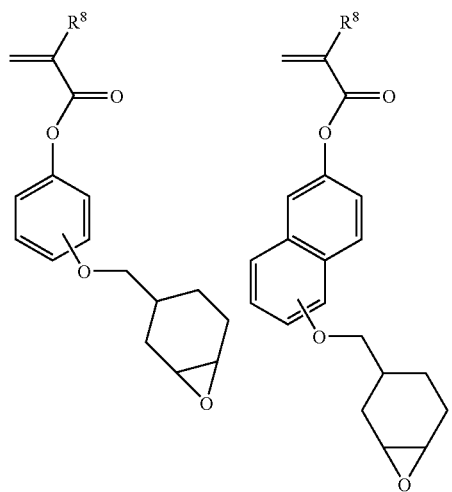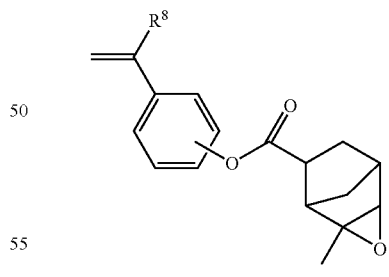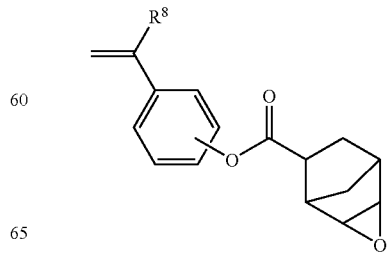

25
-continued
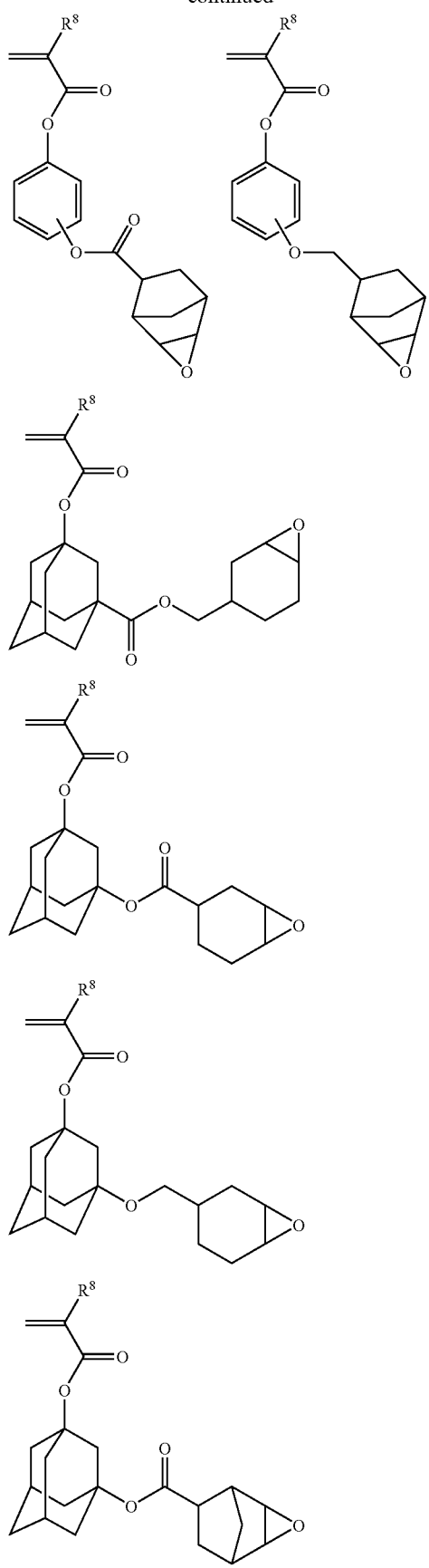
26
-continued
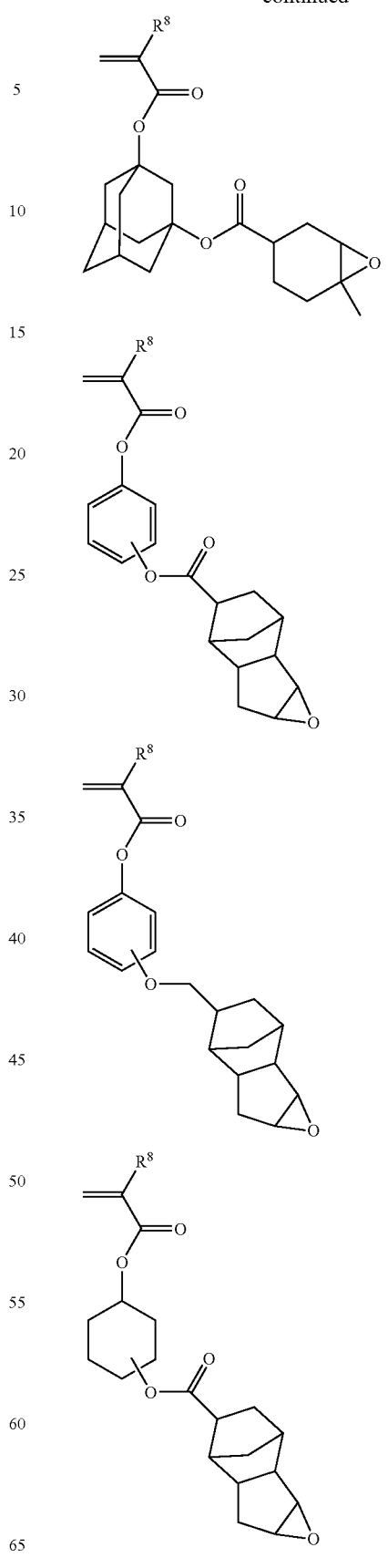

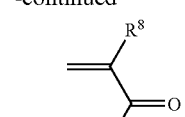
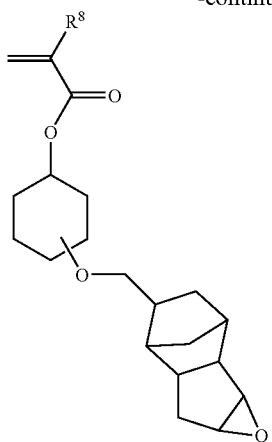
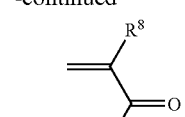
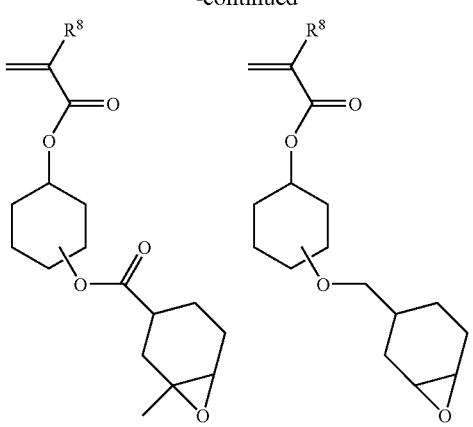
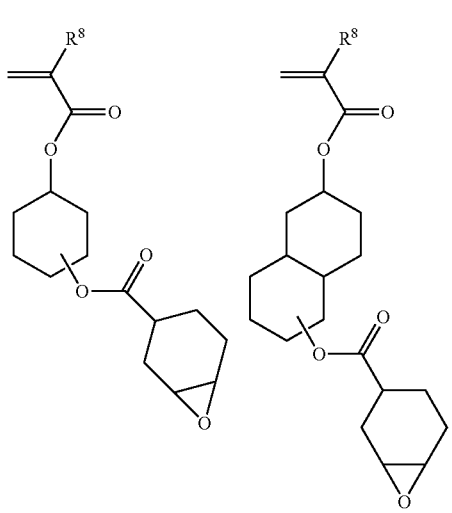
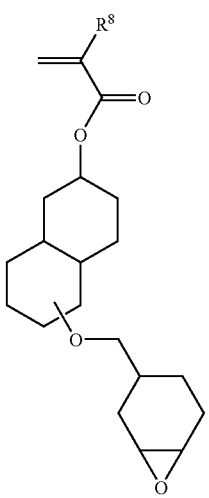
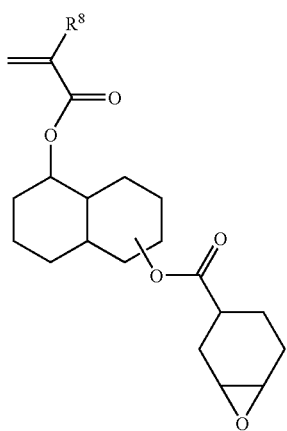
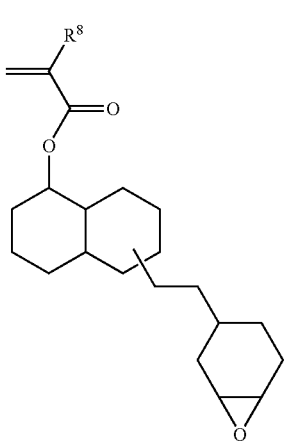

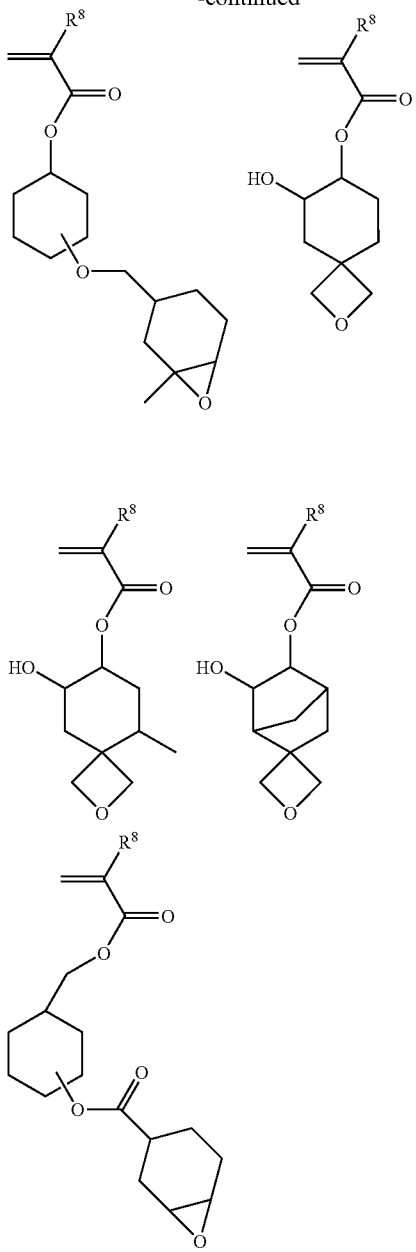

Herein R⁸ is as defined above.

It is noted that some monomers from which recurring units having an epoxy or oxetanyl group are derived are disclosed in JP-A 2003-55362, JP-A 2005-8847, and JP-A 2005-18012.

Fluoroalcohol-containing recurring units derived from monomers Ma1 are improved in alcohol and alkaline solubility, but lack crosslinkability. Thus monomers Ma2 or monomers having an epoxy or oxetanyl group must be copolymerized therewith. Inversely, polymers consisting of recurring units having an epoxy or oxetanyl group are improved in crosslinking, but lack solubility in alcohol solvents. Thus monomers Ma1 or Ma2 must be copolymerized therewith.

When recurring units (b) are copolymerized, the resulting polymer typically comprises recurring units as represented by the formula (1a).

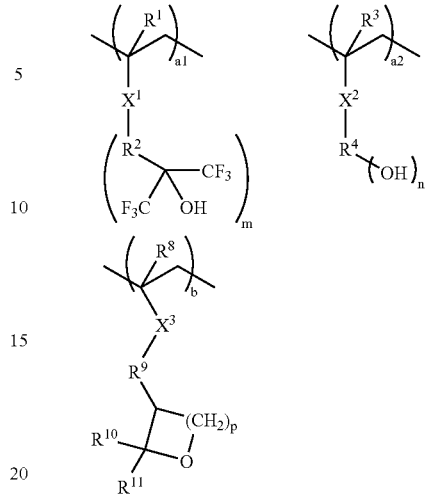

(1a)

Herein $R^1$ and $R^3$ are each independently hydrogen, methyl or hydroxymethyl. $R^2$ is a single bond or a straight, branched or cyclic alkylene or alkylidyne group of 1 to 10 carbon atoms. $R^4$ is a (n+1)-valent straight, branched or cyclic aliphatic saturated hydrocarbon group of 1 to 12 carbon atoms, an aromatic hydrocarbon group of 6 to 12 carbon atoms, benzyl group or naphthalenemethyl group, which may have an ether bond, m is 1 or 2, and n is an integer of 1 to 5. $X^1$ and $X^2$ are each independently —C(=O)—O—$R^5$—, —C(=O)—NH—$R^6$—, —C(=O)—N—$(R^6)_2$—, phenylene or naphthylene group, wherein $R^5$ and $R^6$ each are a single bond, or a $C_1$-$C_6$ alkylene group or $C_6$-$C_{10}$ arylene group, which may have an ether or ester group. $R^8$ is hydrogen or methyl. $X^3$ is each independently —C(=O)—O—$R^{12}$—, phenylene or naphthylene group, wherein $R^{12}$ is a single bond, or a $C_1$-$C_6$ alkylene group or $C_6$-$C_{10}$ arylene group, which may have an ether, ester, hydroxyl or carboxyl group. $R^9$ is a straight, branched or cyclic $C_1$-$C_{12}$ alkylene group. $R^{10}$ is hydrogen or a straight, branched or cyclic $C_1$-$C_6$ alkyl group, or may bond with $R^9$ to form a ring with the carbon atoms to which they are attached. $R^{11}$ is hydrogen or a straight, branched or cyclic $C_1$-$C_6$ alkyl group, p is 0 or 1. The subscripts a1, a2 and b are numbers in the range: $0 \leq a1 < 1.0$, $0 < a2 < 1.0$, $0 < b < 1.0$, and $0 < a1+a2+b \leq 1.0$.

While the coating composition is based on a polymer comprising alcohol-containing recurring units derived from monomers Ma1 and Ma2, the polymer may be further copolymerized with recurring units (c) derived from an α-hydroxymethyl acrylate or a lactone-containing monomer as listed below, in order to improve its adhesion to the resist film.

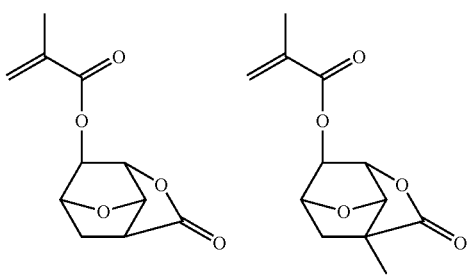

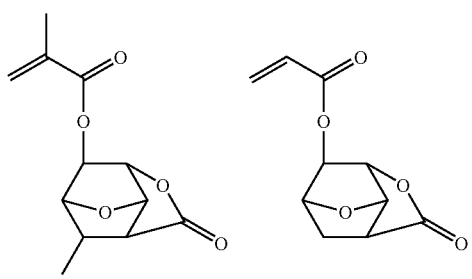
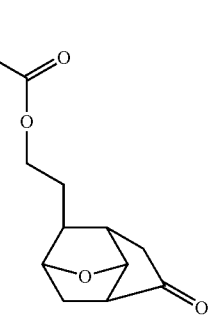
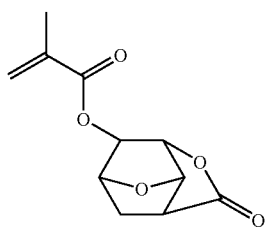
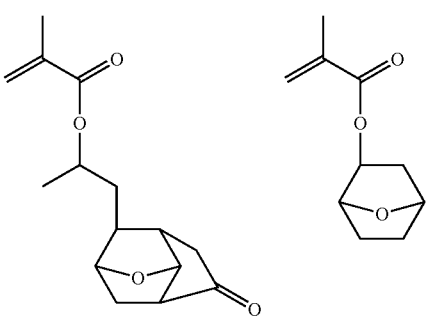
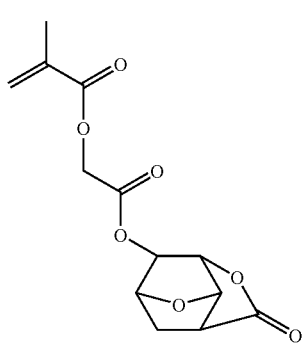
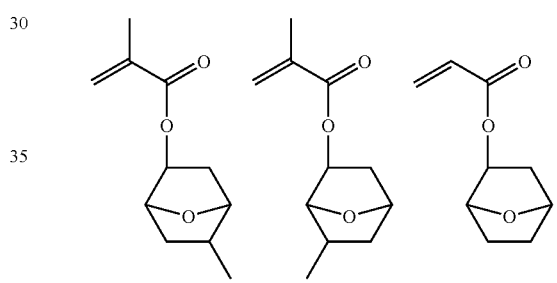
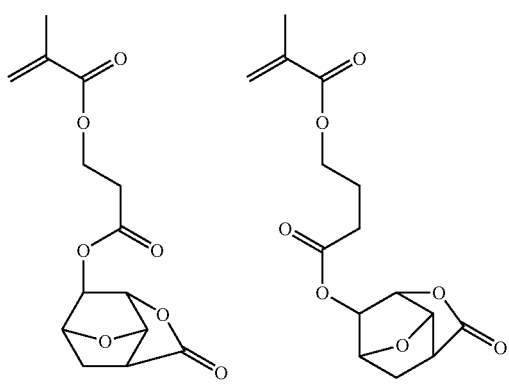
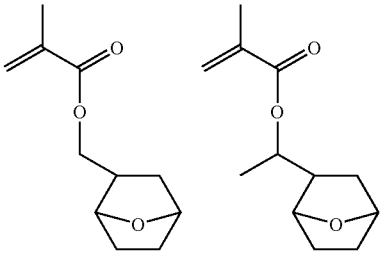
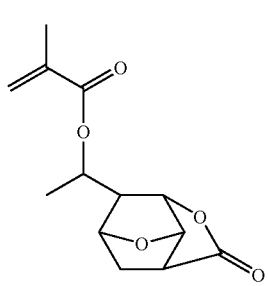
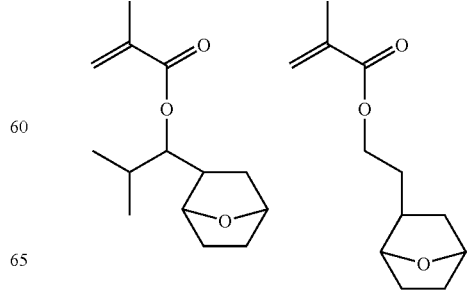

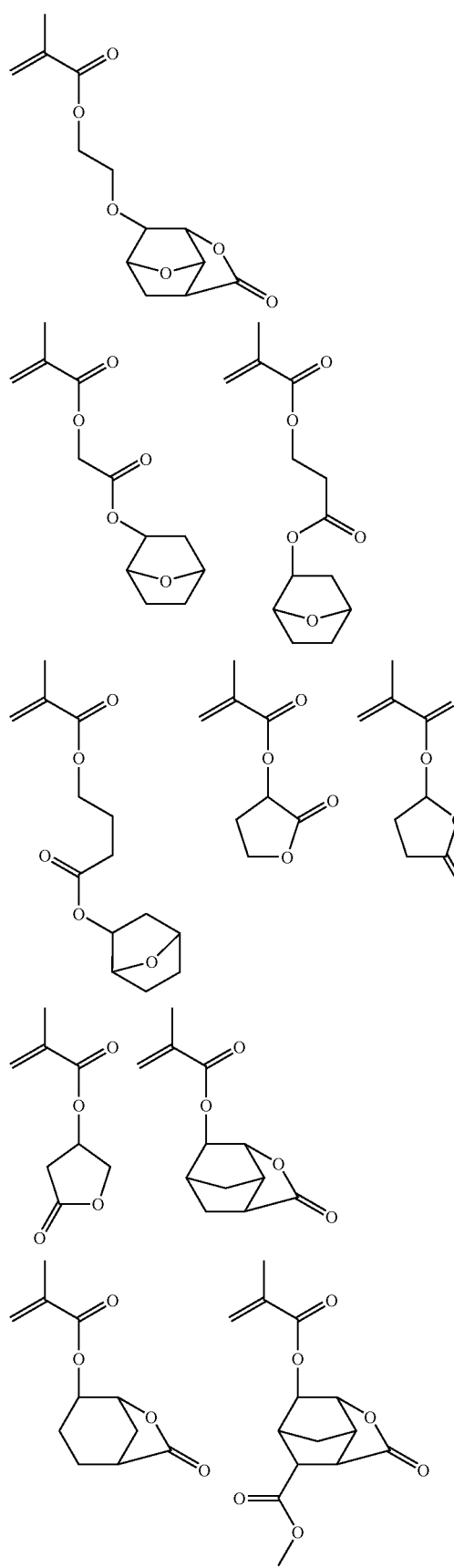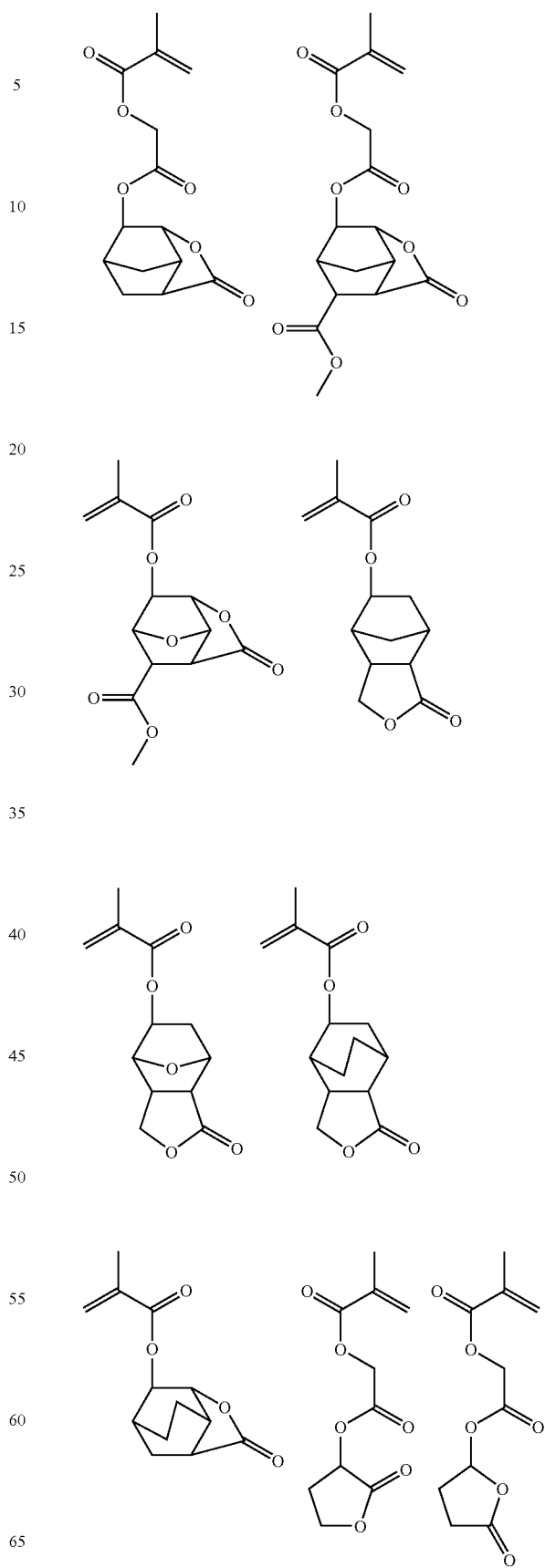

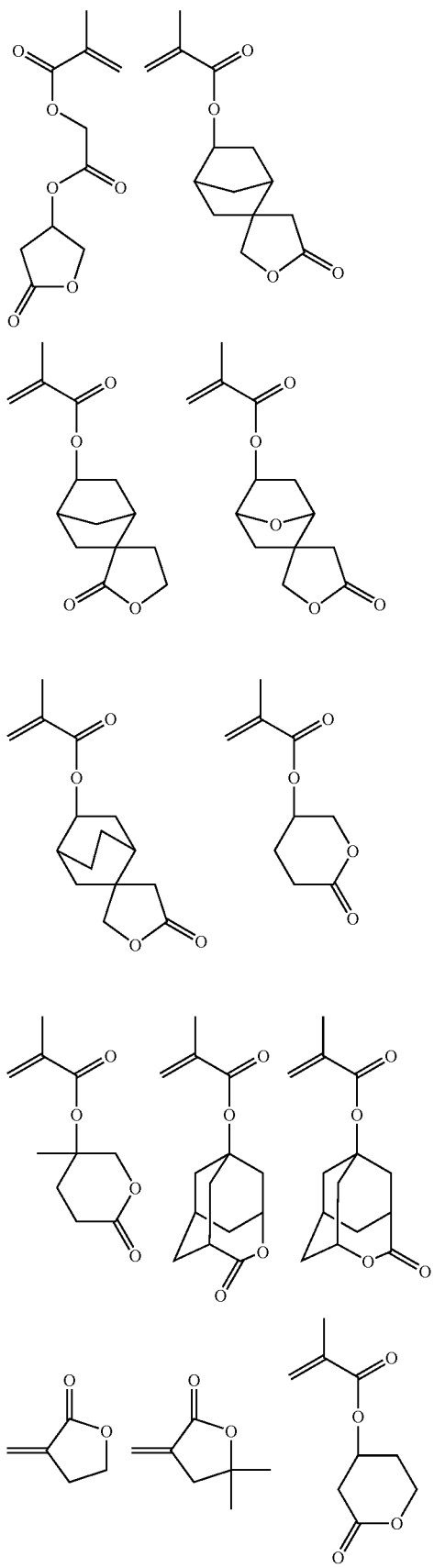
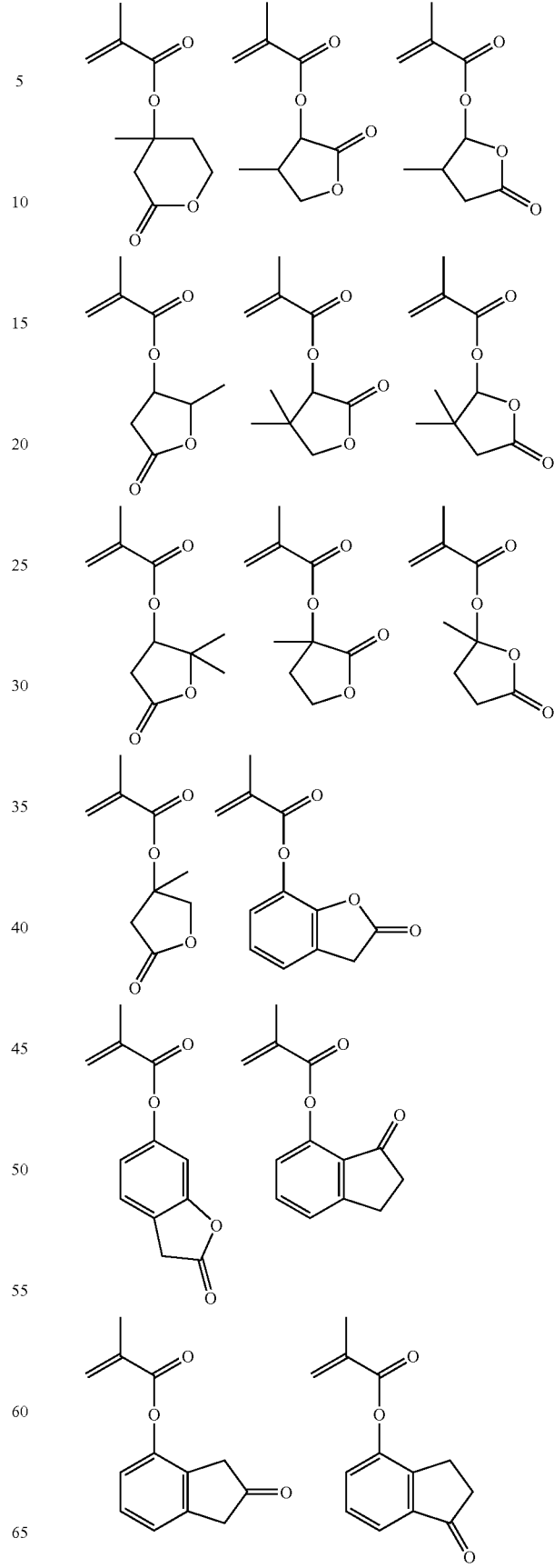

37
-continued
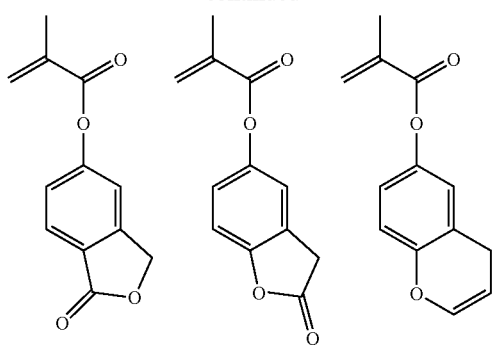
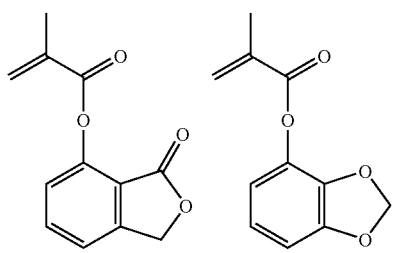
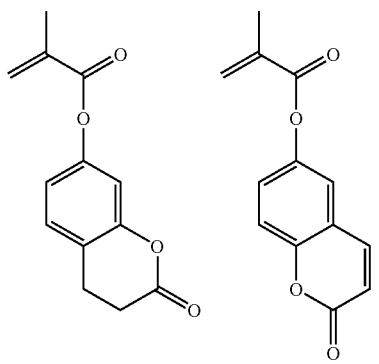
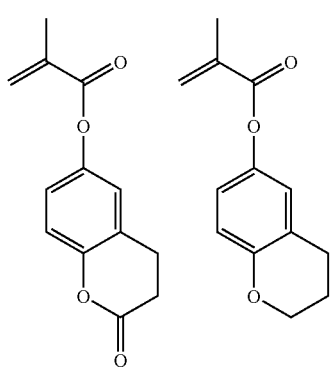
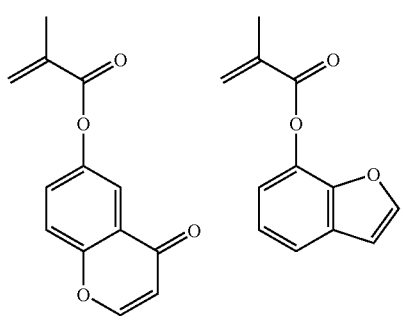
38
-continued
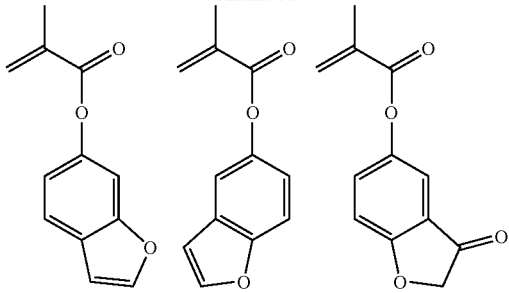
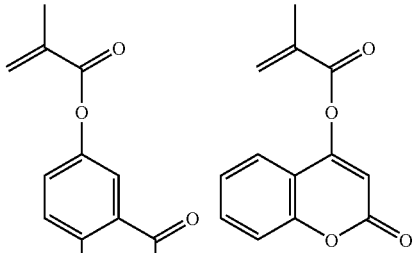
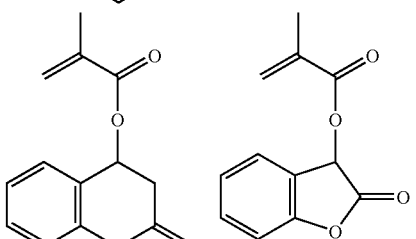
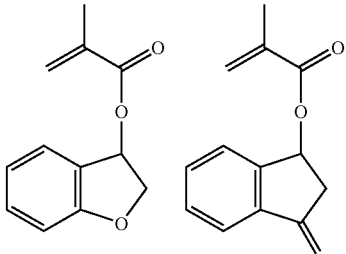
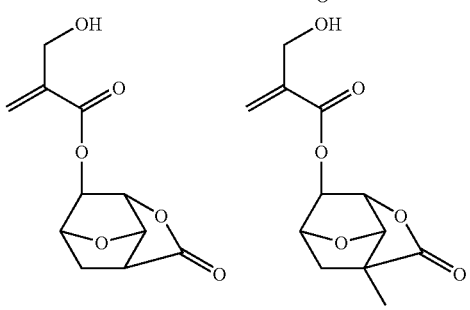
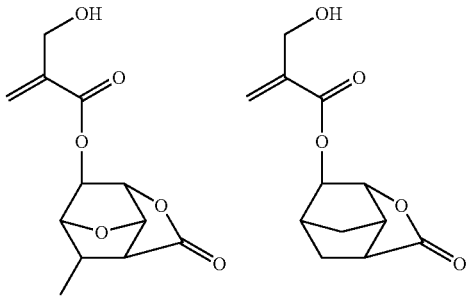

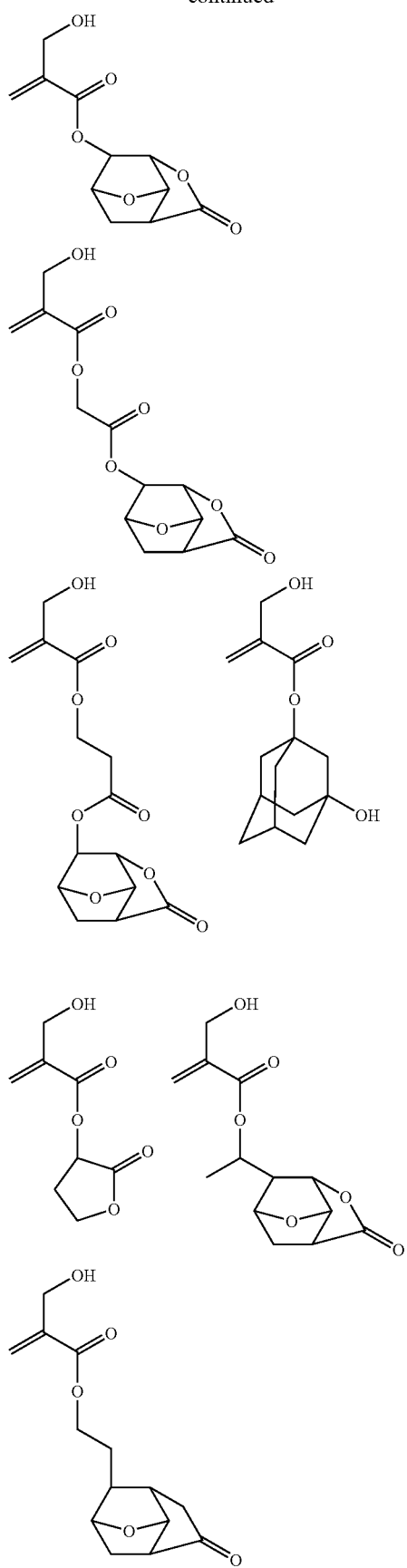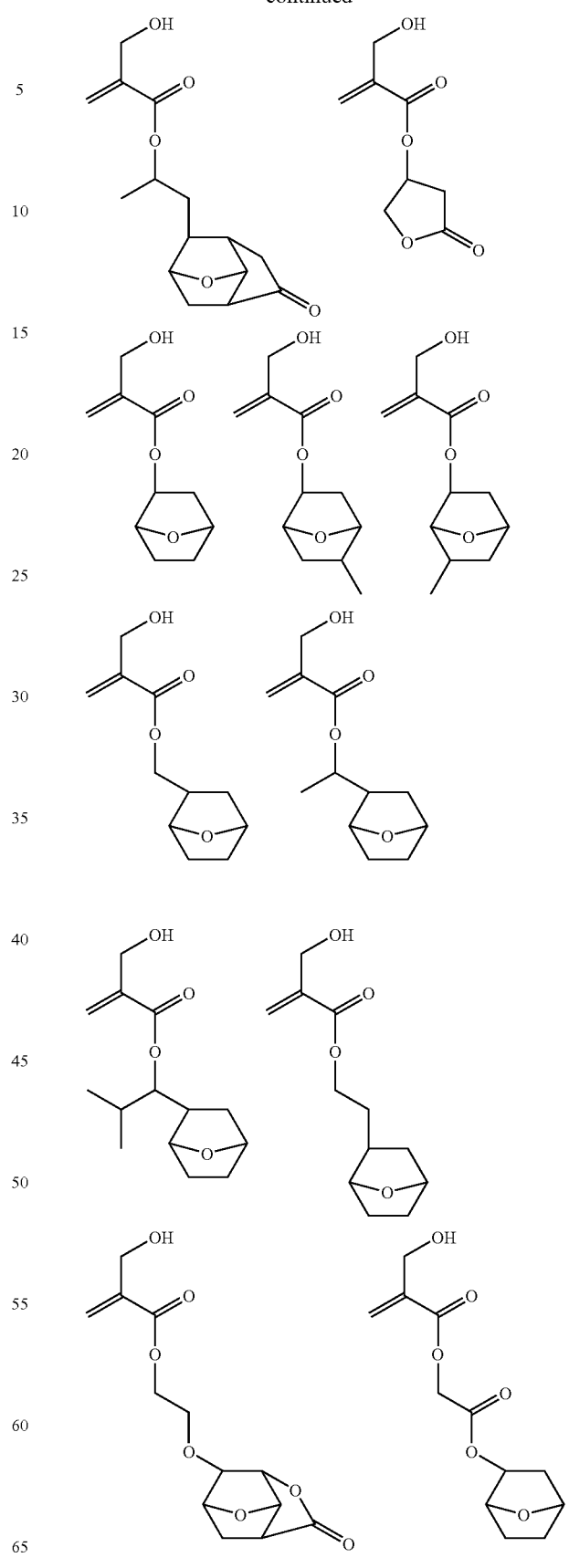

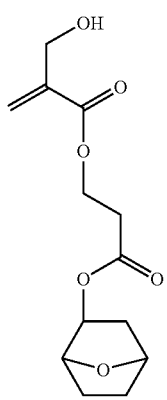

The polymer may be further copolymerized with aromatic olefins (d) such as styrene, vinyl naphthalene, vinyl anthracene, vinyl carbazole, acenaphthylene and indene derivatives, or alicyclic olefins (e) such as norbornene and norbornadiene derivatives commonly used for the purpose of improving etch resistance or controlling reflection; and carboxyl-containing recurring units (f) commonly used for the purpose of improving hydrophilicity to prevent blob defects from generating, and improving its adhesion to a second resist film. Examples of suitable recurring units (f) are given below.

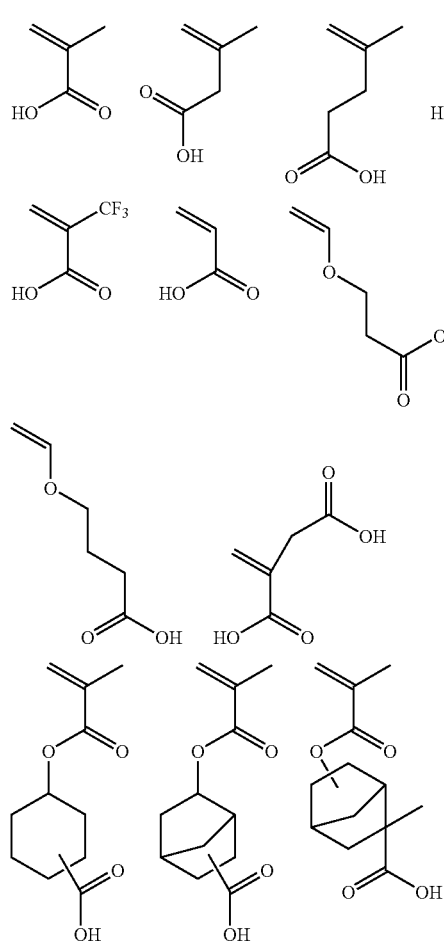

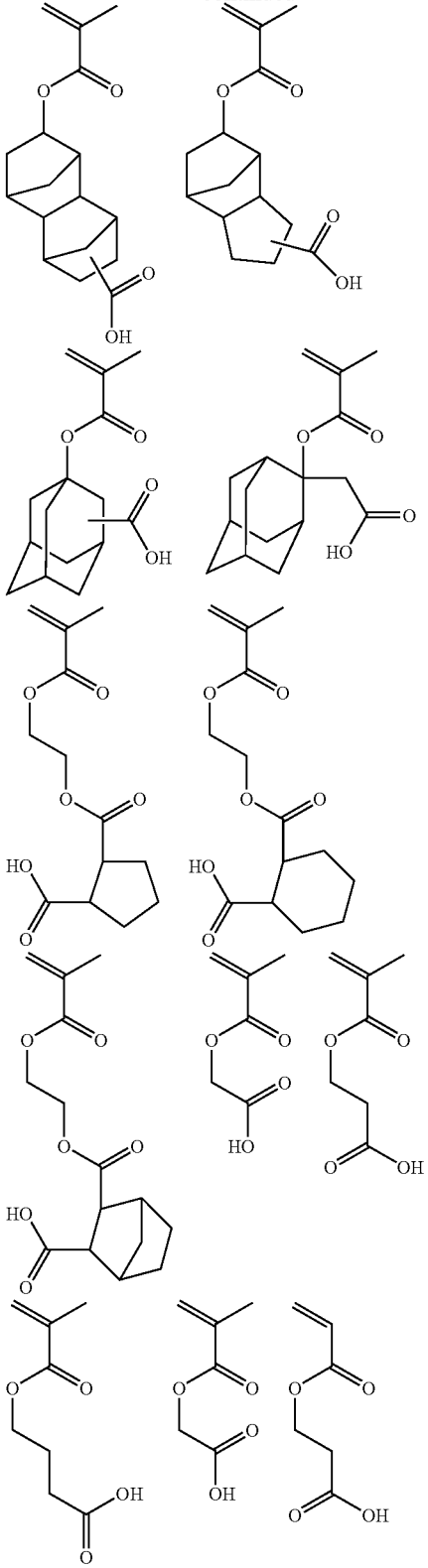

Provided that a polymer comprises recurring units a1, a2, b, c, d, e, and f as depicted above, a proportion of respective recurring units is in the range:
in one embodiment, $0 \leq a1 < 1.0$, $0 < a2 \leq 1.0$, $0 < a1+a2 \leq 1.0$, $0 \leq b \leq 0.8$, $0 \leq c \leq 0.8$, $0 \leq d \leq 0.8$, $0 \leq e \leq 0.8$, and $0 \leq f \leq 0.8$;

in another embodiment, $0 \leq a1 \leq 0.9$, $0.1 \leq a2 \leq 1.0$, $0.1 \leq a1+a2 \leq 1.0$, $0 \leq b \leq 0.7$, $0 \leq c \leq 0.7$, $0 \leq d \leq 0.7$, $0 \leq e \leq 0.7$, and $0 \leq f \leq 0.7$; and in a further embodiment, $0 \leq a1 \leq 0.8$, $0.2 \leq a2 \leq 1.0$, $0.2 \leq a1+a2 \leq 1.0$, $0 \leq b \leq 0.6$, $0 \leq c \leq 0.6$, $0 \leq d \leq 0.6$, $0 \leq e \leq 0.6$, and $0 \leq f \leq 0.6$.

Note that the total of these recurring units is 100 mol % of the entire recurring units.

The hydroxyl-containing polymer used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. A polymer with too low a Mw has a lower glass transition temperature that allows a pattern of resist composition to deform during heat crosslinking after development whereas a polymer with too high a Mw may allow pinholes to be left upon coating.

Of course, a blend of two or more polymers which are different in molecular weight, dispersity or compositional ratio may also be used.

According to the invention, after a first resist pattern is formed from a first positive resist composition through exposure and development, a pattern surface coating composition comprising a crosslinkable polymer comprising hydroxyl-containing recurring units, and preferably a thermal acid generator and a higher alcohol of 3 to 8 carbon atoms is coated onto the first resist pattern, and the polymer is crosslinked with the aid of acid and heat. Acid-assisted crosslinking reaction of hydroxyl groups forms on the first resist pattern a film which is insoluble in alkaline developer and resist solvent. In one embodiment, the hydroxyl-containing polymer may be dissolved in an alcohol of 3 to 8 carbon atoms. Since base polymers for use in positive resist compositions are not soluble in alcohols of 3 to 8 carbon atoms, the invention prevents intermixing between the hydroxyl-containing polymer and the resist pattern. Examples of suitable alcohols of 3 to 8 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, n-octanol, and cyclohexanol.

One or more other solvents may be used in admixture with the alcohol to inhibit intermixing with the resist film. Examples of other solvents include water, heavy water, diisobutyl ether, diisopentyl ether, di-n-pentyl ether, methyl cyclopentyl ether, methyl cyclohexyl ether, decane, toluene, xylene, anisole, hexane, cyclohexane, 2-fluoroanisole, 3-fluoroanisole, 4-fluoroanisole, 2,3-difluorcanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetoaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutaryl methyl, ethyl3-hydroxy-4,4,4-trifluorobutyrate, ethyl2-methyl-4,4,4-trifluoroacetoacetate, ethyl pentafluorobenzoate, ethyl pentafluoropropionate, ethyl pentafluoropropynylacetate, ethyl perfluorooctanoate, ethyl4,4,4-trifluoroacetoacetate, ethyl4,4,4-trifluorobutyrate, ethyl4,4,4-trifluorocrotonate, ethyl trifluorosulfonate, ethyl3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-octane-4,6-dione, 1,1,1,3,5,5,5-heptafluoropentane-2,4-dione, 3,3,4,4,5,5,5-heptafluoro-2-pentanol, 15 3,3,4,4,5,5,5-heptafluoro-2-pentanone, isopropyl4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-hexane-2,4-dione, 2,2,3,3,4,4,5,5-octafluoro-1-pentanol, 1H,1H,2H,2H-perfluoro-1-decanol, perfluoro(2,5-dimethyl-3,6-dioxane anionic)acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, perfluoro-2,5,8-trimethyl-3,6,9-trioxadecanoic acid methyl ester, perfluorotripentylamine, perfluorotripropylamine, 1H,1H,2H,3H,3H-perfluoroundecane-1,2-diol, trifluorobutanol, 1,1,1-trifluoro-5-methyl-hexane-2,4-dione, 1,1,1-trifluoro-2-propanol, 3,3,3-trifluoro-1-propanol, 1,1,1-trifluoro-2-propyl acetate, perfluorobutyl tetrahydrofuran, perfluoro(butyltetrahydrofuran), perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl3-trifluoromethoxypropionate, perfluorocyclohexanone, propylene glycol trifluoromethyl ether, butyl trifluoroacetate, 1,1,1-trifluoro-5,5-dimethyl-hexane-2,4-dione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol.

In the pattern surface coating composition, the $C_3$-$C_8$ alcohol is preferably present in an amount of at least 10% by weight, and more preferably 30 to less than 100% by weight of the composition. The hydroxyl-containing polymer is preferably present in an amount of 0.001 to 30% by weight, and more preferably 0.01 to 10% by weight of the pattern surface coating composition.

To accelerate the crosslinking reaction of hydroxyl groups on the polymer, an acid generator is advantageously added to the pattern surface coating composition. The acid generator may be either a photoacid generator or a thermal acid generator. For the crosslinking reaction, a temperature of 100 to 250° C. and a time of 5 to 500 seconds are preferably employed. Although the acid generator will be described later in detail, the preferred acid generator is an ammonium salt having the general formula (2).

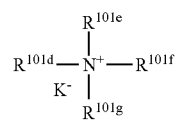

(2)

Herein $R^{101d}$, $R^{101e}$, $R^{101f}$ and $R^{101g}$ are each independently hydrogen, a straight, branched or cyclic alkyl, alkenyl, oxoalkyl or oxoalkenyl group of 1 to 20 carbon atoms, which may have an ether or ester group, an aryl group of 6 to 20 carbon atoms, or an aralkyl or aryloxoalkyl group of 7 to 12 carbon atoms, in which some or all hydrogen atoms may be substituted by alkoxy groups. Alternatively, $R^{101d}$ and $R^{101e}$, or $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is a $C_3$-$C_{10}$ alkylene group or a group forming a hetero-aromatic ring having the nitrogen atom therein when they form a ring. $K^-$ is a non-nucleophilic counter ion.

Although triphenylsulfonium salts are excellent photoacid generators, most of them are useless as a thermal acid generator because of their pyrolytic temperature of above 250° C. However, those sulfonium salts having benzyl, naphthalenemethyl, alkyl or carbonylmethyl group substituted thereon are useful as a thermal acid generator due to a lower pyrolytic temperature. The acid generator is preferably present in an amount of 0.01 to 50% by weight, and more preferably 0.1 to 30% by weight of the solids in the pattern surface coating composition.

In the polymer used in the pattern forming process, recurring units (a1) are effective in improving solubility in an alcohol solvent, but the hexafluoroalcohol group in units (a1) is not crosslinkable. What is crosslinkable is the hydroxyl group in recurring units (a2), especially the hydroxyl group of primary or secondary alcohol.

A polymer obtained through copolymerization of recurring units (a1) with hydroxyl-containing recurring units (a2) is soluble in an alcohol solvent, and insoluble in a solvent used in a positive resist composition. By the way, a polymer consisting of recurring units (a1) is soluble in a solvent used in a positive resist composition. In a situation where a first positive resist pattern is formed, a resist pattern dissolution-preventing film is formed, and a second resist solution is coated thereon; the polymer which is insoluble in a solvent used in a positive resist composition ensures that the film formed of that polymer effectively prevents the second resist solution from penetrating into and dissolving the first resist pattern.

In general, positive resist compositions are formulated by dissolving polymers in solvents. Suitable solvents include ketones such as cyclohexanone and methyl-2-n-amylketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether, and esters such as propylene glycol monomethyl ether acetate, propylene glycol monoethyl ether acetate, ethyl lactate, ethyl pyruvate, butyl acetate, methyl3-methoxypropionate, ethyl3-ethoxypropionate, tert-butyl acetate, tert-butyl propionate, propylene glycol mono-tert-butyl ether acetate. Among these, cyclohexanone, propylene glycol monomethyl ether acetate and ethyl lactate are commonly used. The polymers used herein are those soluble in these solvents.

Polymers containing a higher proportion of hydroxyl-containing recurring units (a2) are not soluble in the resist solvents.

The first resist pattern is irradiated with light during the second exposure to form the second resist pattern. The first resist pattern should maintain its pattern even after the second development. Then the resist pattern dissolution-preventing film according to the invention should be insoluble in alkaline developer after crosslinking by baking.

The material having hydroxyl groups which is insoluble in alkali includes an exposed area of negative resist film. Upon exposure, the negative resist composition becomes alkali insoluble through crosslinking reaction between an acid generated from an acid generator upon exposure and a crosslinker. Like the negative resist composition, the resist pattern dissolution-preventing film according to the invention can be turned to be alkali insoluble through crosslinking reaction between an acid generated from an acid generator and a crosslinker. The acid generator used herein favors a thermal acid generator rather than a photoacid generator in that the former dispenses with light exposure.

Also the film may be turned to be alkali insoluble without resorting to a crosslinking system. The recurring units (a1) exhibit alkali solubility, and among recurring units (a2), primary alcohol-containing units exhibit some alkali solubility. Among recurring units (a2), however, secondary alcohol-containing units and particularly tertiary alcohol-containing units act to reduce alkali solubility.

This suggests that a polymer which is soluble in alcohol and insoluble in resist solvent and alkaline developer can be prepared by combining units (a1) for alcohol solubility with units (a2) having primary or secondary alcohol for crosslinking and insolubilization in resist solvent and units (a2) having secondary or tertiary alcohol for reducing alkali solubility.

When the polymer having such characteristics is used as the resist pattern dissolution-preventing film, it can be applied to the pattern forming process of the invention without resorting solely to the crosslinking system of acid and crosslinker. Since not only acid, but also heat is necessary for crosslinking reaction to take place, a positive resist composition comprising a polymer having a low thermal flow temperature has a risk that a pattern thereof may be thermally deformed during formation of the resist pattern dissolution-preventing film. To address resist polymers having varying thermal flow temperature, preference is given to a lower baking temperature during formation of the resist pattern dissolution-preventing film (or resist pattern protective film). To this end, it is necessary to introduce as many reactive crosslinking groups as possible. Specifically, the baking temperature is up to 220° C., more specifically up to 180° C., even more specifically up to 160° C., and ideally up to 130° C. A baking temperature of up to 160° C., which is lower than the glass transition temperature Tg of many polymers used in resists, may inhibit pattern deformation by thermal flow. A baking temperature of up to 130° C. may prevent the pattern from shrinkage by deprotection reaction of acid labile groups. An appropriate baking time is 5 to 300 seconds. It is preferred that the resist pattern dissolution-preventing material in the polymer stage prior to crosslinkage is insoluble in resist solvent and alkaline developer and after a certain degree of crosslinkage at a relatively low temperature, exhibits stronger barrier properties.

When the resist pattern dissolution-preventing film according to the invention is formed, a component that induces crosslinkage under the action of acid (i.e., crosslinker) may be added to the pattern surface coating composition. Examples of the crosslinker which can be used herein include melamine, guanamine, glycoluril or urea compounds having substituted thereon at least one group selected from methylol, alkoxymethyl and acyloxymethyl groups, epoxy compounds, oxetane compounds, isocyanate compounds, azide compounds, compounds having a double bond such as an alkenyl ether group, compounds having benzyl alcohol, and oxazoline-based crosslinkers disclosed in JP-A 2-60941, JP-A 2-99537 and JP-A 2-115238. Since an oxazoline group is reacted with a carboxyl group at a low temperature, the oxazoline crosslinkers are preferably used.

The crosslinker may be present in an amount of 0 to 80%, and more specifically 0 to 50% by weight of the solids in the pattern surface coating composition, and when used, preferably in an amount of at least 5% by weight.

With respect to the crosslinker, examples of suitable epoxy compounds include tris(2,3-epoxypropyl)isocyanurate, trimethylolmethane triglycidyl ether, trimethylolpropane triglycidyl ether, and triethylolethane triglycidyl ether.

Also included are phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-6,6'-diol, and 5,5'-dimethyl-3,3,3',3'-tetramethyl-2,3,2',3'-tetrahydro-(1,1')-spirobiindene-6,6'-diol, in which the hydroxy group has been converted to a glycidyl ether form, and novolac resins of the foregoing phenolic compounds in which the hydroxy group has been converted to a glycidyl ether form.

Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate, and cyclohexane diisocyanate. Suitable azide compounds include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Other useful crosslinkers include cyclic epoxy compounds as described in JP-A 11-100378, JP-A 2003-231860, JP-A 2005-146038, JP-A 2006-290052, JP-A 2006-199790, and JP-A 2006-273748, crosslinkers having an oxirane ring attached to a ring as described in JP-A 2006-348252, epoxy crosslinkers based on dendrimers or hyper-branched polymers as described in JP-A 2008-24920, crosslinkers having both hydroxy and oxetanyl groups as described in JP-A 2001-310937, and crosslinkers having both hydroxy and epoxy groups as described in JP 3824286.

The epoxy group provides a substantially strained ring with high reactivity whereas the oxetane is highly basic and acid bondable. A combination of epoxy group with oxetanyl group is reported to achieve a significant improvement in reactivity of cationic polymerization.

Positive Resist Composition

Polymer

While the first and second positive resist compositions are used in the pattern forming process of the invention, each resist composition comprises a base polymer, preferably a polymer obtained through copolymerization of recurring units (g) having an acid labile group as represented by the general formula (5) below and recurring units having an adhesive group. The first and second positive resist compositions may be the same or different although the same is preferred because of etching under the same conditions.

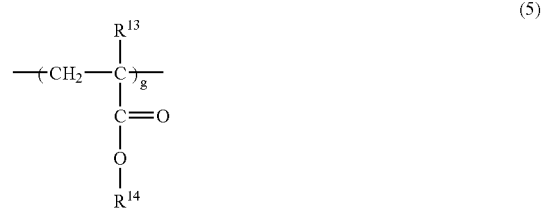

(5)

Herein $R^{13}$ is hydrogen or methyl, $R^{14}$ is an acid labile group, and g is a number in the range $0 < g \leq 0.8$.

Monomers Mg from which recurring units of formula (5) are derived have the following formula.

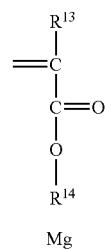

Mg

Herein $R^{13}$ and $R^{14}$ are as defined above.

In formula (5), $R^{14}$ is an acid labile group which may be selected from a variety of such groups. Preferred acid labile groups are groups of formulae (AL-10) and (AL-11), tertiary alkyl groups of 4 to 40 carbon atoms represented by formula (AL-12), and oxoalkyl groups of 4 to 20 carbon atoms, but not limited thereto.

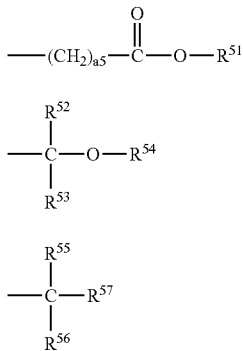

(AL-10)

(AL-11)

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

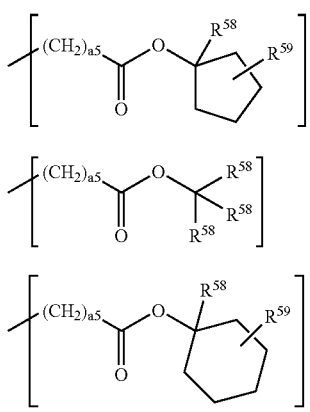

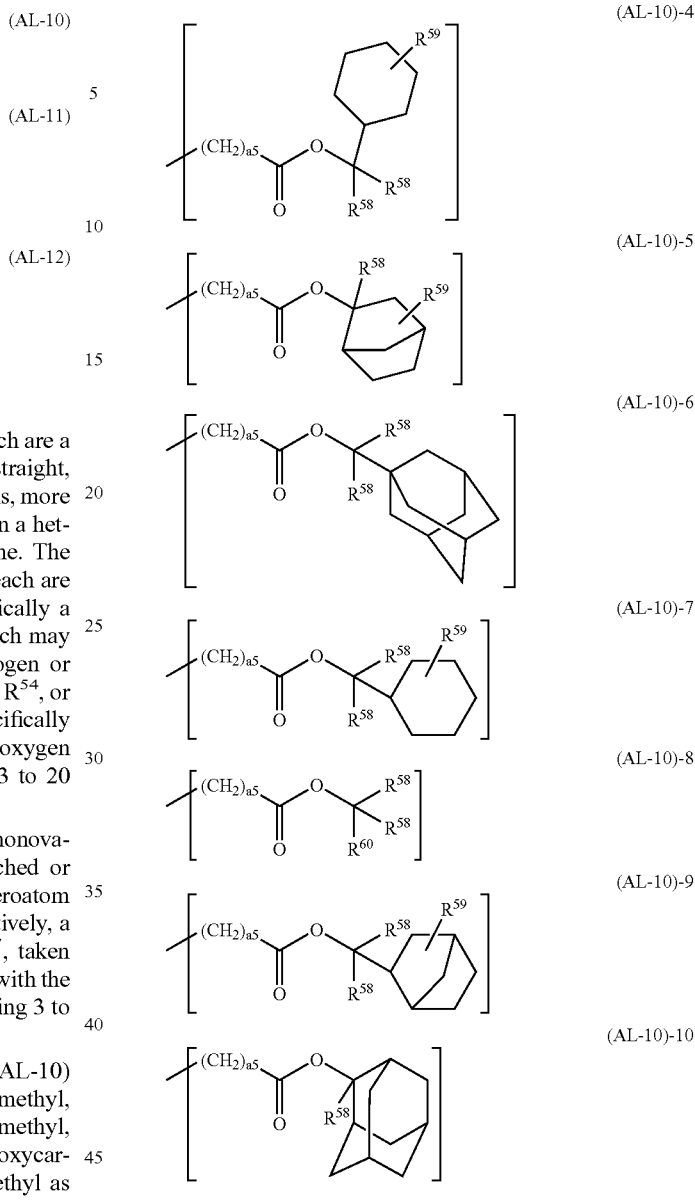

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-34.

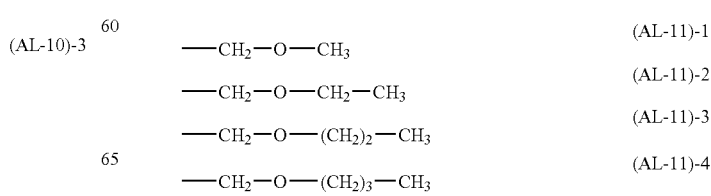

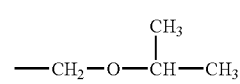 (AL-11)-5
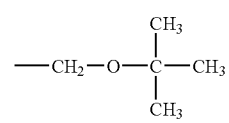 (AL-11)-6
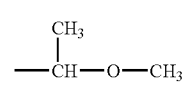 (AL-11)-7
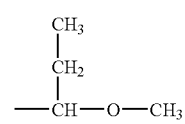 (AL-11)-8
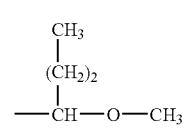 (AL-11)-9
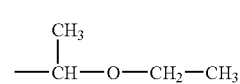 (AL-11)-10
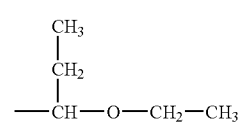 (AL-11)-11
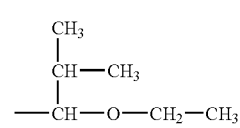 (AL-11)-12
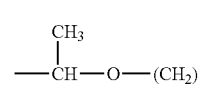 (AL-11)-13
 (AL-11)-14
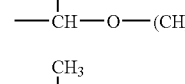 (AL-11)-15
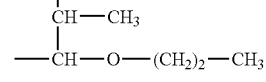 (AL-11)-16
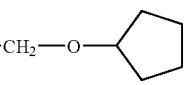 (AL-11)-17
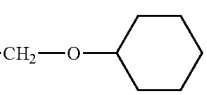 (AL-11)-18
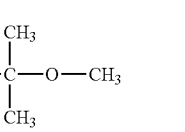 (AL-11)-19
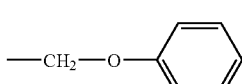 (AL-11)-20
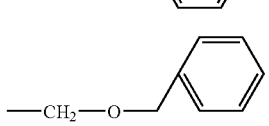 (AL-11)-21
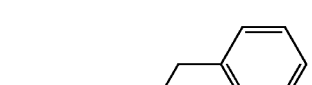 (AL-11)-22
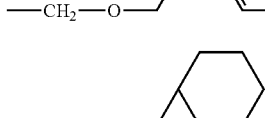 (AL-11)-23
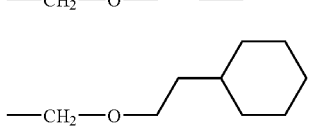 (AL-11)-24
 (AL-11)-25
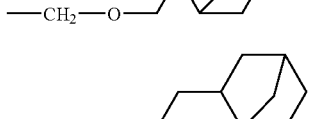 (AL-11)-26
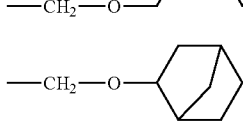 (AL-11)-27
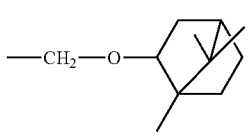 (AL-11)-28
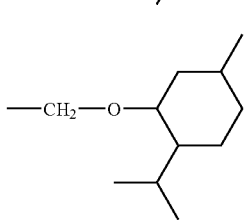 (AL-11)-29
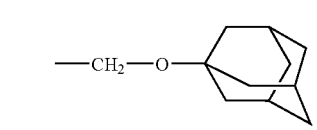 (AL-11)-30
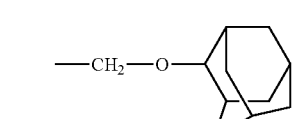 (AL-11)-31
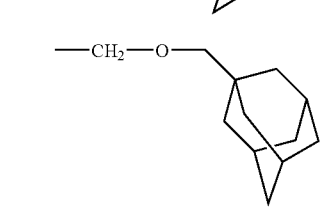 (AL-11)-32

(AL-11)-33

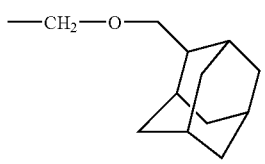

(AL-11)-34

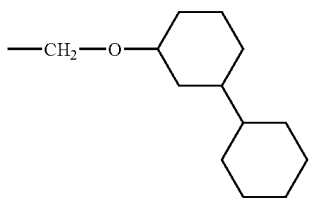

The polymer (or base resin) may be crosslinked within the molecule or between molecules with acid labile groups of formula (AL-11a) or (AL-11b).

(AL-11a)

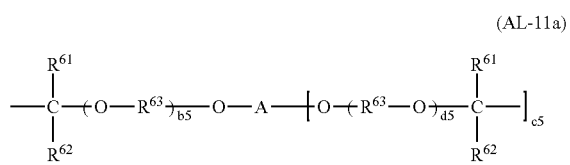

(AL-11b)

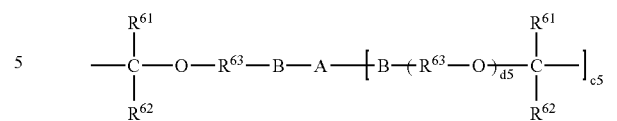

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae through (AL-11)-42.

(AL-11)-35

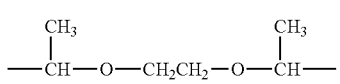 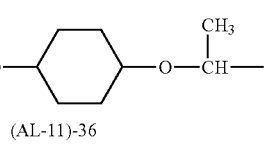

(AL-11)-36

(AL-11)-37

(AL-11)-38

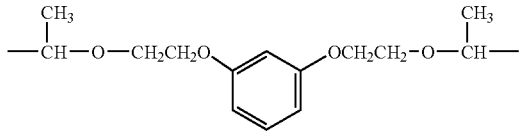

(AL-11)-39

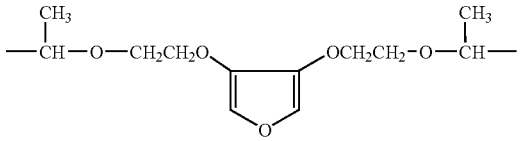

(AL-11)-40

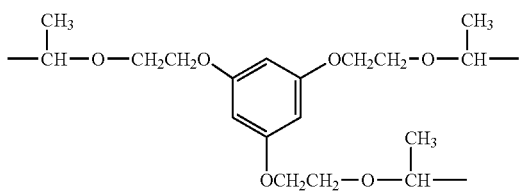

(AL-11)-41

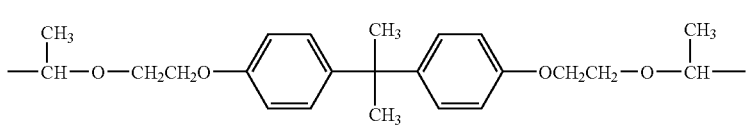

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
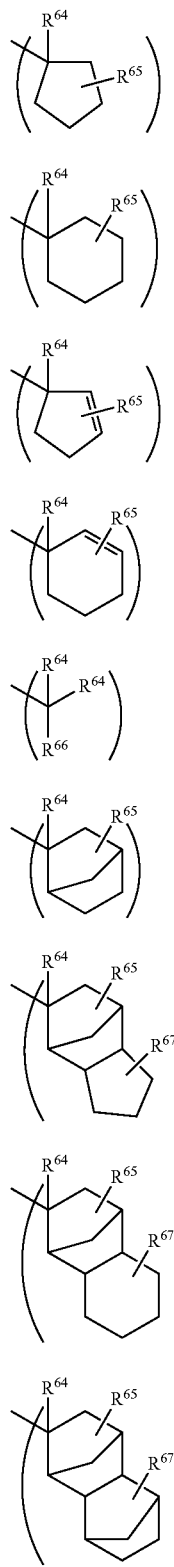
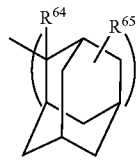
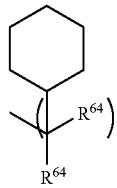
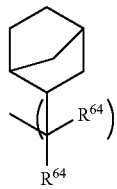
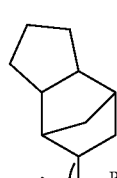
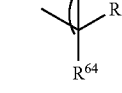
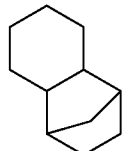
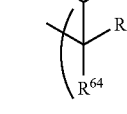
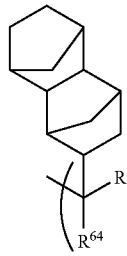
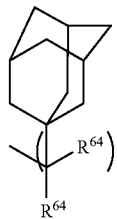
Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

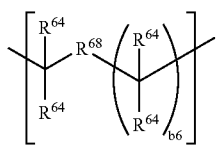

(AL-12)-17

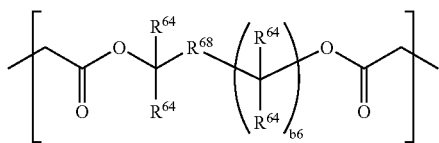

(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

  (AL-13)-1

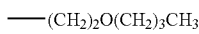  (AL-13)-2

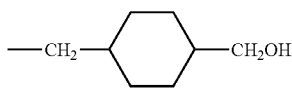  (AL-13)-3

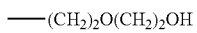  (AL-13)-4

  (AL-13)-5

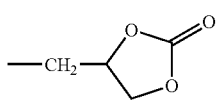  (AL-13)-6

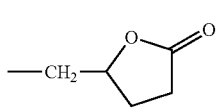  (AL-13)-7

Of the acid labile groups of formula (AL-12), recurring units having an exo-form structure represented by the formula (AL-12)-19 are preferred.

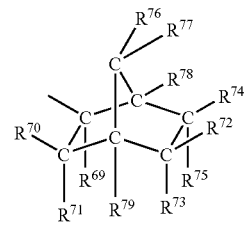

(AL-12)-19

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring, and specifically aliphatic ring with the carbon atom(s) to which they are attached, and in this case, each is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19:

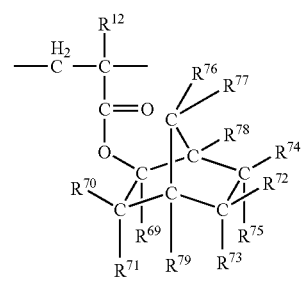

are derived are described in U.S. Pat. No. 6,448,420 (JP-A 2000-327633). Illustrative non-limiting examples of suitable monomers are given below.

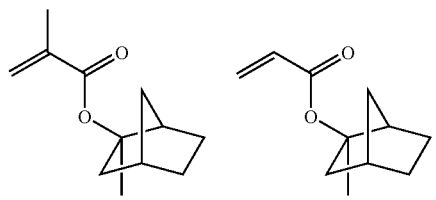

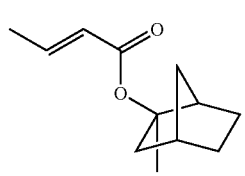

-continued

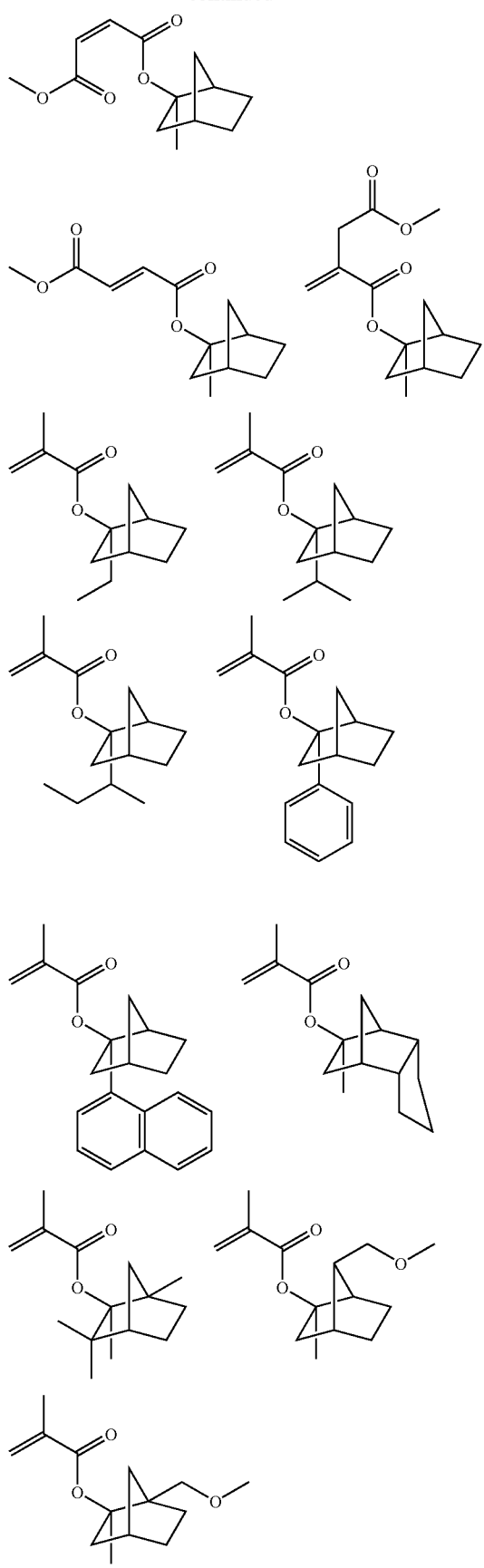

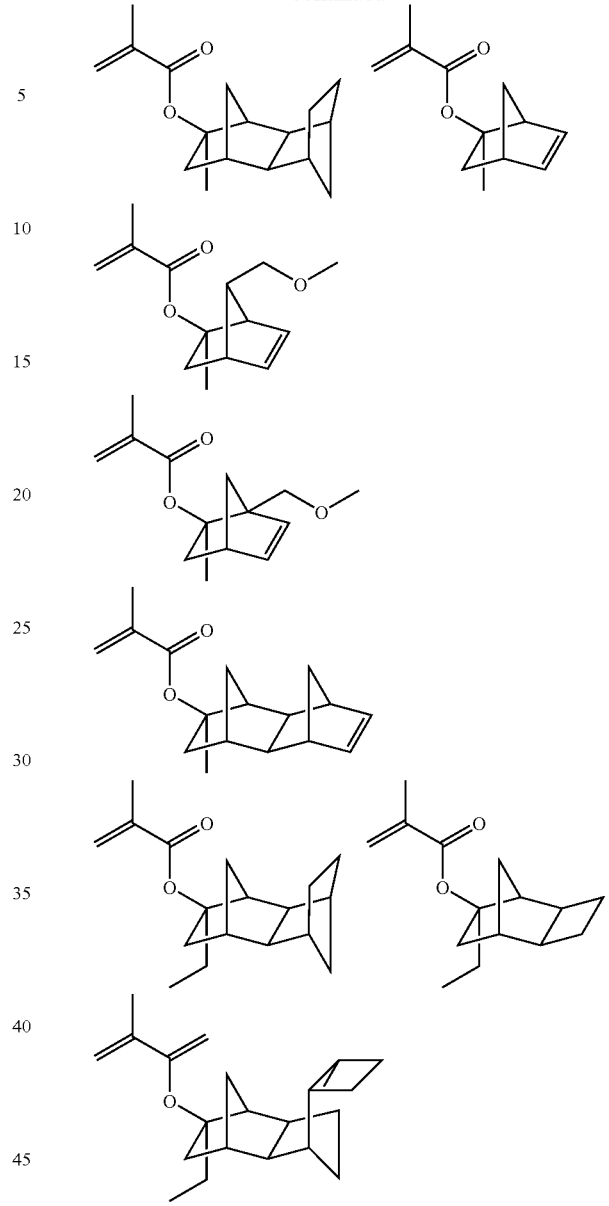

Also included in the acid labile groups of formula (AL-12) are acid labile groups having furandiyl, tetrahydrofurandiyl or oxanorbornanediyl as represented by the following formula (AL-12)-20.

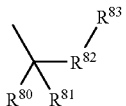

(AL-12)-20

Herein, $R^{80}$ and $R^{81}$ are each independently a monovalent hydrocarbon group, typically a straight, branched or cyclic alkyl of 1 to 10 carbon atoms. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic alkyl of 1 to 10 carbon atoms, which may contain a heteroatom.

Examples of the monomers from which the recurring units substituted with acid labile groups having furandiyl, tetrahydrofurandiyl and oxanorbornanediyl as represented by the formula:

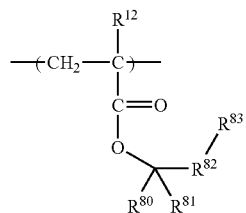

(wherein $R^{80}$, $R^{81}$, $R^{82}$ and $R^{83}$ are as defined above) are derived are shown below. Note that Me is methyl and Ac is acetyl.

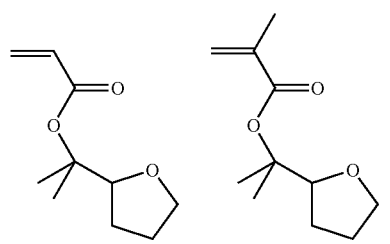

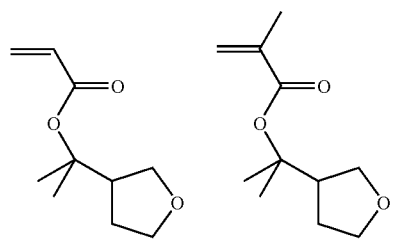

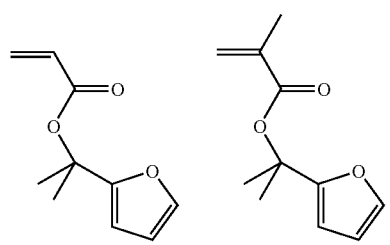

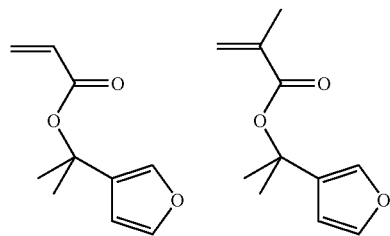

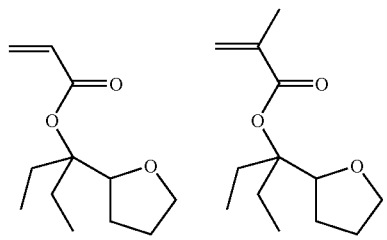

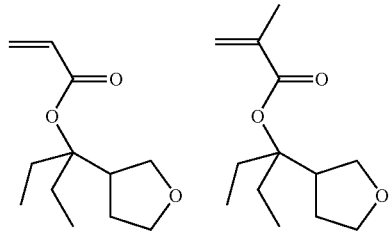

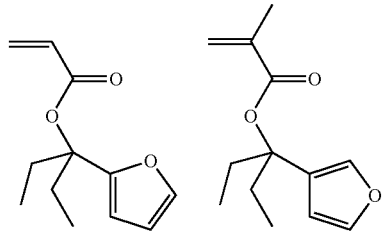

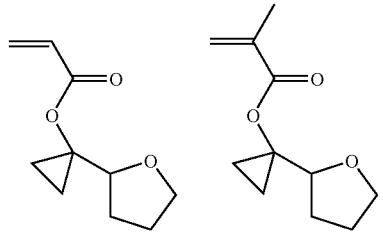

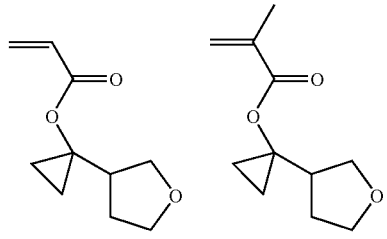

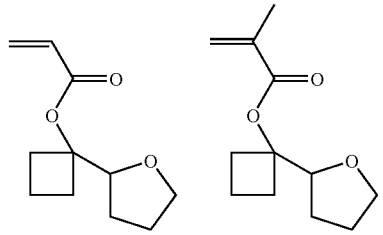

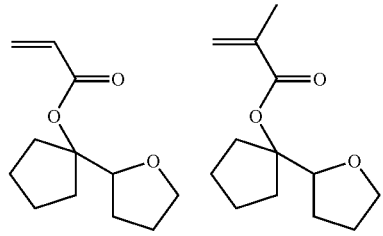

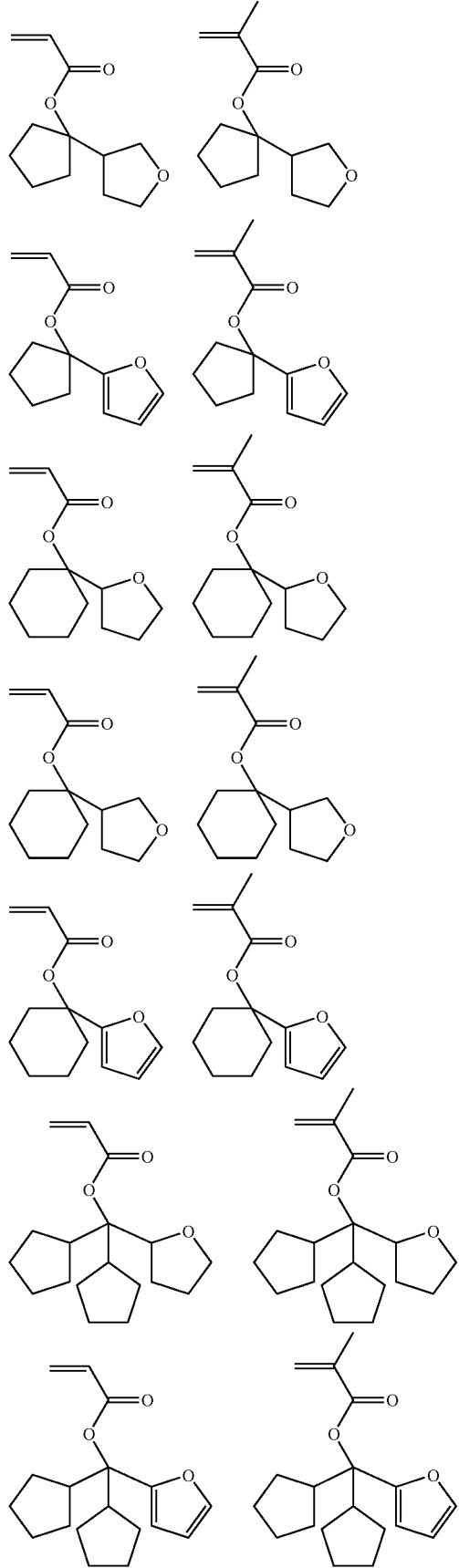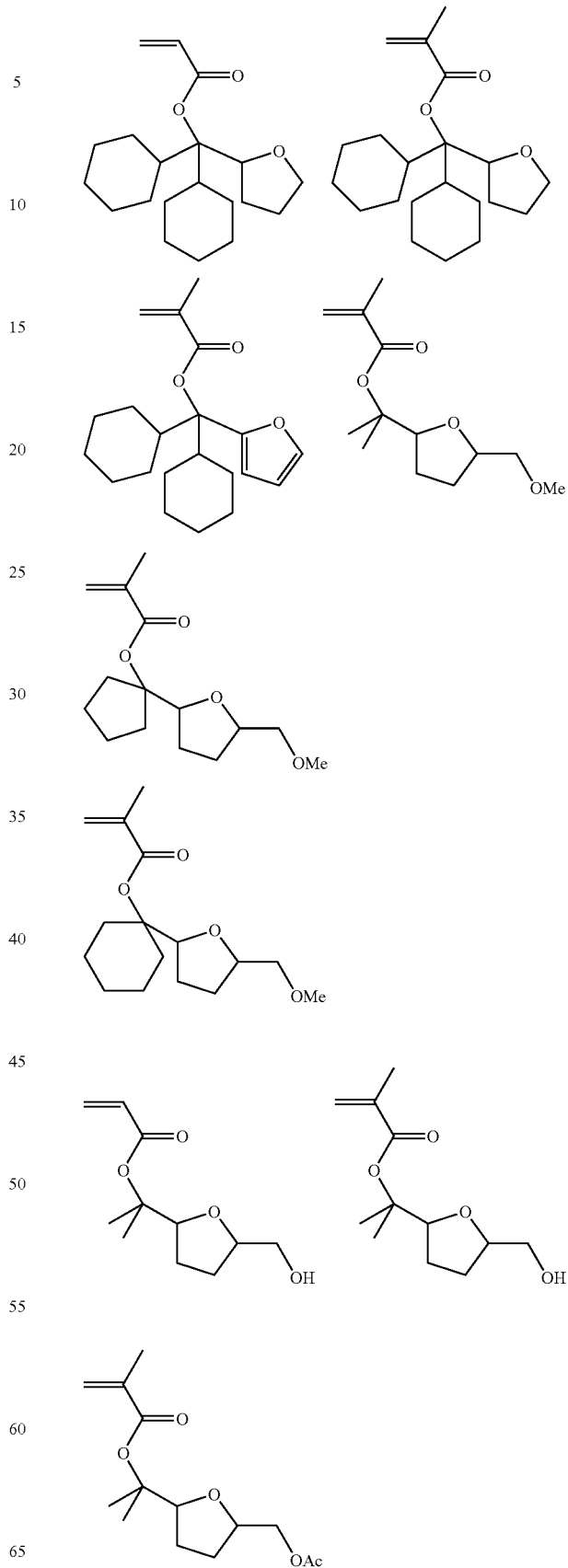

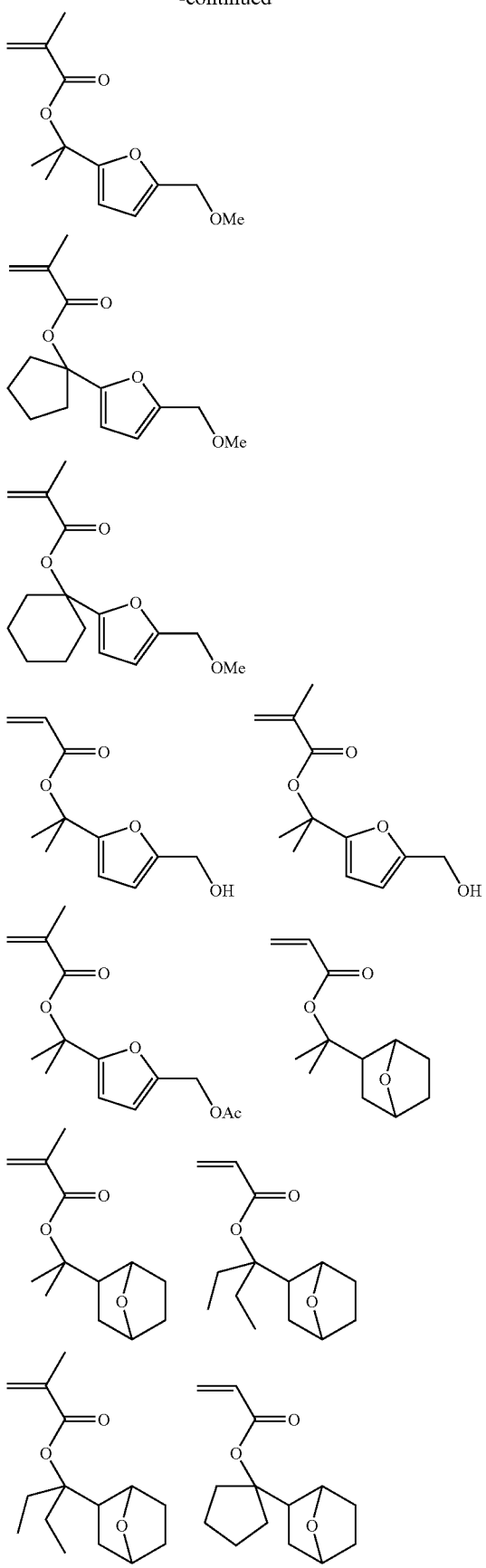
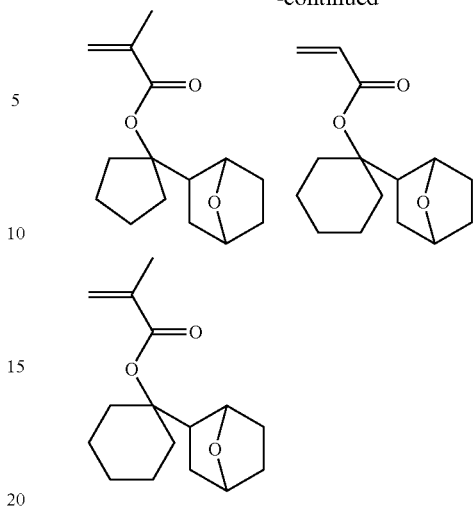

The polymer used in the positive resist composition preferably is obtained through copolymerization of recurring units (g) with an acid labile group represented by formula (5) with recurring units with an adhesive group having hydroxyl, carboxyl or lactone. The adhesive groups having hydroxyl are shown in units (a1) and (a2) above, while the adhesive groups having lactone and α-hydroxymethyl are shown in units (c) above. There may be further copolymerized any of recurring units (b), (d), (e) and (f) described above. Where recurring units having a primary or secondary hydroxyl-containing ester group and recurring units having an α-hydroxymethyl group are incorporated in the resist base polymer, surface crosslinking of the resist film is promoted at the same time as crosslinking of the cover film, resulting in a more robust crosslinked film. This permits the thickness of the resist pattern protective film to be reduced accordingly, minimizing pattern thickening after coating of the resist pattern protective film.

While the recurring units having hydroxyl are already shown as units (a1) and (a2) above, recurring units (h) having a trifluoromethylhydroxy group as shown below may be copolymerized in the polymers for use in positive resist compositions.

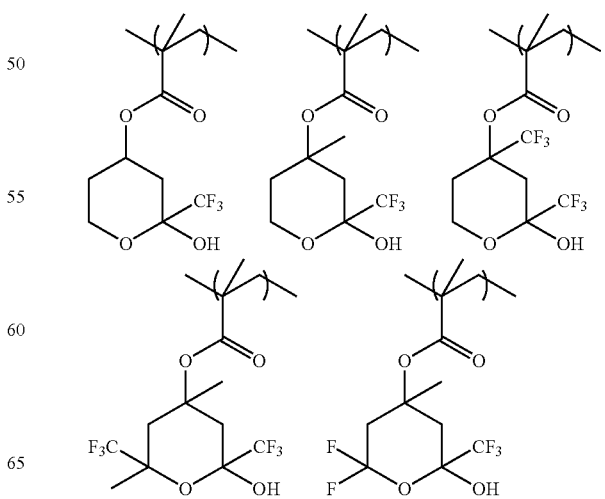

-continued

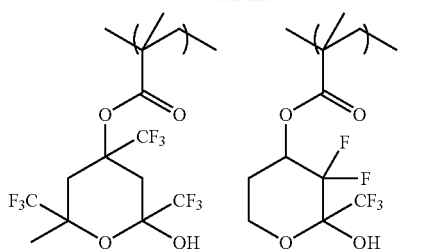
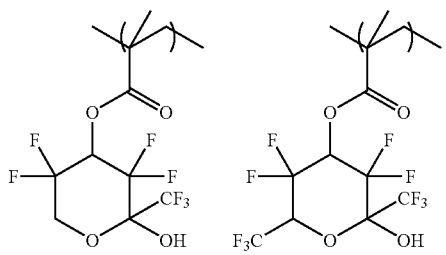
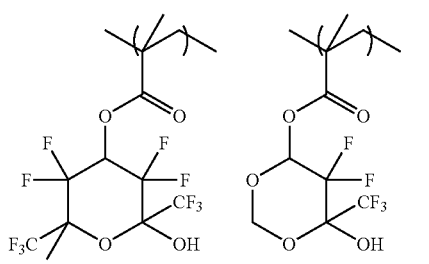
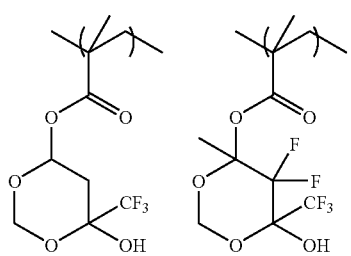
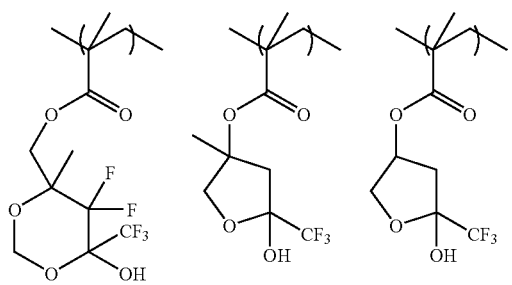
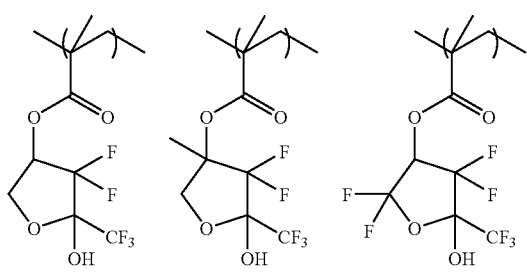

-continued

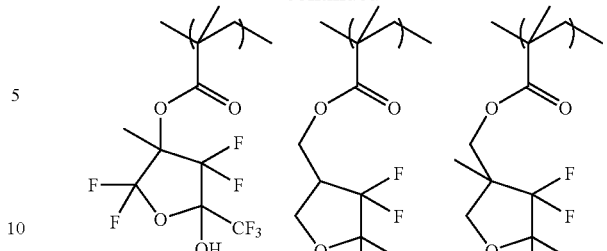
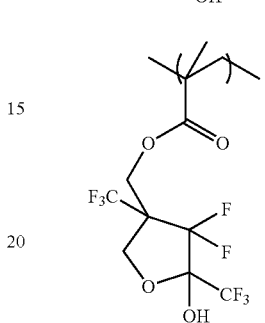

While the hexafluoroisopropanol group is inert to crosslinking reaction with epoxy, oxetanyl and methylol groups, the hemiacetal group shown herein undergoes crosslinking reaction with epoxy and oxetanyl groups. Then incorporating a hemiacetal group into the resist base polymer may promote the progress of crosslinking reaction on the resist surface.

In the polymer comprising recurring units (g), (a1), (a2), (b), (c), (d), (e), (f) and (h), a proportion of respective recurring units is in the range: $0.1 \leq g < 1.0$, $0 \leq a1 \leq 0.8$, $0 \leq a2 \leq 0.8$, $0 \leq b \leq 0.8$, $0 \leq c \leq 0.8$, $0 \leq d \leq 0.8$, $0 \leq e \leq 0.8$, $0 \leq f \leq 0.8$, $0 \leq h \leq 0.8$, and $a1+a2+b+c+d+e+f+g+h=1$.

The polymer serving as the base polymer in the positive resist composition used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. A polymer with too low a Mw has a lower glass transition temperature that may allow a pattern of resist composition to deform during heat crosslinking after development whereas a polymer with too high a Mw may have low alkali solubility and tend to give rise to a footing phenomenon after pattern formation.

If a polymer as used in the resist composition has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (g), (a1), (a2), (b), (c), (d), (e), (f) and (h) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter protected or partially protected.

In addition to the polymer, the positive resist composition, specifically chemically amplified positive resist composition, used in the pattern forming process of the invention may generally comprise an organic solvent, an acid generator (or a compound capable of generating an acid in response to high-energy radiation), and optionally, a dissolution inhibitor, basic compound, surfactant and other components.

Organic Solvent

The organic solvent used in the positive resist composition may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl3-methoxypropionate, ethyl3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 1,000 parts, especially about 400 to 800 parts by weight per 100 parts by weight of the base resin in the resist composition.

Acid Generator

An acid generator may be used either in the positive resist composition or in the pattern surface coating composition. Suitable acid generators include the following: (i) onium salts of the formula (Pla-1), (Pla-2), (Pla-3) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

These acid generators are described in detail.

(i) Onium Salts of Formula (Pla-1), (Pla-2) and (Pla-3):

Herein, $R^{101a}$, $R^{101b}$ and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a sulfonic acid in which at least one alpha-position is fluorinated, or a perfluoroalkylimide acid or perfluoroalkylmethide acid. $R^{101d}$, $R^{101e}$, $R^{101f}$ and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy groups. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms or a hetero-aromatic ring having the nitrogen atom (in the formula) incorporated therein, such as imidazole, pyrazole, pyrimidine, pyridazine, pyrazine, triazine, imidazole or benzimidazole, when they form a ring.

Of the onium salts having formulae (Pla-1), (Pla-2) and (Pla-3), those of formula (Pla-1) function as a photoacid generator, those of formula (Pla-2) function as a thermal acid generator, and those of formula (Pla-3) have both the functions of a photoacid generator and a thermal acid generator. The photoacid generators (Pla-1) and (Pla-3) are typically used when added to resist compositions whereas the thermal acid generators (Pla-2) are typically used when added to pattern protective film compositions.

Examples of $K^-$ include perfluoroalkanesulfonic acids such as triflate and nonaflate; imide acids such as bis(trifluoromethylsulfonyl)imide, bis(perfluoroethylsulfonyl)imide, and bis(perfluorobutylsulfonyl)imide; methide acids such as tris(trifluoromethylsulfonyl)methide and tris(perfluoroethylsulfonyl)methide; sulfonates having fluorine substituted at α-position as represented by of the general formula (K-1) and sulfonates having fluorine substituted at α-position as represented by of the general formula (K-2).

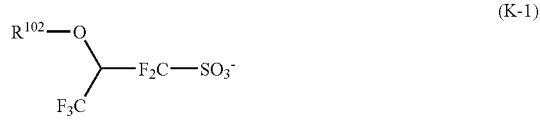

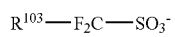

In formula (K-1), $R^{102}$ is a hydrogen atom, or a straight, branched or cyclic $C_1$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms. In formula (K-2), $R^{103}$ is a hydrogen atom, or a straight, branched or cyclic $C_1$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

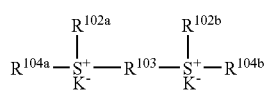

Herein, $R^{102a}$ and $R^{102b}$ independently represent straight, branched or cyclic $C_1$-$C_8$ alkyl groups. $R^{103}$ represents a straight, branched or cyclic $C_1$-$C_{10}$ alkylene group. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (Pla-1) and (Pla-2).

(ii) Diazomethane Derivatives of Formula (P2)

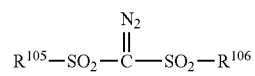

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

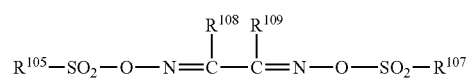

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a cyclic structure. $R^{108}$ and $R^{109}$ each are a straight or branched alkylene group of 1 to 6 carbon atoms when they form lo a cyclic structure. $R^{105}$ is as defined in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

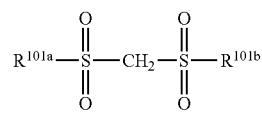

Herein, $R^{101a}$ and $R^{101b}$ are as defined above.

(v) Sulfonic Acid Esters of N-hydroxyimide Compounds of Formula (P5)

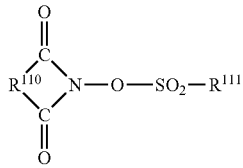

(P5)

Herein, $R^{110}$ is a $C_6$-$C_{10}$ arylene group, $C_1$-$C_6$ alkylene group, or $C_2$-$C_6$ alkenylene group wherein some or all of the hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all of the hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone derivatives and dicyclohexyl disulfone derivatives;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide1-propanesulfonate, N-hydroxysuccinimide2-propanesulfonate, N-hydroxysuccinimide1-pentanesulfonate, N-hydroxysuccinimide1-octanesulfonate, N-hydroxysuccinimide p-toluenesulfonate, N-hydroxysuccinimide p-methoxybenzenesulfonate, N-hydroxysuccinimide2-chloroethanesulfonate, N-hydroxysuccinimide benzenesulfonate, N-hydroxysuccinimide2,4,6-trimethylbenzenesulfonate, N-hydroxysuccinimide1-naphthalenesulfonate, N-hydroxysuccinimide2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane;

and sulfonic acid esters of N-hydroxyimide compounds such as N-hydroxysuccinimide methanesulfonate, N-hydroxysuccinimide trifluoromethanesulfonate, N-hydroxysuccinimide1-propanesulfonate, N-hydroxysuccinimide2-propanesulfonate, N-hydroxysuccinimide1-pentanesulfonate, N-hydroxysuccinimide p-toluenesulfonate, N-hydroxynaphthalimide methanesulfonate, and N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, and especially 0.5 to 40 parts by weight, per 100 parts by weight of the base resin. Less than 0.1 pbw of the acid generator may generate a less amount of acid upon exposure, sometimes leading to a poor sensitivity and resolution. More than 50 pbw of the acid generator may adversely affect the transmittance and resolution of resist. For example, where (Pla-1) and (Pla-2) are used in combination, they are preferably mixed such that the mixture consists of 1 pbw of (Pla-1) and 0.001 to 1 pbw of (Pla-2).

Dissolution Inhibitor

To the positive resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

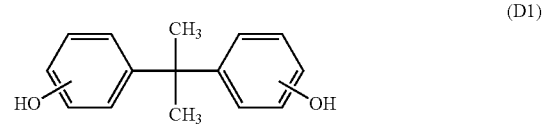

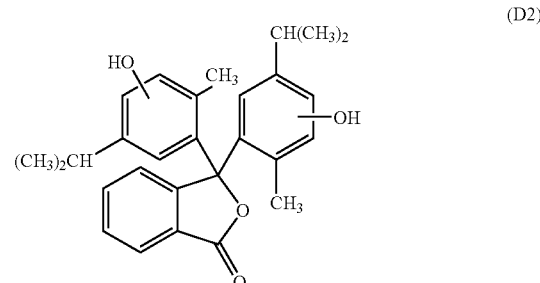

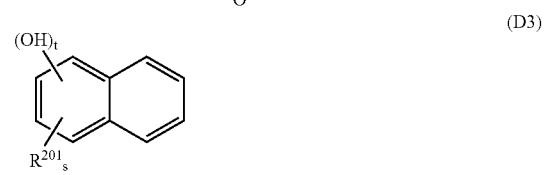

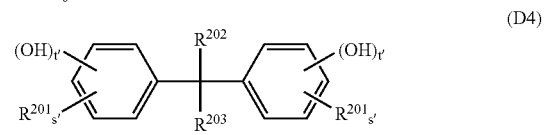

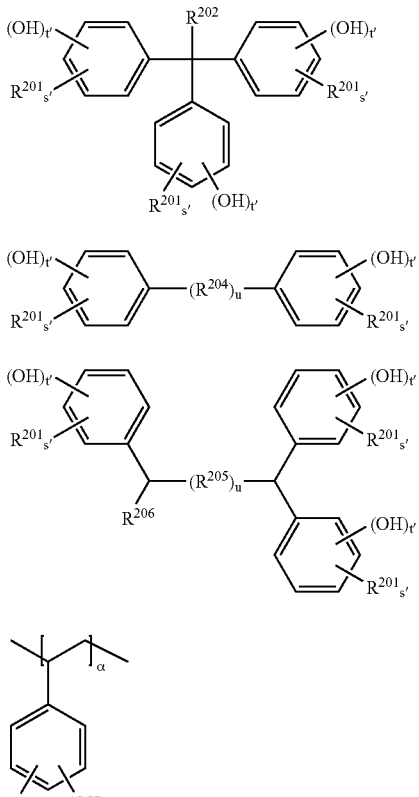

(D5)

(D6)

(D7)

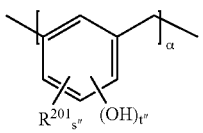
(D8)

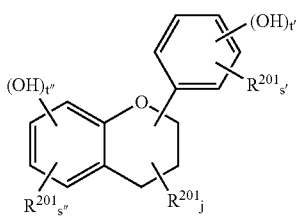
(D9)

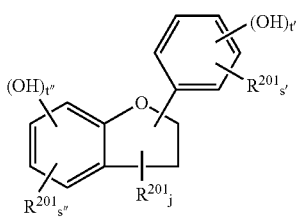
(D10)

(D11)

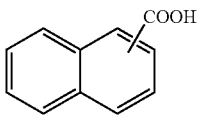
(D12)

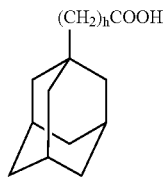
(D13)

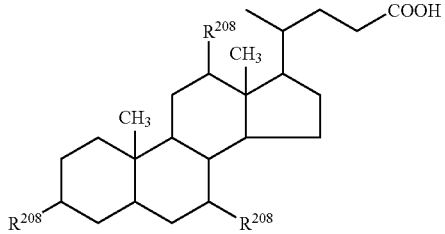
(D14)

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is, a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. An appropriate amount of the dissolution inhibitor is effective for improving resolution whereas more than 50 parts would lead to slimming of the patterned film, and thus a decline in resolution.

Basic Compound

The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \tag{B-1}$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X)-1 to (X)-3, and two or three X's may bond together to form a ring.

(X)-1

(X)-2

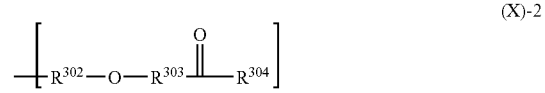

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)

ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are basic compounds having cyclic structure, represented by the following general formula (B)-2.

(B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl3-(1-pyrrolidinyl)propionate, methyl3-piperidinopropionate, methyl3-morpholinopropionate, methyl3-(thiomorpholino)propionate, methyl2-methyl-3-(1-pyrrolidinyl)propionate, ethyl3-morpholinopropionate, methoxycarbonylmethyl3-piperidinopropionate, 2-hydroxyethyl3-(1-pyrrolidinyl)propionate, 2-acetoxyethyl3-morpholinopropionate, 2-oxotetrahydrofuran-3-yl3-(1-pyrrolidinyl)propionate, tetrahydrofurfuryl3-morpholinopropionate, glycidyl3-piperidinopropionate, 2-methoxyethyl3-morpholinopropionate, 2-(2-methoxyethoxy)ethyl3-(1-pyrrolidinyl)propionate, butyl3-morpholinopropionate, cyclohexyl3-piperidinopropionate, α-(1-pyrrolidinyl)methyl-γ-butyrolactone, β-piperidino-γ-butyrolactone, β-morpholino-δ-valerolactone, methyl1-pyrrolidinylacetate, methyl piperidinoacetate, methyl morpholinoacetate, methyl thiomorpholinoacetate, ethyl1-pyrrolidinylacetate, and 2-methoxyethyl morpholinoacetate.

Also, basic compounds having cyano group, represented by the following general formulae (B)-3 to (B)-6 are useful.

(B)-3

(B)-4

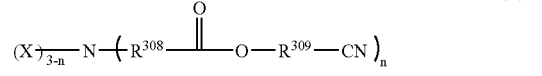

(B)-5

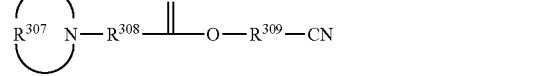

(B)-6

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropionitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropionitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl1-pyrrolidinepropionate, cyanomethyl1-piperidinepropionate, cyanomethyl4-morpholinepropionate, 2-cyanoethyl1-pyrrolidinepropionate, 2-cyanoethyl1-piperidinepropionate, and 2-cyanoethyl4-morpholinepropionate.

The basic compound is preferably formulated in an amount of 0.001 to 2 parts, and especially 0.01 to 1 part by weight, per 100 parts by weight of the base resin. Less than 0.001 part of the basic compound achieves no or little addition effect whereas more than 2 parts would result in too low a sensitivity.

Other Components

In the positive resist composition, a compound having a group $\equiv$C—COOH in the molecule may be blended. Exemplary, non-limiting compounds having a carboxyl group include one or more compounds selected from Groups I and II below. Including this compound improves the post-exposure delay (PED) stability of the resist and ameliorates edge roughness on nitride film substrates.

Group I:

Compounds of the general formulae (A1) to (A10) below in which some or all of the hydrogen atoms on the phenolic hydroxyl groups have been replaced by —$R^{401}$—COOH (wherein $R^{401}$ is a straight or branched alkylene of 1 to 10 carbon atoms), and in which the molar ratio C/(C+D) of phenolic hydroxyl groups (C) to $\equiv$C—COOH groups (D) in the molecule is from 0.1 to 1.0.

(A1)

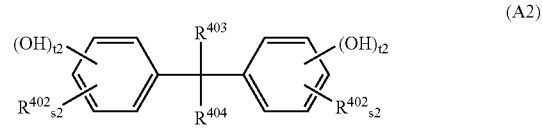

(A2)

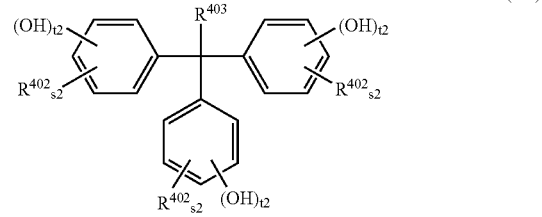

(A3)

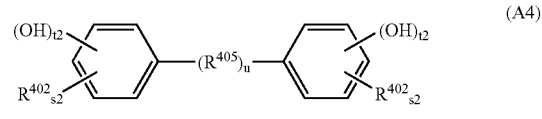

(A4)

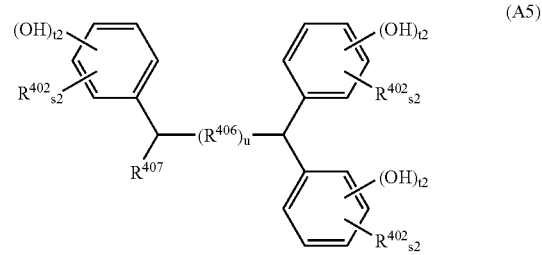

(A5)

(A6)

-continued

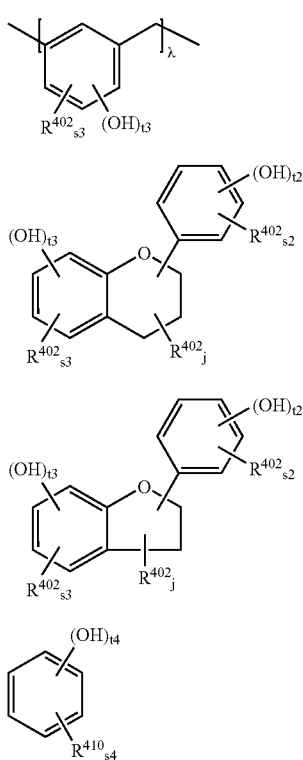

(A7)

(A8)

(A9)

(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkyl or alkenyl or a —$R^{411}$—COOH group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11) to (A15) below.

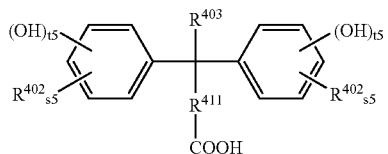

(A11)

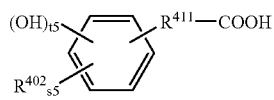

(A12)

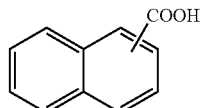

(A13)

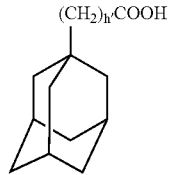

(A14)

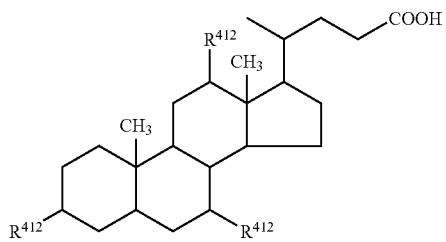

(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 or 1.

Illustrative, non-limiting examples of the compound having a carboxyl group include compounds of the general formulas AI-1 to AI-14 and AII-1 to AII-10 below.

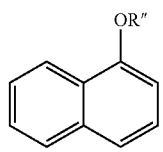

(AI-1)

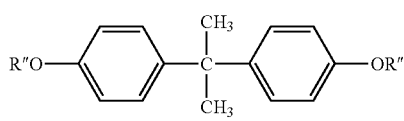

(AI-2)

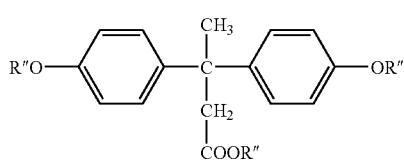

(AI-3)

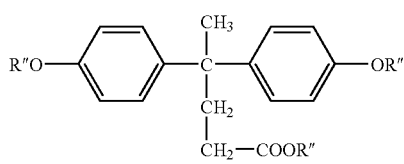

(AI-4)

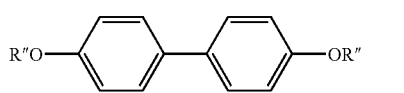

(AI-5)

-continued
(AI-6) 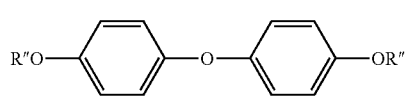
(AI-7) 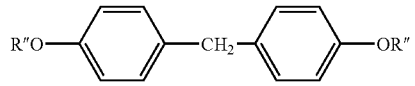
(AI-8) 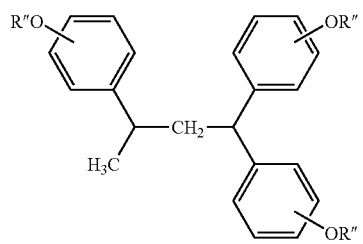
(AI-9) 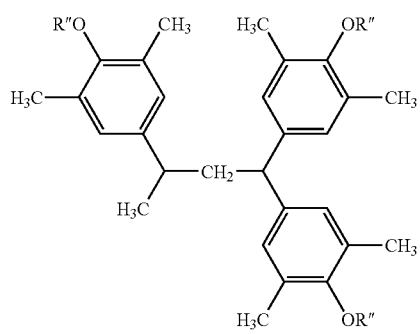
(AI-10) 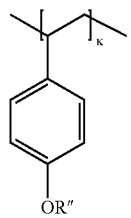
(AI-11) 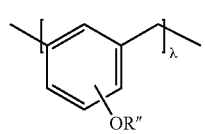
(AI-12) 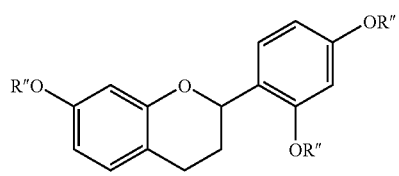
(AI-13) 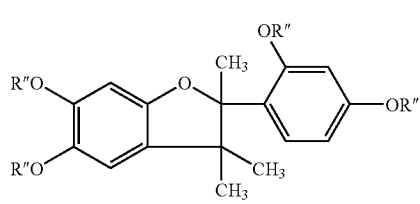
(AI-14) 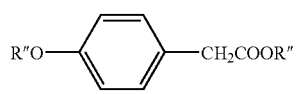
In the above formulas, R″ is hydrogen or a —CH$_2$COOH group such that the —CH$_2$COOH group accounts for 10 to 100 mol % of R″ in each compound, κ and λ are as defined above.
(AII-1) 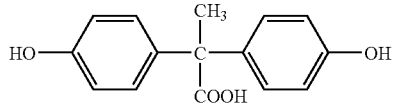
(AII-2) 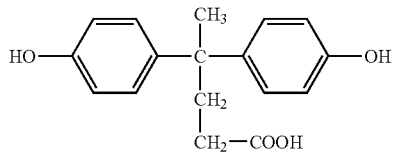
(AII-3) 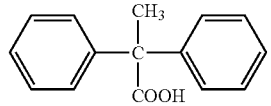
(AII-4) 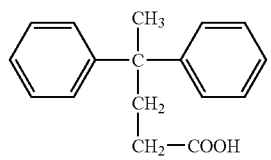
(AII-5) 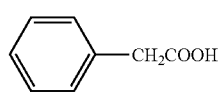
(AII-6) 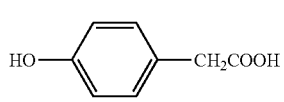
(AII-7) 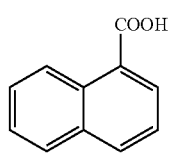
(AII-8) 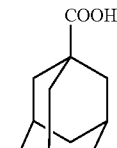
(AII-9) 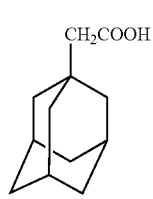

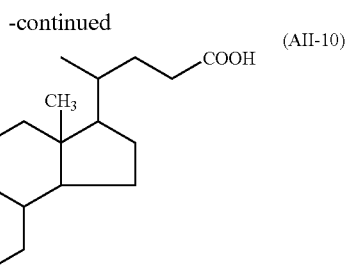
(AII-10)

The compound having a group ≡C—COOH is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The positive resist composition used in the pattern forming process of the invention may further include a surfactant which is commonly used for improving the coating characteristics. This is also true for the pattern surface coating composition.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC-430, FC-431 and FC-4430 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, FC-4430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

Process

Now, the double patterning process is described. FIGS. 1 to 3 illustrate prior art double patterning processes.

Referring to FIG. 1, one exemplary double patterning process 1 is illustrated. A photoresist film 30 is coated and formed on a processable substrate 20 on a substrate 10. To prevent the photoresist pattern from collapsing, the technology intends to reduce the thickness of photoresist film. One approach taken to compensate for a lowering of etch resistance of thinner film is to process the processable substrate using a hard mask. The double patterning process illustrated in FIG. 1 uses a multilayer coating in which a hard mask 40 is laid between the photoresist film 30 and the processable substrate 20 as shown in FIG. 1-A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON or p-Si, for example. The resist material used in double patterning process 1 is a positive resist composition. In the process, the resist film 30 is exposed and developed (FIG. 1-B), the hard mask 40 is then dry etched (FIG. 1-C), the photoresist film is stripped, and a second photoresist film 50 is coated, formed, exposed, and developed (FIG. 1-D). Then the processable substrate 20 is dry etched (FIG. 1-E). Since this etching is performed using the hard mask pattern and the second photoresist pattern as a mask, variations occur in the pattern size after etching of the processable substrate due to a difference in etch resistance between hard mask 40 and photoresist film 50.

To solve the above problem, a double patterning process 2 illustrated in FIG. 2 involves laying two layers of hard mask 41 and 42. The upper layer of hard mask 42 is processed using a first resist pattern, the lower layer of hard mask 41 is processed using a second resist pattern, and the processable substrate is dry etched using the two hard mask patterns. It is essential to establish a high etching selectivity between first hard mask 41 and second hard mask 42. Thus the process is rather complex.

FIG. 3 illustrates a double patterning process 3 using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a higher accuracy of alignment than the aforementioned line process because any alignment error can lead to line width anomalies.

The double patterning processes 1 to 3 described above have the drawback that two hard mask etchings are involved. Etching of the hard mask raises the problem that the hard mask changes its internal stress with a progress of etching, leading to misalignment, particularly at the wafer periphery.

FIG. 4 illustrates a double patterning process of the invention. As in FIG. 1-A, a first photoresist film 30 of positive resist composition is formed on a processable substrate 20 on a substrate 10 via a hard mask 40 (FIG. 4-A). The resist film 30 is then exposed and developed to form a first resist pattern (FIG. 4-B). A pattern surface coating composition 60 is coated thereon, and caused to crosslink and cure with the aid of acid and heat to form a crosslinked film or resist pattern protective film 60a (FIG. 4-C). Further, a second resist composition is coated thereon to form a second resist film 50 (FIG. 4-D), which is exposed and developed to form a pattern of second resist film 50 in the space area of the pattern of first resist film 30 (FIG. 4-E). Then the hard mask 40 is etched (FIG. 4-F). The processable substrate 20 is dry etched (FIG. 4-G), and finally, the first resist film 30 and second resist film 50 are removed.

Problems arise from the process of FIG. 4 in that the height of substrate level differs between the first pattern and the second pattern, and that the first pattern must have a large size. These require that the resist pattern protective film be as thin as possible. Too thin a resist pattern protective film may permit the first pattern to be dissolved in the solvent during coating of the second pattern or in the alkaline developer during development of the second pattern. It is thus requisite that the resist pattern protective film have a sufficient minimum thickness to prevent the solvent and developer from penetrating therethrough. For preventing penetration of the solvent and developer, it is necessary to form a film with a high crosslinked density. In this regard, the pattern surface coating composition used herein is so crosslinkable that the resulting protective film has a sufficient crosslinked density to prevent penetration of the solvent and developer even at a reduced thickness. Specifically, the resist pattern protective film has a thickness of up to 15 nm sufficient to minimize a dimensional change of the first pattern, more specifically up to 10 nm, and ideally up to 5 nm. As to the lower limit, the protective film specifically has a thickness of at least 1 nm, and more specifically at least 2 nm. Since the polymer used in the protective film need not be soluble in the alkaline developer, a polymer which is soluble in alcohol solvents and highly crosslinkable may be used so that the resist pattern protective film can be formed extremely thin.

Where an alkali-soluble polymer is used, the double patterning process shown in FIG. 5 is applicable. Only the features of the process of FIG. 5 which are different from FIG. 4 are described. The pattern surface coating composition 60 is coated to a thickness just enough to cover the first pattern 30. The structure is baked to induce crosslinking at the surface of first pattern 30 (FIG. 5-C). Utilizing the acid generated within first pattern 30 as a catalyst, the coating composition 60 forms a crosslinked film 60a around first pattern 30. Thereafter, the superfluous coating composition 60 is stripped off with a developer (FIG. 5-D). After stripping off, baking may be conducted in order to firmly crosslink the pattern surface. The pattern forming process of FIG. 5 has the advantage that the substrate level (or height) is the same for both the first and second patterns, because the pattern protective film on the substrate is stripped off with the developer before coating of the second resist composition. However, it has the drawback that since the degree of fog differs between grouped and isolated patterns, the crosslinked film corresponding to the grouped pattern has a greater thickness than the isolated pattern, due to a difference in acid concentration at the first resist pattern interface. Also, since the polymer must be alkali-soluble, the polymer as crosslinked has somewhat reduced alkali resistance, which in turn, requires to form the crosslinked film thicker. Since crosslinking takes place using as the catalyst the acid diffusing outward from the resist surface, no acid generator is admixed in the composition.

Figure 6A:
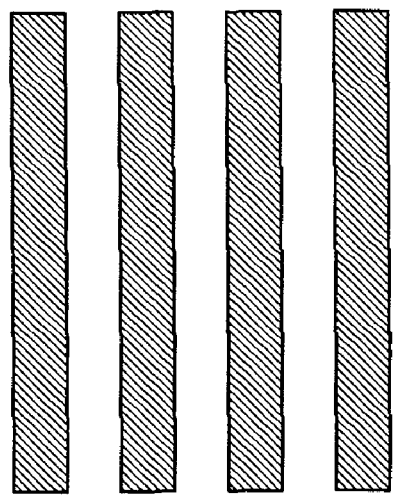
FIG. 6 is a plan view of an exemplary double patterning process in one embodiment of the invention, FIG. 6-A showing a first pattern being formed, and FIG. 6-B showing a second pattern being formed so as to cross the first pattern.
Figure 6B:
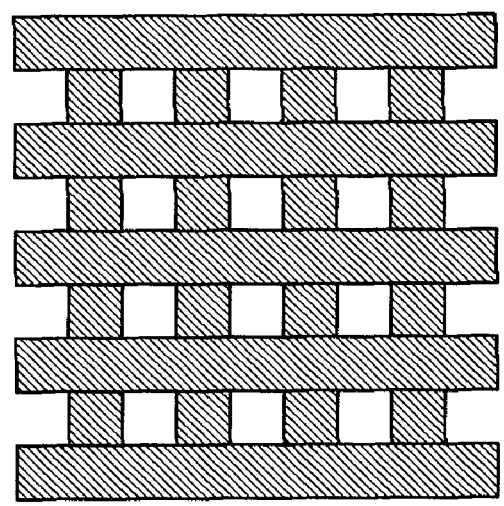
Figure 7A:
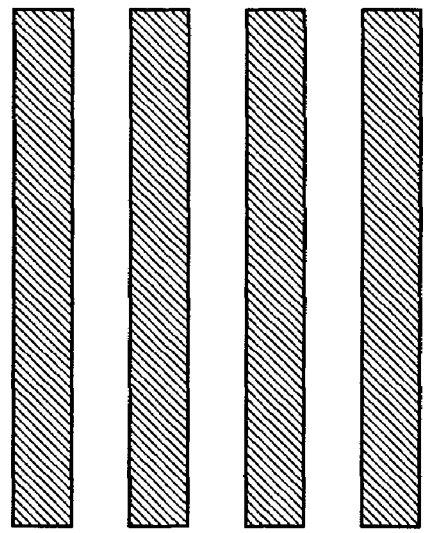
FIG. 7 is a plan view of an exemplary double patterning process in another embodiment of the invention, FIG. 7-A showing a first pattern being formed, and FIG. 7-B showing a second pattern being formed separately from the first pattern.
Figure 7B:
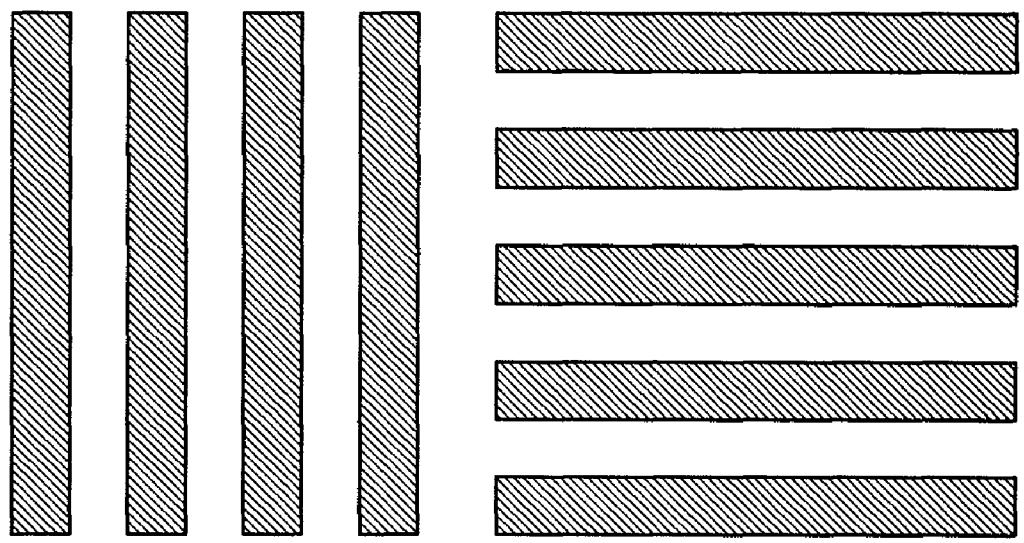

Although the process illustrated in FIGS. 4 and 5 forms the second pattern between lines of the first pattern, it is also acceptable to form the second pattern so as to cross the first pattern orthogonally as shown in FIG. 6. Although such a pattern may be formed through a single exposure step, an orthogonal line pattern may be formed at a very high contrast by a combination of dipolar illumination with polarized illumination. Specifically, pattern lines in Y direction are formed as shown in FIG. 6-A and then protected from dissolution by the process of the invention. Thereafter, a second resist is coated and processed to form pattern lines in X direction as shown in FIG. 6-B. Combining X and Y lines defines a grid pattern while empty areas become holes. The pattern that can be formed by such a process is not limited to the orthogonal pattern, and may include a T-shaped pattern (not shown) or a separated pattern as shown in FIG. 7-B.

The substrate 10 used herein is generally a silicon substrate. The processable substrate 20 used herein includes $SiO_2$, SiN, SiON, SiOC, p-Si, $\alpha$-Si, TiN, WSi, BPSG, SOG, Cr, CrO, CrON, MoSi, low dielectric film, and etch stopper film. The hard mask 40 is as described above.

In the process of the invention, a first resist film of positive resist material is formed on the processable substrate directly or via the intermediate intervening layer. The first resist film preferably has a thickness of 10 to 1,000 nm, and more preferably 20 to 500 nm. The resist film is heated or pre-baked prior to exposure, with the preferred pre-baking conditions including a temperature of 50 to 180° C., especially 60 to 150° C. and a time of 10 to 300 seconds, especially 15 to 200 seconds.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-out from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 3 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate.

On the first resist pattern as developed, the pattern surface coating composition according to the invention is coated. After coating, it is baked at 50 to 250° C. for 5 to 300 seconds for evaporating off the solvent and inducing crosslinkage and cure. A film which is insoluble in the resist solvent and developer is thus formed on the first resist pattern. The pattern surface coating film specifically has a thickness of 1 to 300 nm, and more specifically 1.5 to 150 nm. When a thermal acid generator in the form of an ammonium salt has been added to the pattern surface coating composition, an acid may be generated by heating, to promote crosslinking reaction.

When an alkali-soluble pattern surface coating composition is used, the coating composition is applied and baked. Then the superfluous coating composition is dissolved by alkali development. Thereafter, the pattern surface coating film on the surface of the resist film is more firmly crosslinked by baking.

Next, a second positive resist composition is coated on the pattern-bearing substrate which has been covered with a crosslinked film (or protective film) of the pattern surface coating composition. Preferably both the first and second resist compositions are of the positive working type. Also preferably they have equivalent lithographic performance although the acid labile groups, adhesive groups, acid generators, and solvents used therein need not necessarily be identical.

Preferably the second resist film is exposed and developed in a conventional way to form a pattern of second resist film in the space area of the pattern of first resist film, for thereby reducing the distance between patterns to one half. The conditions of exposure and development of the second resist film may be the same as the previous conditions.

Next, using the first and second resist films (including the crosslinked film) as a mask, the intermediate intervening layer of hard mask or the like is etched, and the processable substrate further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the first resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, PAG for photoacid generator, and TAG for thermal acid generator. For all polymers, Mw and Mn are determined by GPC versus polystyrene standards.

Synthesis Examples

Polymers (Polymers 1 to 17 and Comparative Polymer 1) for use in resist surface coating compositions were prepared by combining various monomers, effecting copolymerization reaction in tetrahydrofuran medium, crystallization in hexane, and drying. The polymers had the composition shown below. The composition of each polymer was analyzed by $^1$H-NMR, and the Mw and Mw/Mn determined by GPC.

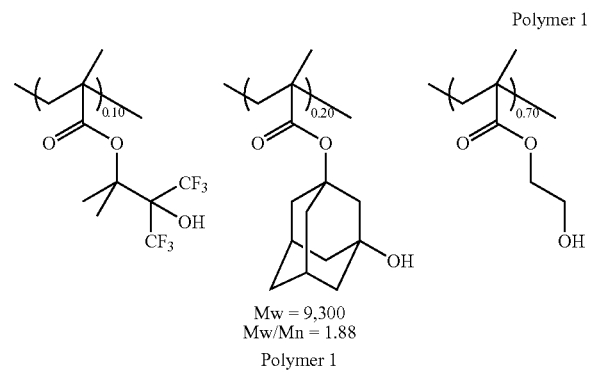

Mw = 9,300
Mw/Mn = 1.88
Polymer 1

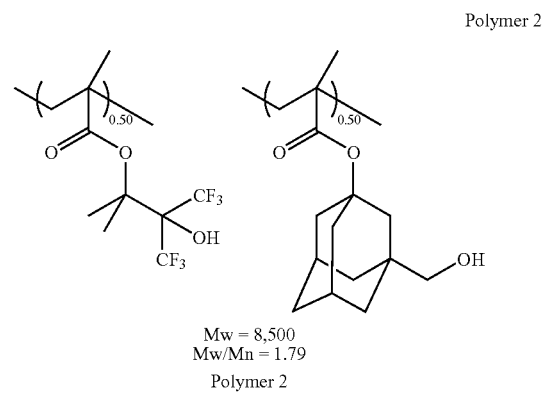

Mw = 8,500
Mw/Mn = 1.79
Polymer 2

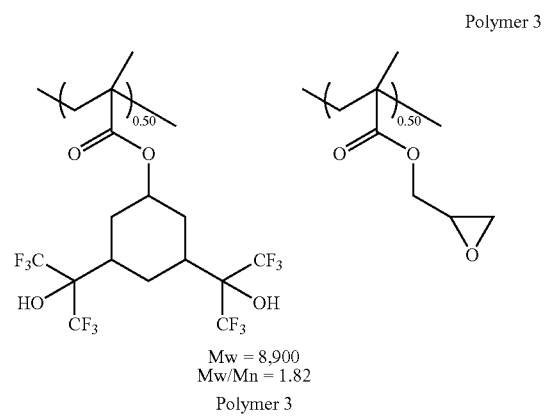

Mw = 8,900
Mw/Mn = 1.82
Polymer 3

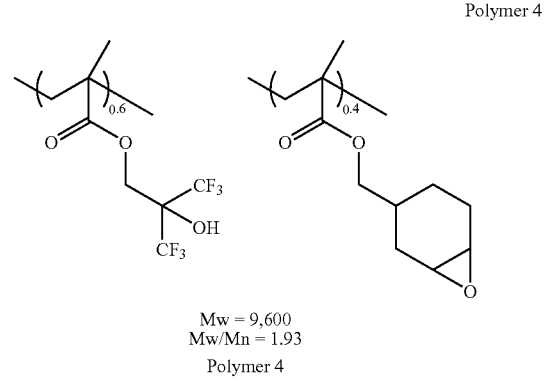

Mw = 9,600
Mw/Mn = 1.93
Polymer 4

Polymer 5
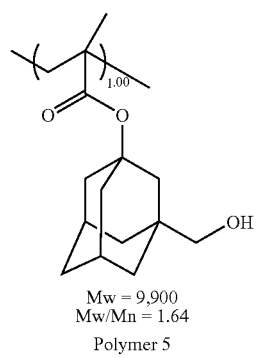
Mw = 9,900
Mw/Mn = 1.64
Polymer 5
Polymer 6
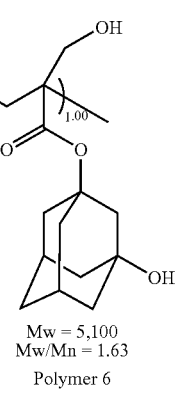
Mw = 5,100
Mw/Mn = 1.63
Polymer 6
Polymer 7
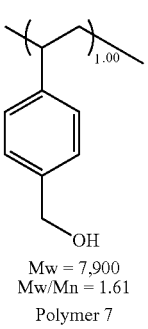
Mw = 7,900
Mw/Mn = 1.61
Polymer 7
Polymer 8
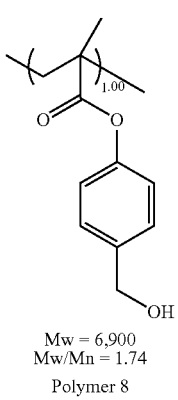
Mw = 6,900
Mw/Mn = 1.74
Polymer 8
Polymer 9
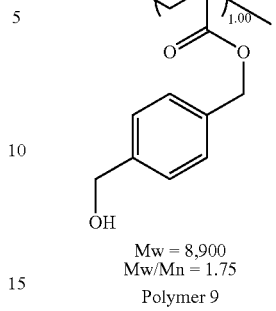
Mw = 8,900
Mw/Mn = 1.75
Polymer 9
Polymer 10
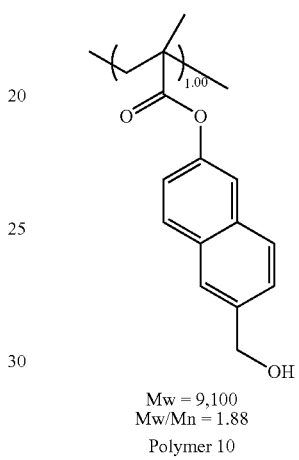
Mw = 9,100
Mw/Mn = 1.88
Polymer 10
Polymer 11
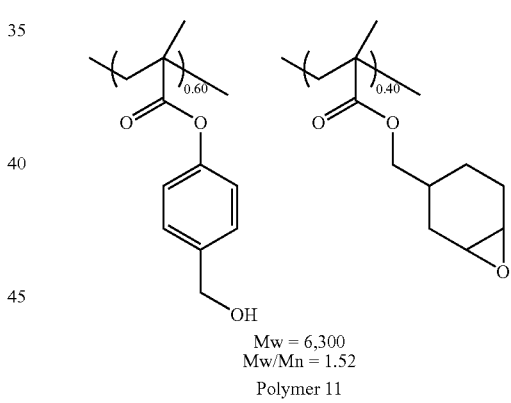
Mw = 6,300
Mw/Mn = 1.52
Polymer 11
Polymer 12
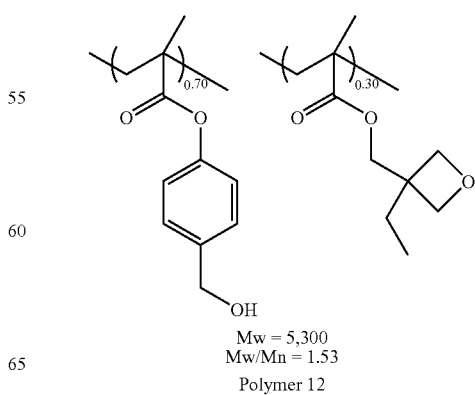
Mw = 5,300
Mw/Mn = 1.53
Polymer 12

-continued
Polymer 13
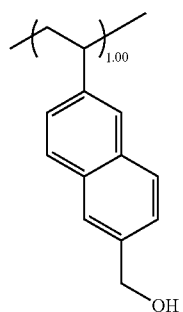
Mw = 6,200
Mw/Mn = 1.61
Polymer 13
Polymer 14
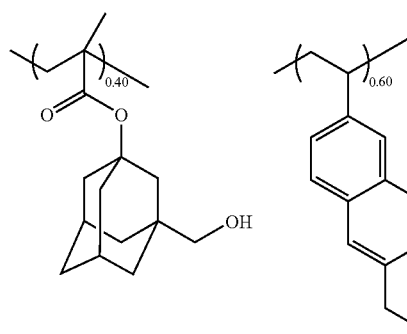
Mw = 7,300
Mw/Mn = 1.82
Polymer 14
Polymer 15
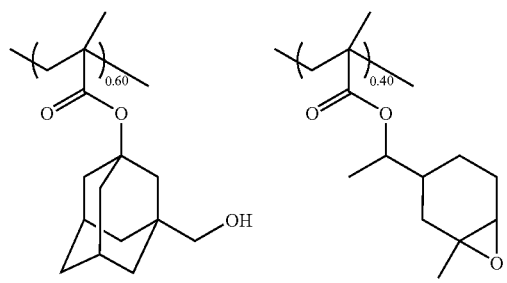
Mw = 6,300
Mw/Mn = 1.52
Polymer 15
Polymer 16
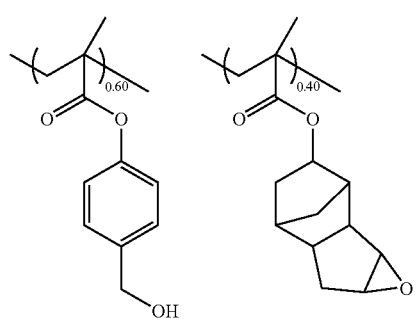
Mw = 8,800
Mw/Mn = 1.94
Polymer 16
Polymer 17
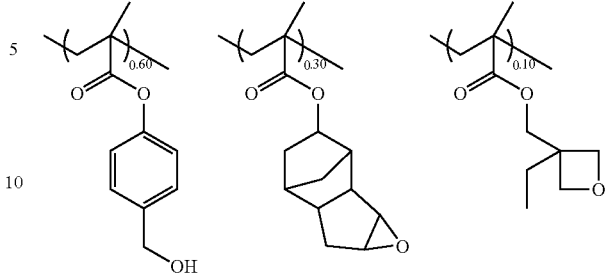
Mw = 8,600
Mw/Mn = 1.86
Polymer 17
Polymer 18
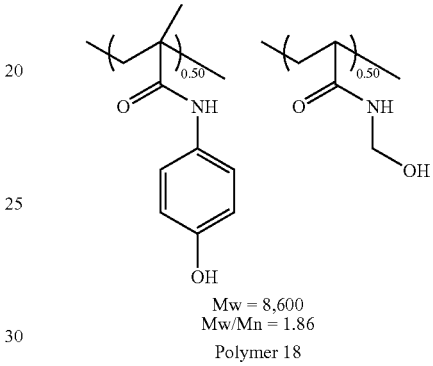
Mw = 8,600
Mw/Mn = 1.86
Polymer 18
Polymer 19
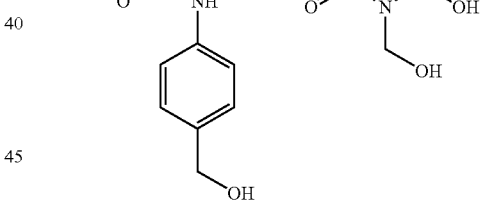
Mw = 8,500
Mw/Mn = 1.86
Polymer 19
Polymer 20
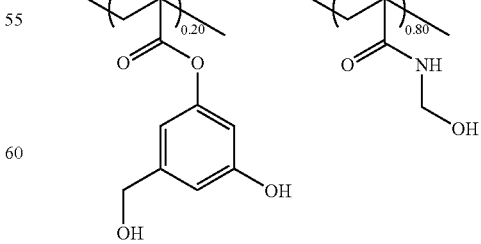
Mw = 8,300
Mw/Mn = 1.82
Polymer 20

Comparative Polymer 1

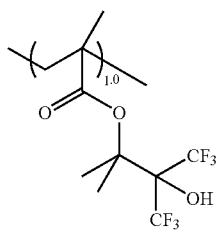

Mw = 8,400
Mw/Mn = 1.76
Comparative Polymer 1

Examples 1 to 39 and Comparative Example 1

Crosslinking Test on Polymers

The above-synthesized polymers (Polymers 1 to 20 and Comparative Polymer 1) were examined for thermal crosslinking in the presence of acid catalyst. A solution was prepared by mixing each polymer, a thermal acid generator, an optional crosslinker, and an organic solvent in accordance with the recipe shown in Tables 2 and 3, and filtering through a Teflon® filter with a pore size of 0.2 μm.

The components in Tables 2 and 3 are identified below.

Acid Generator: TAG1 to TAG6 of the Following Structural Formulae

TAG 1

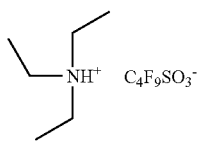

TAG 2

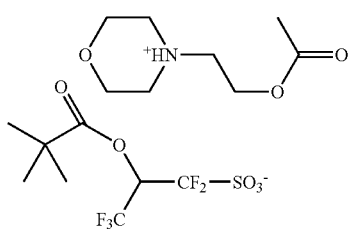

TAG 3

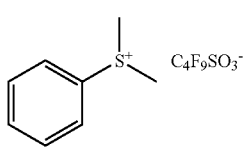

TAG 4

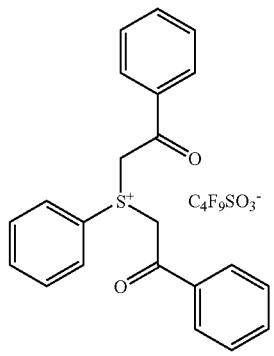

TAG 5

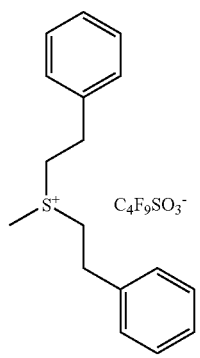

TAG 6

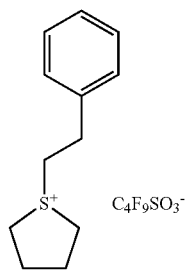

Crosslinker: CR1 to CR10 of the Following Structural Formulae

CR 1

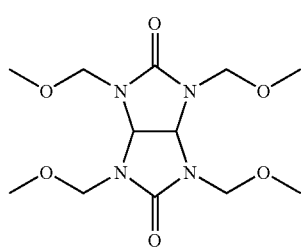

-continued

CR 2

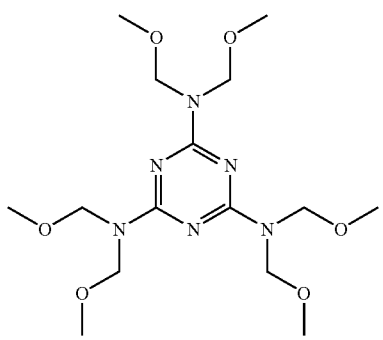

CR 3

CR 4

CR 5

CR 6

CR 7

-continued

CR 8

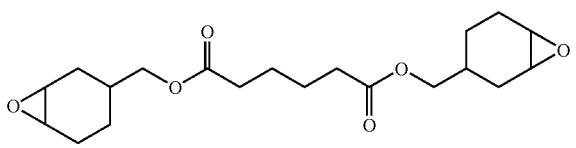

CR 9

CR 10

Organic Solvent: see Tables 2 and 3

Alkali Solubility of Polymers

A solution was prepared by dissolving 1 g of each of Polymers 1 to 20 and Comparative Polymer 1 obtained in Synthesis Examples in 25 g of isobutyl alcohol and filtering through a polypropylene filter with a pore size of 0.2 μm. The solution was coated on a 8-inch wafer and baked at 110° C. for 60 seconds to form a film of about 100 nm thick. The polymer film was developed with an aqueous solution of 2.38 wt % tetramethylammonium hydroxide (TMAH) for 30 seconds. A difference in film thickness before and after development was computed. Notably, a negative value of thickness reduction means that the film after development has a greater thickness than before development. The results shown in Table 1.

TABLE 1

| Polymer | Thickness reduction after development (nm) |
|---|---|
| Polymer 1 | 100 (remaining after development 0 nm) |
| Polymer 2 | 100 (remaining after development 0 nm) |
| Polymer 3 | 100 (remaining after development 0 nm) |
| Polymer 4 | 100 (remaining after development 0 nm) |
| Polymer 5 | −0.5 |
| Polymer 6 | −0.2 |
| Polymer 7 | 0.8 |
| Polymer 8 | 1.5 |
| Polymer 9 | 2.2 |
| Polymer 10 | 1.1 |
| Polymer 11 | 0.8 |
| Polymer 12 | 0.7 |
| Polymer 13 | 1.3 |
| Polymer 14 | 1.2 |
| Polymer 15 | 1.0 |
| Polymer 16 | 1.3 |
| Polymer 17 | 1.0 |
| Polymer 18 | 100 (remaining after development 0 nm) |
| Polymer 19 | 100 (remaining after development 0 nm) |
| Polymer 20 | 100 (remaining after development 0 nm) |
| Comparative Polymer 1 | 100 (remaining after development 0 nm) |

As seen from the results of Table 1, Polymers 1 to 4 and 18 to 20 and Comparative Polymer 1 are alkali soluble while the other polymers are alkali insoluble.

Each of the pattern surface coating composition solutions shown in Tables 2 and 3 was coated onto a 8-inch silicon substrate and baked at 160° C. for 60 seconds to form a pattern protective film of 8 nm thick as measured by an optical film thickness gauge. A solvent mixture of propylene glycol monomethyl ether acetate (PGMEA) and cyclohexanone in a weight ratio of 70/30 was dispensed for 20 seconds on the polymer film, which was spin dried at 2,000 rpm for 30 seconds and dried at 100° C. for 60 seconds. The film thickness was measured again, from which a difference in film thickness before and after solvent application was computed. In a slimming test by development, the polymer film was developed with an aqueous solution of 2.38 wt % tetramethylammonium hydroxide (TMAH) for 30 seconds, and a difference in film thickness before and after development was computed. Notably, a negative value of thickness reduction means that the film after development has a greater thickness than before development. The results are shown in Tables 2 and 3.

TABLE 2

| | | Polymer (pbw) | TAG (pbw) | Crosslinker (pbw) | Organic solvent (pbw) | Thickness reduction after solvent application (nm) | Thickness reduction after development (nm) |
|---|---|---|---|---|---|---|---|
| Example 1 | Pattern protective film 1 | Polymer 1 (100) | TAG1 (4.0) | CR 1 (15.0) | isobutyl alcohol (70,000) | 0.4 | −0.3 |
| Example 2 | Pattern protective film 2 | Polymer 2 (100) | TAG1 (4.0) | CR 1 (15.0) | isobutyl alcohol (70,000) | 0.7 | −0.2 |
| Example 3 | Pattern protective film 3 | Polymer 3 (100) | TAG1 (4.0) | — | isobutyl alcohol (70,000) | 1.1 | 0 |
| Example 4 | Pattern protective film 4 | Polymer 4 (100) | TAG1 (4.0) | — | isobutyl alcohol (70,000) | 0.8 | 0 |
| Example 5 | Pattern protective film 5 | Polymer 5 (100) | TAG1 (4.0) | CR 1 (15.0) | isobutyl alcohol (70,000) | 0.1 | −0.2 |
| Example 6 | Pattern protective film 6 | Polymer 6 (100) | TAG4 (4.0) | CR 1 (15.0) | isobutyl alcohol (70,000) | 0.3 | −0.2 |
| Example 7 | Pattern protective film 7 | Polymer 7 (100) | TAG1 (4.0) | — | isobutyl alcohol (70,000) | 0.2 | −0.1 |
| Example 8 | Pattern protective film 8 | Polymer 8 (100) | TAG1 (4.0) | — | isobutyl alcohol (70,000) | 0.6 | 0 |
| Example 9 | Pattern protective film 9 | Polymer 9 (100) | TAG1 (4.0) | — | isobutyl alcohol (70,000) | 0.3 | 0 |
| Example 10 | Pattern protective film 10 | Polymer 10 (100) | TAG1 (4.0) | — | isobutyl alcohol (70,000) | 0.5 | −0.3 |
| Example 11 | Pattern protective film 11 | Polymer 11 (100) | TAG1 (4.0) | — | isobutyl alcohol (70,000) | 0.6 | −0.4 |
| Example 12 | Pattern protective film 12 | Polymer 12 (100) | TAG1 (4.0) | — | isobutyl alcohol (70,000) | 0.4 | −0.6 |
| Example 13 | Pattern protective film 13 | Polymer 13 (100) | TAG1 (4.0) | — | t-butyl alcohol (20,000) isobutyl alcohol (50,000) | 0.2 | −0.2 |
| Example 14 | Pattern protective film 14 | Polymer 1 (100) | TAG2 (4.0) | CR 1 (10.0) | isobutyl alcohol (70,000) | 0.3 | −0.3 |
| Example 15 | Pattern protective film 15 | Polymer 1 (100) | TAG1 (4.0) | — | 4-methyl-2-pentanol (70,000) | 0.3 | −0.3 |
| Example 16 | Pattern protective film 16 | Polymer 1 (100) | TAG1 (4.0) | — | 2-heptanol (70,000) | 0.2 | −0.3 |
| Example 17 | Pattern protective film 17 | Polymer 11 (100) | TAG3 (4.0) | — | 2-methyl-1-butanol (70,000) | 0.2 | −0.1 |
| Example 18 | Pattern protective film 18 | Polymer 15 (100) | TAG1 (4.0) | — | 3-methyl-1-butanol (70,000) | 0.2 | −0.1 |
| Example 19 | Pattern protective film 19 | Polymer 16 (100) | TAG1 (4.0) | — | isobutyl alcohol (70,000) | 0.2 | −0.1 |
| Example 20 | Pattern protective film 20 | Polymar 16 (100) | TAG4 (4.0) | CR 1 (20.0) | isobutyl alcohol (70,000) | 0.2 | −0.1 |

TABLE 3

| | | Polymer (pbw) | TAG (pbw) | Crosslinker (pbw) | Organic solvent (pbw) | Thickness reduction after solvent application (nm) | Thickness reduction after development (nm) |
|---|---|---|---|---|---|---|---|
| Example 21 | Pattern protective film 21 | Polymer 16 (100) | TAG1 (4.0) | CR 2 (10.0) | isobutyl alcohol (70,000) | 0.2 | −0.1 |
| Example 22 | Pattern protective film 22 | Polymer 16 (100) | TAG1 (4.0) | CR 3 (10.0) | isobutyl alcohol (70,000) | 0.2 | −0.1 |
| Example 23 | Pattern protective film 23 | Polymer 16 (100) | TAG1 (4.0) | CR 4 (10.0) | isobutyl alcohol (70,000) | 0.2 | −0.1 |
| Example 24 | Pattern protective film 24 | Polymer 16 (100) | TAG1 (4.0) | CR 5 (10.0) | isobutyl alcohol (70,000) | 0.1 | 0 |

TABLE 3-continued

|  |  | Polymer (pbw) | TAG (pbw) | Crosslinker (pbw) | Organic solvent (pbw) | Thickness reduction after solvent application (nm) | Thickness reduction after development (nm) |
|---|---|---|---|---|---|---|---|
| Example 25 | Pattern protective film 25 | Polymer 16 (100) | TAG1 (4.0) | CR 4 (10.0) CR 5 (5.0) | isobutyl alcohol (70,000) | 0.1 | 0 |
| Example 26 | Pattern protective film 26 | Polymer 17 (100) | TAG1 (4.0) | — | isobutyl alcohol (70,000) | 0.2 | −0.1 |
| Example 27 | Pattern protective film 27 | Polymer 17 (100) | TAG5 (4.0) | — | isobutyl alcohol (70,000) | 0.2 | −0.1 |
| Example 28 | Pattern protective film 28 | Polymer 17 (100) | TAG6 (4.0) | CR 2 (5.0) | isobutyl alcohol (70,000) | 0.2 | −0.1 |
| Example 29 | Pattern protective film 29 | Polymer 18 (100) | TAG6 (4.0) | — | isobutyl alcohol (70,000) | 0.2 | −0.1 |
| Example 30 | Pattern protective film 30 | Polymer 19 (100) | TAG6 (4.0) | — | isobutyl alcohol (70,000) | 0.2 | −0.1 |
| Example 31 | Pattern protective film 31 | Polymer 20 (100) | TAG6 (4.0) | — | isobutyl alcohol (70,000) | 0.2 | −0.1 |
| Example 32 | Pattern protective film 32 | Polymer 20 (100) | TAG6 (4.0) | CR 3 (5.0) | isobutyl alcohol (70,000) | 0.2 | −0.1 |
| Example 33 | Pattern protective film 33 | Polymer 20 (100) | TAG6 (4.0) | CR 4 (5.0) | isobutyl alcohol (70,000) | 0.2 | −0.1 |
| Example 34 | Pattern protective film 34 | Polymer 20 (100) | TAG6 (4.0) | CR 5 (5.0) | isobutyl alcohol (70,000) | 0.1 | −0.1 |
| Example 35 | Pattern protective film 35 | Polymer 20 (100) | TAG6 (4.0) | CR 6 (5.0) | isobutyl alcohol (70,000) | 0.2 | −0.1 |
| Example 36 | Pattern protective film 36 | Polymer 20 (100) | TAG6 (4.0) | CR 7 (5.0) | isobutyl alcohol (70,000) | 0.2 | −0.1 |
| Example 37 | Pattern protective film 37 | Polymer 20 (100) | TAG6 (4.0) | CR 8 (5.0) | isobutyl alcohol (70,000) | 0.2 | −0.1 |
| Example 38 | Pattern protective film 38 | Polymer 20 (100) | TAG6 (4.0) | CR 9 (5.0) | isobutyl alcohol (70,000) | 0.1 | −0.1 |
| Example 39 | Pattern protective film 39 | Polymer 20 (100) | TAG6 (4.0) | CR 10 (5.0) | isobutyl alcohol (70,000) | 0.3 | −0.2 |
| Comparative Example 1 | — | Comparative polymer 1 (100) | TAG1 (4.0) | CR 1 (15.0) | isobutyl alcohol (70,000) | 5 | 5 |

As seen from the data in Tables 2 and 3, a film which is insoluble in the solvent and developer is formed when a pattern surface coating composition comprising a hydroxyl-containing base polymer, a thermal acid generator and optionally a crosslinker in $C_3$-$C_8$ alcohol is coated and baked at 160° C. This demonstrates a progress of crosslinking with the aid of acid and heat. The polymer labeled as Comparative Example 1 leaves no film after solvent application and after development, indicating that the polymer is dissolved away.

Preparation of Positive Resist Composition

A resist solution was prepared by dissolving each of the polymers shown below (Resist Polymers 1 to 5) and other components in a solvent in accordance with the recipe shown in Table 4, and filtering through a filter with a pore size of 0.2 μm.

Resist Polymer 1

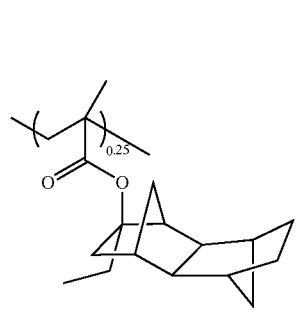

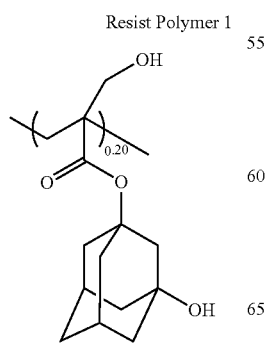

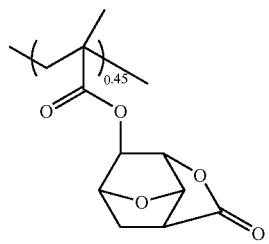

-continued

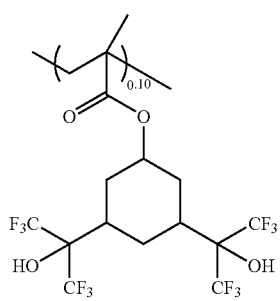

Resist Polymer 2
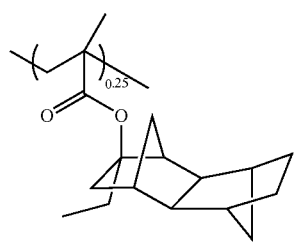
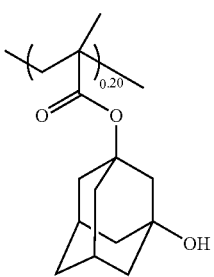
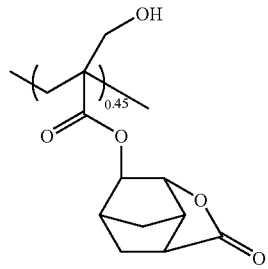
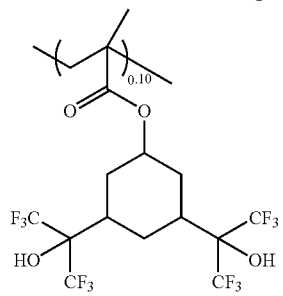
Resist Polymer 3
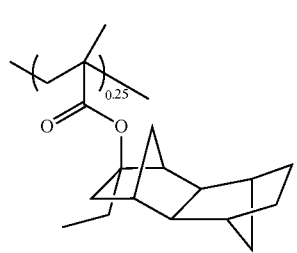
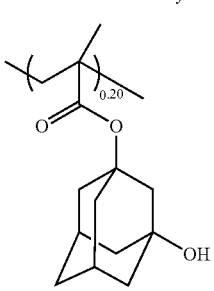
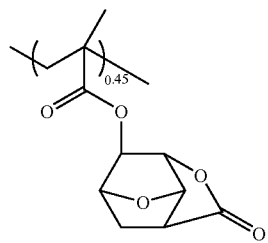
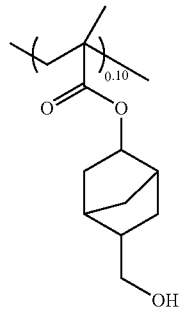
Resist Polymer 4
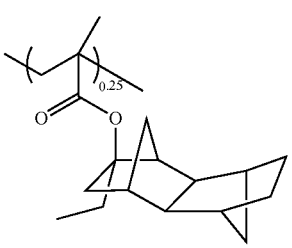
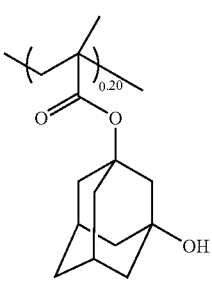
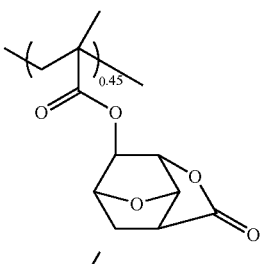
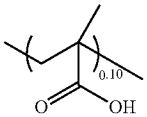
Resist Polymer 5
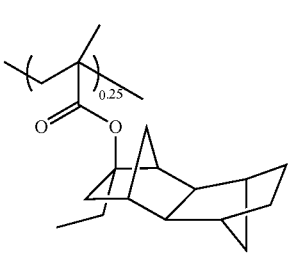
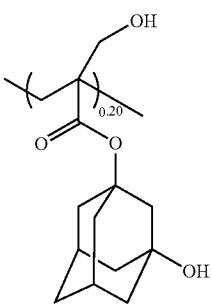
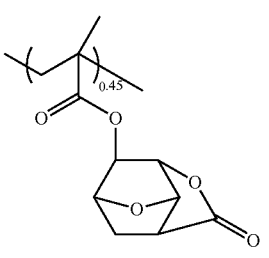
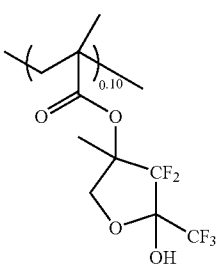

The components in Table 5 are identified below.

Acid Generator: PAG1 of the Following Structural Formula

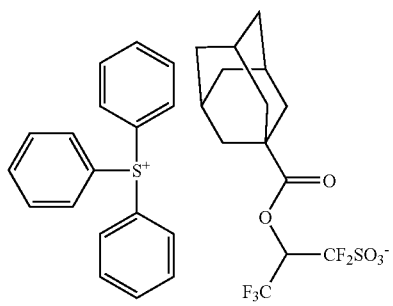

PAG 1

Basic Compound: Quencher 1 of the Following Structural Formula

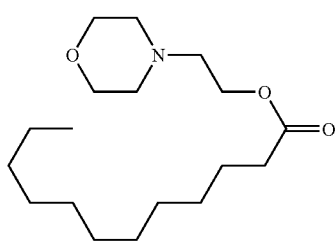

Quencher 1

Organic Solvent: Propylene Glycol Monomethyl Ether Acetate (PGMEA)

TABLE 4

| | Polymer (pbw) | PAG (pbw) | Crosslinker (pbw) | Organic solvent (pbw) |
|---|---|---|---|---|
| Resist 1 | Resist Polymer 1 (100) | PAG 1 (14.0) | Quencher 1 (1.20) | PGMEA (2,000) |
| Resist 2 | Resist Polymer 2 (100) | PAG 1 (14.0) | Quencher 1 (1.20) | PGMEA (2,000) |
| Resist 3 | Resist Polymer 3 (100) | PAG 1 (14.0) | Quencher 1 (1.20) | PGMEA (2,000) |
| Resist 4 | Resist Polymer 4 (100) | PAG 1 (14.0) | Quencher 1 (1.20) | PGMEA (2,000) |
| Resist 5 | Resist Polymer 5 (100) | PAG 1 (14.0) | Quencher 1 (1.20) | PGMEA (2,000) |

TABLE 5

| | Polymer (pbw) | Organic solvent (pbw) |
|---|---|---|
| TC1 | Topcoat Polymer* (100) | diisoamyl ether (2,700) + 2-methyl-1-butanol (270) |

*Topcoat Polymer
Mw = 8,800
Mw/Mn = 1.69

Topcoat Polymer

Examples 40 to 83 and Comparative Examples 2, 3

Double Patterning Test I

On a substrate (silicon wafer) having an antireflective coating (ARC-29A, Nissan Chemical Industries, Ltd.) of 80 nm thick, each of the resist compositions shown in Table 4 was spin coated, then baked on a hot plate at 100° C. for 60 seconds to form a resist film of 100 nm thick. A topcoat solution of the composition shown in Table 5 was coated thereon and baked at 90° C. for 60 seconds to form a topcoat of 50 nm thick. Using an ArF excimer laser scanner model NSR-S610C (Nikon Corp., NA 1.30, σ 0.98/0.78, 35° dipole/normal illumination, 6% halftone phase shift mask) with s-polarized illumination, the coated substrate was exposed to radiation through a line-and-space pattern mask including Y-direction lines of 90 nm at a pitch of 180 nm and in a dose greater than the optimum dose to provide a 1:1 line-and-space. Immediately after exposure, the resist film was baked (PEB) at 100° C. for 60 seconds and then developed for 30 seconds with a 2.38 wt % TMAH aqueous solution, obtaining a first resist pattern including lines of 45 nm at a pitch of 180 nm.

On the first pattern, each of the pattern surface coating compositions of Examples 1-39 and Comparative Example 1 shown in Tables 2 and 3 was coated and baked to form a pattern protective film of 8 nm thick on the first resist pattern. Next, the same resist composition and the same topcoat composition as above were coated and baked to form a second resist film on the first resist pattern. Using an ArF excimer laser scanner model NSR-S610C (Nikon Corp., NA 1.30, σ 0.98/0.78, 350 dipole/normal illumination, 6% halftone phase shift mask) with s-polarized illumination, the second resist film was exposed to radiation through a line-and-space pattern mask including Y-direction lines of 90 nm at a pitch of 180 nm, in a dose greater than the optimum dose to provide a 1:1 line-and-space and at a position shifted 45 nm in X direction from the first pattern. Immediately after exposure, the resist film was baked (PEB) at 100° C. for 60 seconds and then developed for 30 seconds with a 2.38 wt % TMAH aqueous solution, obtaining a second resist pattern including lines of 45 nm at a pitch of 180 nm in spaces of the first pattern. The conditions under which the pattern protective film was baked after coating included 170° C./60 seconds in Examples 41-83 and Comparative Examples 2-3, and 150° C./60 seconds in Example 40. The line width of the first and second patterns was measured by a measuring SEM S-9380 (Hitachi, Ltd.). The results are shown in Table 6.

developed for 30 seconds with a 2.38 wt % TMAH aqueous solution, obtaining a first 1:1 line-and-space pattern with a size of 45 nm.

TABLE 6

| | Resist Composition | Protective film composition | Size of 1st pattern after 2nd pattern formation | Size of 2nd pattern |
|---|---|---|---|---|
| Example 40 | Resist 1 | Protective Film 1 | 58 nm | 45 nm |
| Example 41 | Resist 1 | Protective Film 2 | 51 nm | 45 nm |
| Example 42 | Resist 1 | Protective Film 3 | 46 nm | 45 nm |
| Example 43 | Resist 1 | Protective Film 4 | 50 nm | 45 nm |
| Example 44 | Resist 1 | Protective Film 5 | 50 nm | 45 nm |
| Example 45 | Resist 1 | Protective Film 6 | 50 nm | 45 nm |
| Example 46 | Resist 1 | Protective Film 6 | 46 nm | 45 nm |
| Example 47 | Resist 1 | Protective Film 7 | 52 nm | 45 nm |
| Example 48 | Resist 1 | Protective Film 8 | 44 nm | 45 nm |
| Example 49 | Resist 1 | Protective Film 9 | 48 nm | 46 nm |
| Example 50 | Resist 1 | Protective Film 10 | 49 nm | 45 nm |
| Example 51 | Resist 1 | Protective Film 11 | 52 nm | 45 nm |
| Example 52 | Resist 1 | Protective Film 12 | 54 nm | 44 nm |
| Example 53 | Resist 1 | Protective Film 13 | 51 nm | 45 nm |
| Example 54 | Resist 1 | Protective Film 14 | 51 nm | 46 nm |
| Example 55 | Resist 1 | Protective Film 15 | 50 nm | 45 nm |
| Example 56 | Resist 1 | Protective Film 16 | 50 nm | 47 nm |
| Example 57 | Resist 1 | Protective Film 17 | 53 nm | 45 nm |
| Example 58 | Resist 1 | Protective Film 18 | 53 nm | 44 nm |
| Example 59 | Resist 1 | Protective Film 19 | 51 nm | 45 nm |
| Example 60 | Resist 1 | Protective Film 20 | 49 nm | 44 nm |
| Example 61 | Resist 1 | Protective Film 21 | 55 nm | 45 nm |
| Example 62 | Resist 1 | Protective Film 22 | 54 nm | 43 nm |
| Example 63 | Resist 1 | Protective Film 23 | 50 nm | 45 nm |
| Example 64 | Resist 2 | Protective Film 23 | 53 nm | 45 nm |
| Example 65 | Resist 3 | Protective Film 23 | 52 nm | 45 nm |
| Example 66 | Resist 4 | Protective Film 23 | 50 nm | 44 nm |
| Example 67 | Resist 5 | Protective Film 23 | 51 nm | 44 nm |
| Example 68 | Resist 1 | Protective Film 24 | 49 nm | 45 nm |
| Example 69 | Resist 1 | Protective Film 25 | 49 nm | 45 nm |
| Example 70 | Resist 1 | Protective Film 26 | 48 nm | 43 nm |
| Example 71 | Resist 1 | Protective Film 27 | 50 nm | 44 nm |
| Example 72 | Resist 1 | Protective Film 28 | 52 nm | 43 nm |
| Example 73 | Resist 1 | Protective Film 29 | 54 nm | 43 nm |
| Example 74 | Resist 1 | Protective Film 30 | 50 nm | 45 nm |
| Example 75 | Resist 1 | Protective Film 31 | 53 nm | 45 nm |
| Example 76 | Resist 1 | Protective Film 32 | 52 nm | 45 nm |
| Example 77 | Resist 1 | Protective Film 33 | 50 nm | 44 nm |
| Example 78 | Resist 1 | Protective Film 34 | 51 nm | 44 nm |
| Example 79 | Resist 1 | Protective Film 35 | 49 nm | 45 nm |
| Example 80 | Resist 1 | Protective Film 36 | 49 nm | 45 nm |
| Example 81 | Resist 1 | Protective Film 37 | 48 nm | 43 nm |
| Example 82 | Resist 1 | Protective Film 38 | 50 nm | 44 nm |
| Example 83 | Resist 1 | Protective Film 39 | 52 nm | 43 nm |
| Comparative Example 2 | Resist 4 | Comparative Protective Film 1 | Pattern vanished | 44 nm |
| Comparative Example 3 | Resist 4 | — | Pattern vanished | 45 nm |

Examples 84 to 87 and Comparative Example 4

Double Patterning Test II

On a substrate (silicon wafer) having an antireflective coating (ARC-29A, Nissan Chemical Industries, Ltd.) of 80 nm thick, each of the resist compositions shown in Table 4 was spin coated, then baked on a hot plate at 100° C. for 60 seconds to form a resist film of 100 nm thick. A topcoat solution of the composition shown in Table 5 was coated thereon and baked at 90° C. for 60 seconds to form a topcoat of 50 nm thick. Using an ArF excimer laser scanner model NSR-S610C (Nikon Corp., NA 1.30, σ 0.98/0.78, 35° dipole/normal illumination, 6% halftone phase shift mask) with s-polarized illumination, the coated substrate was exposed to radiation through a line-and-space pattern mask including Y-direction lines of 45 nm at a pitch of 90 nm and in a dose to provide a 1:1 line-and-space. Immediately after exposure, the resist film was baked (PEB) at 100° C. for 60 seconds and then On the first pattern, each of the pattern surface coating compositions of Example 28 and Comparative Example 1 shown in Table 3 was coated and baked at 170° C. for 60 seconds to form a pattern protective film of 8 nm thick on the first resist pattern.

Next, the same resist composition and the same topcoat composition as above were coated and baked to form a second resist film on the first resist pattern. Using an ArF excimer laser scanner model NSR-S610C (Nikon Corp., NA 1.30, σ 0.98/0.78, 35° dipole/normal illumination, 6% halftone phase shift mask) with s-polarized illumination, the second resist film was exposed to radiation through a line-and-space pattern mask including X-direction lines of 45 nm at a pitch of 90 nm and in an optimum dose to provide a 1:1 line-and-space. Immediately after exposure, the resist film was baked (PEB) at 100° C. for 60 seconds and then developed for 30 seconds with a 2.38 wt % TMAH aqueous solution, obtaining a second resist pattern crossing orthogonally the first pattern. The line width of the crossing first and second patterns was measured by a measuring SEM S-9380 (Hitachi, Ltd.).

The results are shown in Table 7.

TABLE 7

| | Resist Composition | Protective film composition | Size of 1st pattern after 2nd pattern formation | Size of 2nd pattern |
|---|---|---|---|---|
| Example 84 | Resist 1 | Protective Film 28 | 50 nm | 45 nm |
| Example 85 | Resist 2 | Protective Film 28 | 52 nm | 45 nm |
| Example 86 | Resist 3 | Protective Film 28 | 51 nm | 45 nm |
| Example 87 | Resist 4 | Protective Film 28 | 51 nm | 44 nm |
| Comparative Example 4 | Resist 4 | Comparative Protective Film 1 | Pattern vanished | 44 nm |

Examples 88 to 98 and Comparative Example 5

Double Patterning Test III

On a substrate (silicon wafer) having an antireflective coating (ARC-29A, Nissan Chemical Industries, Ltd.) of 80 nm thick, each of the resist compositions shown in Table 4 was spin coated, then baked on a hot plate at 100° C. for 60 seconds to form a resist film of 100 nm thick. A topcoat solution of the composition shown in Table 5 was coated thereon and baked at 90° C. for 60 seconds to form a topcoat of 50 nm thick. Using an ArF excimer laser scanner model NSR-S610C (Nikon Corp., NA 1.30, σ 0.98/0.78, 35° dipole/normal illumination, 6% halftone phase shift mask) with s-polarized illumination, the coated substrate was exposed to radiation through a line-and-space pattern mask including Y-direction lines of 90 nm at a pitch of 180 nm and in a dose greater than the optimum dose to provide a 1:1 line-and-space. Immediately after exposure, the resist film was baked (PEB) at 100° C. for 60 seconds and then developed for 30 seconds with a 2.38 wt % TMAH aqueous solution, obtaining a first pattern including lines of 45 nm at a pitch of 180 nm.

On the first pattern, each of the pattern surface coating compositions shown in Table 8 below was coated and baked at 160° C. for 60 seconds to form a pattern protective film which had a thickness of 120 nm enough to cover the top of the first resist pattern so that the film presented a planar surface. During the baking, the resist surface provided a supply of acid with which the protective film underwent crosslinking at the resist interface. The superfluous coating composition was removed through development with a 2.38 wt % TMAH aqueous solution for 30 seconds. Then, the pattern surface was more firmly crosslinked by baking at 160° C. for 60 seconds.

Next, the same resist composition and the same topcoat composition as above were coated and baked to form a second resist film on the first resist pattern. Using an ArF excimer laser scanner model NSR-S610C (Nikon Corp., NA 1.30, σ 0.98/0.78, 350 dipole/normal illumination, 6% halftone phase shift mask) with s-polarized illumination, the second resist film was exposed to radiation through a line-and-space pattern mask including Y-direction lines of 90 nm at a pitch of 180 nm, in a dose greater than the optimum dose to provide a 1:1 line-and-space and at a position shifted 45 nm in X direction from the first pattern. Immediately after exposure, the resist film was baked (PEB) at 100° C. for 60 seconds and then developed for 30 seconds with a 2.38 wt % TMAH aqueous solution, obtaining a second resist pattern including lines of 45 nm at a pitch of 180 nm in spaces of the first pattern. The conditions under which the pattern protective film was baked after coating included 160° C./60 seconds in Examples 88-97 and Comparative Example 5, and 140° C./60 seconds in Example 98. The line width of the first and second patterns was measured by a measuring SEM S-9380 (Hitachi, Ltd.).

The results are shown in Table 9.

TABLE 8

| | Polymer (pbw) | Crosslinker (pbw) | Organic solvent (pbw) |
|---|---|---|---|
| Pattern protective film 40 | Polymer 1 (100) | CR 1 (15.0) | isobutyl alcohol (2,000) |
| Pattern protective film 41 | Polymer 2 (100) | CR 1 (15.0) | isobutyl alcohol (2,000) |
| Pattern protective film 42 | Polymer 3 (100) | — | isobutyl alcohol (2,000) |
| Pattern protective film 43 | Polymer 4 (100) | — | isobutyl alcohol (2,000) |
| Pattern protective film 44 | Polymer 4 (100) | CR 1 (15.0) | isobutyl alcohol (2,000) |
| Pattern protective film 45 | Polymer 18 (100) | — | isobutyl alcohol (2,000) |
| Pattern protective film 46 | Polymer 19 (100) | — | isobutyl alcohol (2,000) |
| Pattern protective film 47 | Polymer 20 (100) | — | isobutyl alcohol (2,000) |
| Pattern protective film 48 | Polymer 20 (100) | CR 8 (15.0) | isobutyl alcohol (2,000) |
| Pattern protective film 49 | Polymer 20 (100) | CR 9 (15.0) | isobutyl alcohol (2,000) |
| Pattern protective film 50 | Polymer 20 (100) | CR 10 (15.0) | isobutyl alcohol (2,000) |
| Comparative protective film 2 | Comparative Polymer 1 (100) | — | isobutyl alcohol (2,000) |

TABLE 9

| | Resist Composition | Protective film composition | Size of 1st pattern after 2nd pattern formation | Size of 2nd pattern |
|---|---|---|---|---|
| Example 88 | Resist 1 | Protective Film 40 | 58 nm | 45 nm |
| Example 89 | Resist 1 | Protective Film 41 | 57 nm | 43 nm |
| Example 90 | Resist 1 | Protective Film 42 | 56 nm | 45 nm |
| Example 91 | Resist 1 | Protective Film 43 | 57 nm | 46 nm |
| Example 92 | Resist 2 | Protective Film 44 | 58 nm | 45 nm |
| Example 93 | Resist 3 | Protective Film 45 | 59 nm | 45 nm |
| Example 94 | Resist 4 | Protective Film 46 | 53 nm | 44 nm |
| Example 95 | Resist 4 | Protective Film 47 | 50 nm | 44 nm |
| Example 96 | Resist 4 | Protective Film 48 | 51 nm | 44 nm |
| Example 97 | Resist 4 | Protective Film 49 | 51 nm | 44 nm |
| Example 98 | Resist 4 | Protective Film 50 | 51 nm | 44 nm |
| Comparative Example 5 | Resist 4 | Comparative Protective Film 2 | Pattern vanished | 44 nm |

For the pattern surface coating compositions of Examples 40-83 and Examples 88-98, the formation of the 2nd pattern having lines located between lines of the 1st pattern was observed.

In Comparative Examples 2-5 wherein non-crosslinkable pattern protective films were used or pattern protective films were omitted, an attempt to coat the resist composition on the 1st pattern to form a 2nd pattern thereon failed. The 1st pattern was dissolved during coating of the 2nd resist composition. The 1st pattern vanished when the 2nd pattern was formed.

For the pattern surface coating compositions of Examples 84-87, the formation of a 2nd pattern having lines orthogonally crossing lines of the 1st pattern was observed. That is, a hole pattern was formed.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2007-215810 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
applying a first positive resist composition comprising a polymer onto a substrate to form a first resist coating, the polymer comprising recurring units which become alkali soluble under the action of acid, heat treating the first resist coating, exposing to high-energy radiation, heat treating the exposed coating, developing the coating with an alkaline developer to form a first resist pattern,
applying a pattern surface coating composition comprising a hydroxyl-containing crosslinkable polymer onto the first resist pattern and causing the hydroxyl-containing polymer to crosslink with the aid of acid and heat, thereby covering the first resist pattern with a film of the crosslinked polymer,
applying a second positive resist composition thereto to form a second resist coating, heat treating the second resist coating, exposing to high-energy radiation, heat treating the exposed coating, and developing the second coating with an alkaline developer to form a second resist pattern.

2. The process of claim 1 wherein the first resist pattern includes spaces, the second resist pattern is formed in the spaces of the first resist pattern, whereby the pitch between the first and second patterns is reduced to one half.

3. The process of claim 1 wherein the second resist pattern crosses the first resist pattern.

4. The process of claim 1 wherein the second resist pattern is formed in a space area where the first resist pattern is not formed and in a direction different from the first resist pattern.

5. The process of claim 1 wherein the step of causing the hydroxyl-containing polymer to crosslink with the aid of acid and heat includes heating at 100 to 250° C. for crosslinking the hydroxyl-containing polymer to form a crosslinked polymer film for preventing the first resist pattern from being dissolved in solvent and alkaline developer.

6. A process for forming a pattern, comprising the steps of:
applying a first positive resist composition comprising a polymer onto a substrate to form a first resist coating, the polymer comprising recurring units which become alkali soluble under the action of acid, heat treating the first resist coating, exposing to high-energy radiation, heat treating the exposed coating, developing the coating with an alkaline developer to form a first resist pattern,
applying a pattern surface coating composition comprising a hydroxyl-containing crosslinkable polymer onto the first resist pattern, causing the hydroxyl-containing polymer to crosslink with the aid of acid and heat, thereby covering the first resist pattern with a film of the crosslinked polymer, stripping off the superfluous coating composition with an alkaline developer,
applying a second positive resist composition thereto to form a second resist coating, heat treating the second resist coating, exposing to high-energy radiation, heat treating the exposed coating, and developing the second coating with an alkaline developer to form a second resist pattern,
said hydroxyl-containing crosslinkable polymer having the general formula (1):

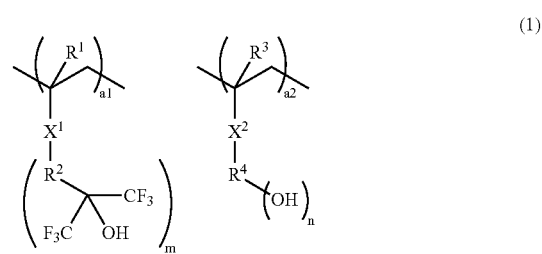

wherein $R^1$ and $R^3$ are each independently hydrogen, methyl or hydroxymethyl, $R^2$ is a single bond or a straight, branched or cyclic alkylene or alkylidyne group of 1 to 10 carbon atoms, $R^4$ is a (n+1)-valent straight, branched or cyclic aliphatic saturated hydrocarbon group of 1 to 12 carbon atoms, an aromatic hydrocarbon group of 6 to 12 carbon atoms, benzyl group or naphthalenemethyl group, which may have an ether bond, m is 1 or 2, n is an integer of 1 to 5, $X^1$ and $X^2$ are each independently —C(=O)—O—$R^5$—, —C(=O)—NH—$R^6$—, —C(=O)—N—$(R^6)_2$—, phenylene or naphthylene group, $R^5$ and $R^6$ each are a single bond, or a $C_1$-$C_6$ alkylene group or $C_6$-$C_{10}$ arylene group, which may have an ether or ester group, a1 and a2 are numbers in the range: $0<a1<1.0$, $0<a2<1.0$, $0<a1+a2<1.0$.

7. A process for forming a pattern, comprising the steps of:
applying a first positive resist composition comprising a polymer onto a substrate to form a first resist coating, the polymer comprising recurring units which become alkali soluble under the action of acid, heat treating the first resist coating, exposing to high-energy radiation, heat treating the exposed coating, developing the coating with an alkaline developer to form a first resist pattern,
applying a pattern surface coating composition comprising a hydroxyl-containing crosslinkable polymer onto the first resist pattern, causing the hydroxyl-containing polymer to crosslink with the aid of acid and heat, thereby covering the first resist pattern with a film of the crosslinked polymer, stripping off the superfluous coating composition with an alkaline developer,
applying a second positive resist composition thereto to form a second resist coating, heat treating the second resist coating, exposing to high-energy radiation, heat treating the exposed coating, and developing the second coating with an alkaline developer to form a second resist pattern, said hydroxyl-containing crosslinkable polymer having the general formula (1a):

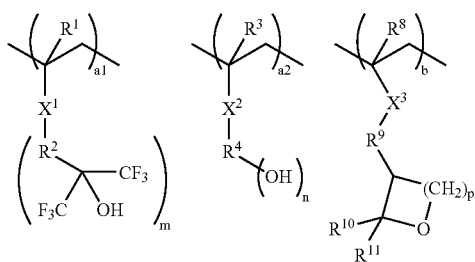

wherein $R^1$ and $R^3$ are each independently hydrogen, methyl or hydroxymethyl, $R^2$ is a single bond or a straight, branched or cyclic alkylene or alkylidyne group of 1 to 10 carbon atoms, $R^4$ is a (n+1)-valent straight, branched or cyclic aliphatic saturated hydrocarbon group of 1 to 12 carbon atoms, an aromatic hydrocarbon group of 6 to 12 carbon atoms, benzyl group or naphthalenemethyl group which may have an ether bond, m is 1 or 2, n is an integer of 1 to 5, $X^1$ and $X^2$ are each independently —C(=O)—O—$R^5$—, —C(=O)—NH—$R^6$—, —C(=O)—N—$(R^6)_2$—, phenylene or naphthylene group, $R^5$ and $R^6$ each are a single bond, or a $C_1$-$C_6$ alkylene group or $C_6$-$C_{10}$ arylene group, which may have an ether or ester group, $R^8$ is hydrogen or methyl, $X^3$ is each independently —C(=O)—O—$R^{12}$—, phenylene or naphthylene group, $R^{12}$ is a single bond, or a $C_1$-$C_6$ alkylene group or $C_6$-$C_{10}$ arylene group, which may have an ether, ester, hydroxyl or carboxyl group, $R^9$ is a straight, branched or cyclic $C_1$-$C_{12}$ alkylene group, $R^{10}$ is hydrogen or a straight, branched or cyclic $C_1$-$C_6$ alkyl group, or may bond with $R^9$ to form a ring with the carbon atoms to which they are attached, $R^{11}$ is hydrogen or a straight, branched or cyclic $C_1$-$C_6$ alkyl group, p is 0 or 1, a1, a2 and b are numbers in the range: 0<a1<1.0, 0<a2<1.0, 0<b<1.0, and 0<a1+a2+b<1.0.

* * * * *